United States Patent [19]
Keith et al.

[11] Patent Number: 5,881,176
[45] Date of Patent: Mar. 9, 1999

[54] COMPRESSION AND DECOMPRESSION WITH WAVELET STYLE AND BINARY STYLE INCLUDING QUANTIZATION BY DEVICE-DEPENDENT PARSER

[75] Inventors: Alexander F. Keith, East Palo Alto; Edward L. Schwartz, Sunnyvale; Ahmad Zandi, Cupertino; Martin Boliek, San Francisco; Michael J. Gormish, Los Altos, all of Calif.

[73] Assignees: Ricoh Corporation, Menlo Park, Calif.; Ricoh Company, LTD., Tokyo, Japan

[21] Appl. No.: 642,518

[22] Filed: May 3, 1996

Related U.S. Application Data

[63] Continuation-in-part of Ser. No. 498,036, Jun. 30, 1995, which is a continuation-in-part of Ser. No. 310,146, Sep. 21, 1994, Pat. No. 5,748,786.

[51] Int. Cl.⁶ .............................. G06K 9/36; G06K 9/46
[52] U.S. Cl. ......................... 382/248; 382/240; 382/244
[58] Field of Search .................... 382/232, 237, 382/240, 244, 248, 234, 246

[56] References Cited

U.S. PATENT DOCUMENTS

| | | |
|---|---|---|
| 3,580,655 | 5/1971 | Leith et al. . |
| 3,950,103 | 4/1976 | Schmidt-Weinmar . |
| 4,136,954 | 1/1979 | Jamieson . |
| 4,155,097 | 5/1979 | Lux . |
| 4,190,681 | 2/1980 | Lux . |
| 4,223,354 | 9/1980 | Noble et al. . |
| 4,393,456 | 7/1983 | Marshall, Jr. . |
| 4,569,075 | 2/1986 | Nussbaumer . |
| 4,599,567 | 7/1986 | Goupillaud et al. . |
| 4,652,881 | 3/1987 | Lewis . |
| 4,663,660 | 5/1987 | Fedele et al. . |
| 4,674,125 | 6/1987 | Carlson et al. . |
| 4,701,006 | 10/1987 | Perlmutter . |
| 4,760,563 | 7/1988 | Beylkin . |

(List continued on next page.)

FOREIGN PATENT DOCUMENTS

| | | | |
|---|---|---|---|
| 0510933 | 10/1992 | European Pat. Off. | ......... H04N 1/41 |
| 0 622 741 A2 | 3/1994 | European Pat. Off. . | |
| 0593013 | 4/1994 | European Pat. Off. | ......... H04N 7/13 |
| 0611051 | 8/1994 | European Pat. Off. | ......... H04N 1/41 |
| 0701375 A2 | 3/1996 | European Pat. Off. . | |
| 2211691 | 7/1989 | United Kingdom | ........... H04N 7/133 |

(List continued on next page.)

OTHER PUBLICATIONS

"1977 IEEE International Conference on Acoustics, Speech & Signal Processing", Application of Quadrature Mirror Filters to Split Band Voice Coding Schemes, D. Esteban and C. Galand, pp. 191–195.

Martin Vetterli, "Filter Banks Allowing Perfect Reconstruction", Signal Processing 10 (1986), pp. 219–244.

R. E. Crochiere, S. A. Webber, J. L. Flanagan, "Digital Coding of Speech in Sub–bands", 1976, American Telephone and Telegraph Company, The Bell System Technical Journal, vol. 55, No. 8, Oct. 1976, pp. 1069–1085.

John W. Woods and Sean D. O'Neil, "Sub–Band Coding of Images", Proceedings ICASSP 86, Tokyo, Japan, Apr. 1986, pp. 1005–1008.

(List continued on next page.)

*Primary Examiner*—Phuoc Tran
*Attorney, Agent, or Firm*—Blakely Sokoloff Taylor & Zafman, LLP

[57] ABSTRACT

A compression and decompression system in which a reversible wavelet filter are used to generates coefficients from input data, such as image data. The reversible wavelet filter is an efficient transform implemented with integer arithmetic that has exact reconstruction. The present invention uses the reversible wavelet filter in a lossless system (or lossy system) in which an embedded codestream is generated from the coefficients produced by the filter. An entropy coder performs entropy coding on the embedded codestream to produce the compressed data stream.

16 Claims, 41 Drawing Sheets

U.S. PATENT DOCUMENTS

| | | |
|---|---|---|
| 4,785,348 | 11/1988 | Fonsalas et al. . |
| 4,785,349 | 11/1988 | Keith et al. . |
| 4,799,179 | 1/1989 | Masson et al. . |
| 4,805,129 | 2/1989 | David . |
| 4,815,023 | 3/1989 | Arbeiter . |
| 4,817,182 | 3/1989 | Adelson et al. . |
| 4,821,223 | 4/1989 | David . |
| 4,827,336 | 5/1989 | Acampora et al. . |
| 4,829,378 | 5/1989 | Legall . |
| 4,837,517 | 6/1989 | Barber . |
| 4,839,889 | 6/1989 | Gockler . |
| 4,864,398 | 9/1989 | Avis et al. . |
| 4,868,868 | 9/1989 | Yazu et al. . |
| 4,894,713 | 1/1990 | Delogme et al. ........................ 358/133 |
| 4,897,717 | 1/1990 | Hamilton et al. . |
| 4,904,073 | 2/1990 | Lawton et al. . |
| 4,918,524 | 4/1990 | Ansari et al. . |
| 4,922,544 | 5/1990 | Stansfield et al. ........................ 382/56 |
| 4,929,223 | 5/1990 | Walsh . |
| 4,936,665 | 6/1990 | Whitney . |
| 4,974,187 | 11/1990 | Lawton . |
| 4,982,283 | 1/1991 | Acampora . |
| 4,985,927 | 1/1991 | Norwood et al. . |
| 4,987,480 | 1/1991 | Lippman et al. . |
| 4,999,705 | 3/1991 | Puri ........................................ 358/136 |
| 5,000,183 | 3/1991 | Bonnefous . |
| 5,001,764 | 3/1991 | Wood et al. . |
| 5,014,134 | 5/1991 | Lawton et al. . |
| 5,018,210 | 5/1991 | Merryman et al. . |
| 5,049,992 | 9/1991 | Citta et al. . |
| 5,049,993 | 9/1991 | Legall et al. . |
| 5,068,911 | 11/1991 | Resinkoff et al. . |
| 5,072,308 | 12/1991 | Lin et al. . |
| 5,073,964 | 12/1991 | Resnikoff . |
| 5,081,645 | 1/1992 | Resnikoff et al. . |
| 5,095,447 | 3/1992 | Manns et al. . |
| 5,097,331 | 3/1992 | Chen et al. . |
| 5,101,280 | 3/1992 | Moronaga et al. . |
| 5,101,446 | 3/1992 | Resinkoff et al. . |
| 5,103,306 | 4/1992 | Weiman et al. . |
| 5,109,451 | 4/1992 | Aono et al. ............................... 382/56 |
| 5,121,191 | 6/1992 | Cassereau et al. . |
| 5,124,930 | 6/1992 | Nicolas et al. . |
| 5,128,757 | 7/1992 | Citta et al. . |
| 5,128,791 | 7/1992 | Legall et al. . |
| 5,148,498 | 9/1992 | Resnikoff et al. . |
| 5,152,953 | 10/1992 | Ackermann . |
| 5,156,943 | 10/1992 | Whitney . |
| 5,173,880 | 12/1992 | Duren et al. . |
| 5,182,645 | 1/1993 | Breeuwer et al. . |
| 5,235,434 | 8/1993 | Wober .................................... 358/448 |
| 5,241,395 | 8/1993 | Chen .................................... 358/261.3 |
| 5,262,958 | 11/1993 | Chui et al. . |
| 5,315,670 | 5/1994 | Shapiro . |
| 5,321,776 | 6/1994 | Shapiro . |
| 5,335,016 | 8/1994 | Nakagawa ............................... 348/405 |
| 5,347,479 | 9/1994 | Miyazaki . |
| 5,381,145 | 1/1995 | Nakagawa ............................... 341/107 |
| 5,412,741 | 5/1995 | Shapiro . |
| 5,420,891 | 5/1995 | Akansu . |
| 5,453,945 | 9/1995 | Tucker et al. . |
| 5,495,292 | 2/1996 | Zhang et al. . |
| 5,497,435 | 3/1996 | Berger . |
| 5,534,925 | 7/1996 | Zhong . |
| 5,537,493 | 7/1996 | Wildinson . |
| 5,546,477 | 8/1996 | Knowles et al. . |
| 5,563,690 | 10/1996 | Shapiro . |
| 5,602,589 | 2/1997 | Vishwanath et al. . |
| 5,701,367 | 12/1997 | Koshi et al. ............................ 382/232 |

FOREIGN PATENT DOCUMENTS

| | | |
|---|---|---|
| 2 284 121 A | 5/1995 | United Kingdom . |
| 2285374 | 7/1995 | United Kingdom ............ H03M 7/40 |
| 8810049 | 12/1988 | WIPO ............................ H04N 7/133 |
| 9103902 | 3/1991 | WIPO ............................ H04N 1/419 |
| 9118361 | 11/1991 | WIPO .............................. G06G 7/00 |
| WO 94/23385 | 10/1994 | WIPO . |
| WO 95/19683 | 7/1995 | WIPO . |
| WO 96/09718 | 3/1996 | WIPO . |

OTHER PUBLICATIONS

John W. Woods, "Subband Coding of Images", IEEE Transactions on Acoustics, Speech, and Signal Processing, vol. ASSP–34, No. 5, Oct. 1986, pp. 1278–1288.

"Proceedings: ICASSP 87", 1987 International Conference on Acoustics, Speech, and Signal Processing, Apr. 6, 7, 8, 9, 1987, vol. 3 of 4, Sub–band Coding of Images Using Predictive Vector Quantization, P. H. Westerink, J. Biemond and D. E. Boekee, pp. 1378–1381.

Mark J. T. Smith and Thomas P. Barnwell, III, "Exact Reconstruction Techniques for Tree–Structured Subband Coders", IEEE Transactions on Acoustics, Speech, and Signal Processing, vol. ASSP–34, No. 3, Jun. 1986, pp. 434–441.

Marvin Vetterli, "Multi–Dimensional Sub–Band Coding: Some Theory and Algorithms", Signal Processing 6 (1984) pp. 97–112.

H. Gharavi and Ali Tabatabai, "Sub–band Coding of Digital Images Using Two–Dimensional Quadrature Mirror Filtering", SPIE vol. 707 Visual Communications and Image Processing (1986), pp. 51–61.

"Proceedings: ICASSP 87", 1987 International Conference on Acoustics, Speech, and Signal Processing, Apr. 6, 7, 8, 9, 1987, vol. 4 of 4, Application of Quadrature Mirror Filtering to the Coding of Monochrome and Color Images, H. Gharavi and A. Tabatabai, pp. 2384–2387.

International Search Report for Application No: GB 9518298.6, dated 8 Nov. 1995.

Shah, et al., "A Chip Set for Lossless Compression", IEEE Journal of Solid–State Circuits, vol. 26, No. 3, Mar. 1991, pp. 237–244.

Shapiro, J.M., "An Embedded Hierachical Image Coder Using Zerotrees of Wavelet Coefficients", IEEE 1993, pp. 214–223.

Howard, et al., "Fast nad Efficient Lossless Image Compression", IEEE 1993, pp. 351–360.

Villasenor, et al., "Filter Evaluation and Selcetion in Wavelet Image Compression", IEEE 1994, pp. 351–360.

Antonini, et al., "Image Coding Using Wavelet Transform", IEEE Transactions on Image Processing, vol. 1, No. 2, Apr. 1992, pp. 205–220.

Amir Said, et al., "Image Compression Using the Spatial–Orientation Tree", IEEE 1993, pp. 279–282.

Lux, P., "A Novel Set of Closed Orthogonal Functions for Picture Code", 1977, pp. 267–274.

Langdon, Jr., Glen G., "Sunset: A Hardware–Oriented Algorithm for Lossless Compression of Gray Scale Images", SPIE vol. 1444, Image Capture, Formatting, and Display, 1991, pp. 272–282.

| 0  | 1  | 2  | 3  | 4  | 5  |
|----|----|----|----|----|----|
| 6  | 7  | 8  | 9  | 10 | 11 |
| 12 | 13 | 14 | 15 | 16 | 17 |
| 18 | 19 | 20 | 21 | 22 | 23 |
| 24 | 25 | 26 | 27 | 28 | 29 |
| 30 | 31 | 32 | 33 | 34 | 35 |
| 36 | 37 | 38 | 39 | 40 | 41 |

| NW | N | NE |
|----|---|----|
| W  | P | E  |
| SW | S | SE |

FIG. 10

Parent (optional)

| | Tail On (1) | |
|---|---|---|
| Tail Info (2) | | Tail On (1) |
| Tail On (1) | Tail On (1) | |

| $S_{n-1}$ | $D_{n-1}$ | $S_n$ | $B_n$ | $X_{2n+2}$ | $X_{2n+3}$ | $X_{2n+4}$ | $X_{2n+5}$ |

FIG. 17A

| $S_{n-1}$ | $D_{n-1}$ | $S_n$ | $B_n$ | $S_{n+1}$ | $B_{n+1}$ | $X_{2n+4}$ | $X_{2n+5}$ |

FIG. 17B

| $S_{n-1}$ | $D_{n-1}$ | $S_n$ | $D_n$ | $S_{n+1}$ | $B_{n+1}$ | $X_{2n+4}$ | $X_{2n+5}$ |

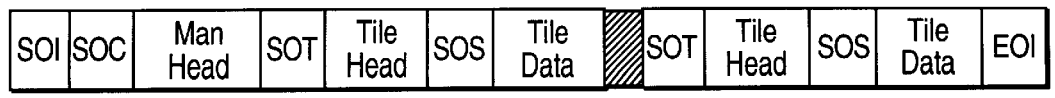
FIG. 26A
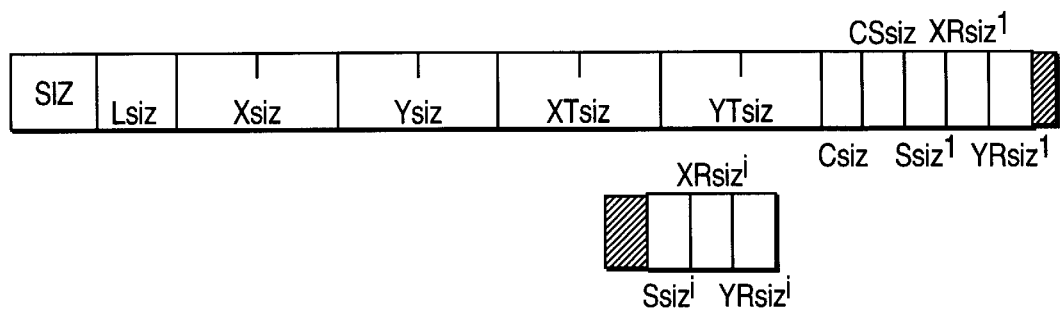
FIG. 26B
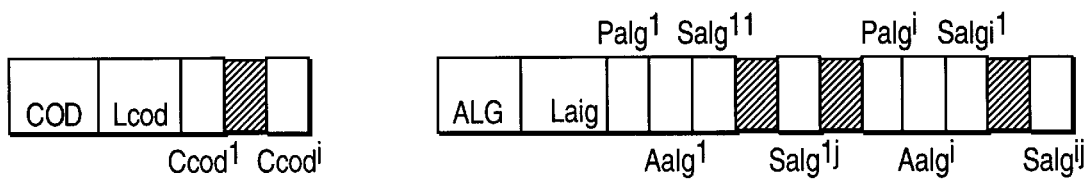
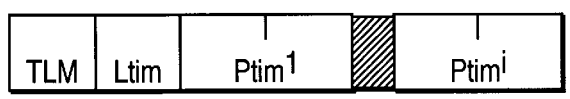
FIG. 26C  FIG. 26D
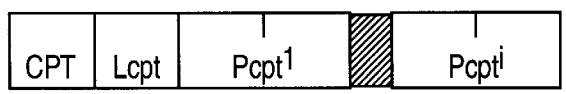
FIG. 26E  FIG. 26F
FIG. 26G of Zeros | Hash Value of Terminator

| 1SS | 1DS | 1SS | 1DS | 1SS | 1DS | 1SS | 1DS | 1SS | 1DS | 1SS | 1DS | 1SS | 1DS | 1SS | 1DS |
|-----|-----|-----|-----|-----|-----|-----|-----|-----|-----|-----|-----|-----|-----|-----|-----|
| 1SD | 1DD | 1SD | 1DD | 1SD | 1DD | 1SD | 1DD | 1SD | 1DD | 1SD | 1DD | 1SD | 1DD | 1SD | 1DD |
| 1SS | 1DS | 1SS | 1DS | 1SS | 1DS | 1SS | 1DS | 1SS | 1DS | 1SS | 1DS | 1SS | 1DS | 1SS | 1DS |
| 1SD | 1DD | 1SD | 1DD | 1SD | 1DD | 1SD | 1DD | 1SD | 1DD | 1SD | 1DD | 1SD | 1DD | 1SD | 1DD |
| 1SS | 1DS | 1SS | 1DS | 1SS | 1DS | 1SS | 1DS | 1SS | 1DS | 1SS | 1DS | 1SS | 1DS | 1SS | 1DS |
| 1SD | 1DD | 1SD | 1DD | 1SD | 1DD | 1SD | 1DD | 1SD | 1DD | 1SD | 1DD | 1SD | 1DD | 1SD | 1DD |
| 1SS | 1DS | 1SS | 1DS | 1SS | 1DS | 1SS | 1DS | 1SS | 1DS | 1SS | 1DS | 1SS | 1DS | 1SS | 1DS |
| 1Sb | 1Db | 1Sb | 1Db | 1Sb | 1Db | 1Sb | 1Db | 1Sb | 1Db | 1Sb | 1Db | 1Sb | 1Db | 1Sb | 1Db |

FIG. 32A

| 2SS | 1DS | 2DS | 1DS | 2SS | 1DS | 2DS | 1DS | 2SS | 1DS | 2DS | 1DS | 2SS | 1DS | 2DS | 1DS |
|-----|-----|-----|-----|-----|-----|-----|-----|-----|-----|-----|-----|-----|-----|-----|-----|
| 1SD | 1DD | 1SD | 1DD | 1SD | 1DD | 1SD | 1DD | 1SD | 1DD | 1SD | 1DD | 1SD | 1DD | 1SD | 1DD |
| 2SD | 1DS | 2DD | 1DS | 2SD | 1DS | 2DD | 1DS | 2SD | 1DS | 2DD | 1DS | 2SD | 1DS | 2DD | 1DS |
| 1SD | 1DD | 1SD | 1DD | 1SD | 1DD | 1SD | 1DD | 1SD | 1DD | 1SD | 1DD | 1SD | 1DD | 1SD | 1DD |
| 2SS | 1DS | 2DS | 1DS | 2SS | 1DS | 2DS | 1DS | 2SS | 1DS | 2DS | 1DS | 2SS | 1DS | 2DS | 1DS |
| 1SD | 1DD | 1SD | 1DD | 1SD | 1DD | 1SD | 1DD | 1SD | 1DD | 1SD | 1DD | 1SD | 1DD | 1SD | 1DD |
| 2Sb | 1DS | 2Db | 1DS | 2Sb | 1DS | 2Db | 1DS | 2Sb | 1DS | 2Db | 1DS | 2Sb | 1DS | 2Db | 1DS |
| 1Sb | 1Db | 1Sb | 1Db | 1Sb | 1Db | 1Sb | 1Db | 1Sb | 1Db | 1Sb | 1Db | 1Sb | 1Db | 1Sb | 1Db |

FIG. 32B

COMPRESSION AND DECOMPRESSION WITH WAVELET STYLE AND BINARY STYLE INCLUDING QUANTIZATION BY DEVICE-DEPENDENT PARSER

This application is a continuation-in-part of application Ser. No. 08/498,036, entitled Reversible Wavelet Transform and Embedded Codestream Manipulation, filed Jun. 30, 1995, which is a continuation-in-part of application Ser. No. 08/310,146, entitled Apparatus for Compression Using Reversible Embedded Wavelets, filed Sep. 21, 1994, now U.S. Pat. No. 5,748,786.

FIELD OF THE INVENTION

The present invention relates to the field of data compression and decompression systems; particularly, the present invention relates to a method and apparatus for lossless and lossy encoding and decoding of data in compression/decompression systems.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossless compression, input symbols or intensity data are converted to output codewords. The input may include image, audio, one-dimensional (e.g., data changing spatially or temporally), two-dimensional (e.g., data changing in two spatial directions (or one spatial and one temporal dimension)), or multi-dimensional/multi-spectral data. If the compression is successful, the codewords are represented in fewer bits than the number of bits required for the uncoded input symbols (or intensity data). Lossless coding methods include dictionary methods of coding (e.g., Lempel-Ziv), run length encoding, enumerative coding and entropy coding. In lossless image compression, compression is based on predictions or contexts, plus coding. The JBIG standard for facsimile compression and DPCM (differential pulse code modulation—an option in the JPEG standard) for continuous-tone images are examples of lossless compression for images. In lossy compression, input symbols or intensity data are quantized prior to conversion to output codewords. Quantization is intended to preserve relevant characteristics of the data while eliminating unimportant characteristics. Prior to quantization, lossy compression system often use a transform to provide energy compaction. JPEG is an example of a lossy coding method for image data.

Recent developments in image signal processing continue to focus attention on a need for efficient and accurate forms of data compression coding. Various forms of transform or pyramidal signal processing have been proposed, including multiresolution pyramidal processing and wavelet pyramidal processing. These forms are also referred to as subband processing and hierarchical processing. Wavelet pyramidal processing of image data is a specific type of multi-resolution pyramidal processing that may use quadrature mirror filters (QMFs) to produce subband decomposition of an original image. Note that other types of non-QMF wavelets exist. For more information on wavelet processing, see Antonini, M., et al., "Image Coding Using Wavelet Transform", *IEEE Transactions on Image Processing*, Vol. 1, No. 2, April 1992; Shapiro, J., "An Embedded Hierarchical Image Coder Using Zerotrees of Wavelet Coefficients", *Proc. IEEE Data Compression Conference*, pgs. 214–223, 1993; for information on reversible transforms, see Said, A. and Pearlman, W. "Reversible Image Compression via Multiresolution Representation and Predictive Coding", Dept. of Electrical, Computer and Systems Engineering, Renssealaer Polytechnic Institute, Troy, N.Y. 1993.

Compression is often very time consuming and memory intensive. It is desirable to perform compression faster and/or reduced memory when possible. Some applications have never used compression because either the quality could not be assured, the compression rate was not high enough, or the data rate was not controllable. However, the use of compression is desirable to reduce the amount of information to be transferred and/or stored.

The prior art includes compression systems for handling natural continuous-tone images. An example is the International Standard Dis. 10918-1, entitled "Digital Compression and Coding of Continuous-Tone Still Images", CCITT recommendation T.81, commonly referred to as JPEG. The prior art also includes compression systems to handle binary/noise free/shallow pixel depth images. An example of such a system is a system conforming to the International Standard ISO/IEC 11544, entitled "Information Technology-Coded Representation of Picture and Audio Information—Progressive Bi-level Image Compression", CCITT recommendation T.82, commonly referred to as JBIG. However, the prior art lacks a system that handles both adequately. It is desirable to have such a system.

Parsers are well known in the computer science literature. A parser is responsible for assigning meaning to different parts of an object with an initially unknown structure. For example, a parser operating as part of a compiler might determine that some characters in a program file are "identifiers," other characters form reserved words, and other characters are parts of a comment. The parser is not responsible for determining what the characters "mean" but only what type of subject they are a part.

Most image storage formats are single-use. That is, only a single resolution or a single quality level is available. Other image formats allow multi-use. Some prior art multi-use image formats support two or three resolution/quality choices. Other prior art multi-use image formats allow only resolution or quality to be specified, not both. It is desirable to increase the resolution and quality choices that are available.

For instance, internet World-Wide-Web servers currently provide desired information from a large body of data. Typically, a user browses many images on the screen and may decide to print a few. Unfortunately, the current state of the browsing tools leads to a fairly poor quality printout if the image was intended mainly for monitors, or an excessive browse time if the image was intended mainly for printing. Obtaining a "lossless" image is either impossible or must be done as a completely independent download.

The present invention provides lossy and lossless compression using a transform that provides good energy compaction. The present invention provides a parser that identifies and selects parts of compressed data based onto structure, such as the frequency band and importance level, to which the entropy coded data belongs to, but does not decompress the data. The present invention provides more flexible multi-use image formats.

The present invention provides a single system that can handle both natural con-tone images and binary/noise free/ shallow pixel depth images, particularly those images that contain both types of data.

SUMMARY OF THE INVENTION

A system, apparatus and method for performing compression and/or decompression is described. In one embodiment, a system comprises a wavelet style coder, a binary style coder and selection control. The wavelet style coder compresses image data using reversible embedded wavelets. The binary style color compresses image data using a binary coding scheme. The selection control selects between the wavelet style and the binary style.

In one embodiment, the system of the present invention includes a parser that performs device-dependent quantization in response to device characteristics from an output device.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 6 illustrates tiling of an image.

FIG. 8A illustrates coefficient size in the present invention.

FIG. 10 illustrates the neighboring relationship among coefficients (or pixels).

FIGS. 17A–C illustrate the memory manipulation employed by the present invention.

FIG. 18 illustrates a two dimension representation of the memory buffer for three levels.

FIGS. 32A and 32B illustrates intermediate styles of the 2-D memory when using a unit buffer for computing an overlapping transform in place.

DETAILED DESCRIPTION OF THE INVENTION

Figure 1:
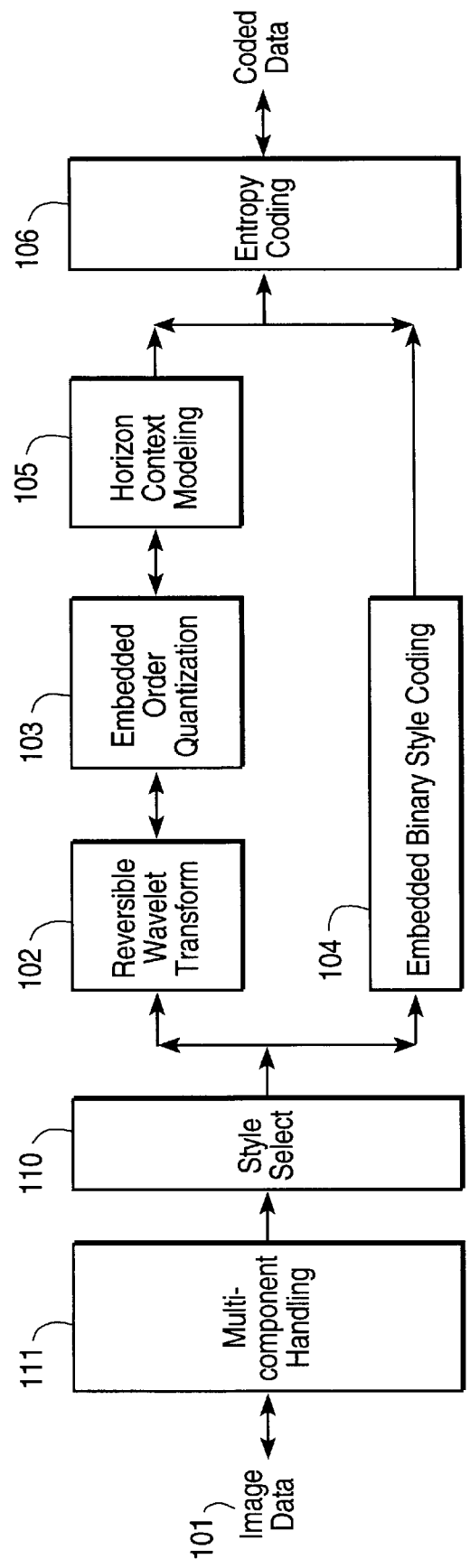
FIG. 1 is a block diagram of one embodiment of a compression system of the present invention.

A method and apparatus for compression and decompression is described. In the following detailed description of the present invention numerous specific details are set forth, such as types of coders, numbers of bits, signal names, etc., in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

The following terms are used in the description that follows. A definition has been included for these various terms. However, the definition provided should not be considered limiting to the extent that the terms are known in the art. These definitions are provided to help in the understanding of the present invention.

alignment: The degree of shifting of the transform coefficients in a frequency band with respect to the other frequency bands.

binary coding style: A style of coding for bi-level, limited pixel depth, or noise free data. In one embodiment, the binary coding style comprises a coding style with Gray encoding of the pixels and a particular context model.

bit-significance: A number representation, similar to sign magnitude, with head bits, followed by the sign bit, followed by tail bits, if any. The embedding encodes in bit-plane order with respect to this representation.

context model: Causally available information relative to the current bit to be coded that gives historically-learned information about the current bit, enabling conditional probability estimation for entropy coding.

embedded quantization: Quantization that is implied by the codestream. For example, if the importance levels are placed in order, from the most important to the least, then quantization is performed by simple truncation of the codestream. The same functionality is available with tags, markers, pointers, or other signaling.

entropy coder: A device that encodes or decodes a current bit based on a probability estimation. An entropy coder may also be referred to herein as a multi-context binary entropy coder. The context of the current bit is some chosen configuration of "nearby" bits and allows probability estimation for the best representation of the current bit (or multiple bits). In one embodiment, an entropy coder may include a binary coder or a Huffman coder.

fixed-length: A system that converts a specific block of data to a specific block of compressed data, e.g., BTC (block truncation coding) and some forms of VQ (vector quantization). Fixed-length codes serve fixed-rate and fixed-size applications, but the rate-distortion performance is often poor compared with variable-rate systems.

fixed-rate: An application or system that must maintain a certain pixel rate and has a limited bandwidth channel. To attain this goal, local average compression is achieved rather than a global average compression. For example, MPEG requires a fixed-rate.

fixed-size: An application or system that has a limited size buffer. To attain this goal, a global average compression is achieved, e.g., a print buffer. (An application can be fixed-rate, fixed-size, or both.)

frequency band: Each frequency band describes a group of coefficients resulting from the same sequence of filtering operations.

head bits: In bit-significance representation, the head bits are the magnitude bits from the most significant up to and including the first non-zero bit.

Horizon context model: A context model for embedded wavelet coefficients and a binary entropy coder (in one embodiment).

idempotent: Coding that enables an image to be decompressed in a lossy form and recompressed to the same lossy codestream.

image tile: A rectangular region chosen to enable defining a grid of contiguous non-overlapping sub-images, each with identical parameters. The image tile impacts the buffer size needed for computing the transform in wavelet style coding. Image tiles may be randomly addressable. The coding operations operate on the pixel and coefficient data in one image tile. Because of this, image tiles may be parsed or decoded out of order; i.e., randomly addressed, or decoded to different levels of distortion for region of interest decompression. In one embodiment, image tiles are all the same size, except for the right or bottom tiles. Image tiles can be any size up to and including the whole image.

importance levels: By definition of the specific system, the input data (pixel data, coefficients, error signals, etc.) is divided logically into groups with the same visual impact. For example, the most significant bit-plane, or planes, is probably more visually important than lessor planes. Also low frequency information is generally more important than high frequency. Most working definitions of "visual significance", including the present invention as described below, are with respect to some error metric. Better visual metrics, however, could be incorporated in the system definition of visual importance. Alternate data types have alternate importance levels, for example, audio data has audio importance levels.

overlapped transform: A transform where a single source sample point contributes to multiple coefficients of the same frequency. Examples include many wavelets and the Lapped Orthogonal Transform.

progressive: A codestream that is ordered, such that a coherent decompressed result is available from part of the coded data which can be refined with more data. A codestream that is ordered with deepening bit-planes of data; in this case, it usually refers to wavelet coefficient data.

progressive pixel depth: A codestream that is ordered with deepening bit-planes of data.

progressive pyramidal: Succession of resolutions where each lower resolution is a linear factor of two in each dimension (a factor of four in area).

reversible transform: In one embodiment, a reversible transform is an efficient transform implemented with integer arithmetic whose compressed results can be reconstructed into the original.

S-transform: A specific reversible wavelet filter pair with a 2-tap low pass and a 2-tap high pass filter.

tail: In bit-significance representation, the tail bits are the magnitude bits with less significance than the most significant non-zero bit.

tail information: In one embodiment, four states possible for a coefficient represented in bit-significance representation. It is a function of the coefficient and the current bit-plane, and is used for the Horizon context model.

tail-on: In one embodiment, two states depending on whether the tail information state is zero or non-zero. It is used for the Horizon context model.

tile data segment: Portion of the codestream fully describing one image tile; in one embodiment, all data from the tag defining the start of the image tile (SOT) to the next SOT or the end of image (EOI) tag.

transform coefficient: Results of applying wavelet transforms. In wavelet transforms, coefficients represent a logarithmically divided frequency scale.

TS-transform: Two-Six transform, a specific reversible wavelet filter pair with a 2-tap low pass analysis and a 6-tap high pass analysis filter. The synthesis filters are quadrature mirror of the analysis filters.

TT-transform: Two-Ten transform, a specific reversible wavelet filter pair with a 2-tap low pass analysis and a 10-tap high pass analysis filter. The synthesis filters are quadrature mirror of the analysis filters.

unified lossless/lossy: The same compression system provides a codestream capable of lossless or lossy reconstruction.

wavelet filters: The high and low pass synthesis and analysis filters used in wavelet transform.

wavelet transform: A transformation with both "frequency" and "time (or space)" domain constraints. In a described embodiment, it is a transform consisting of a high pass filter and a low pass filter. The resulting coefficients are decimated by two (critically filtered) and the filters are applied to the low pass coefficients.

wavelet trees: The coefficients that are related to a single coefficient in the LL section of the highest level wavelet decomposition. The number of coefficients is a function of the number of levels. The span of a wavelet tree is dependent on the number of decomposition levels. For example, with one level of decomposition, a wavelet tree corresponds to a span of four pixels, with two levels it spans 16, etc.

Overview of the Present Invention

The present invention provides a compression/decompression system having an encoding portion and a decoding portion. The encoding portion is responsible for encoding input data to create compressed data, while the decoding portion is responsible for decoding previously encoded data to produce a reconstructed version of the original input data. The input data may comprise a variety of data types, such as image (still or video), audio, etc. In one embodiment, the data is digital signal data; however, analog data digitized, text data formats, and other formats are possible. The source of the data may be a memory or channel for the encoding portion and/or the decoding portion.

In the present invention, elements of the encoding portion and/or the decoding portion may be implemented in hardware or software, such as that used on a computer system. The present invention provides a lossless compression/decompression system. The present invention may also be configured to perform lossy compression/decompression. The present invention may be configured to perform parsing of compressed data without decompressing.

Overview of the System of the Present Invention

The present invention represents the smooth edges and flat regions found in natural images quite well. Using reversible embedded wavelets, the present invention compresses deep pixel images. However, reversible embedded wavelets, and other wavelet and sinusoidal transform systems, are not good at representing sharp edges found in text or graphic images. This type of image can be compressed well by Gray coding followed by context-based bit-plane encoding, like the JBIG. Furthermore, noise free computer-generated images are well-modeled by binary style.

The present invention provides a binary style for compression of binary and graphic images. This also improves compression on some images that do not use the full dynamic range. In the binary style, the present invention encodes bit-planes of the image without using the transform.

FIG. 1 is a block diagram of one embodiment of a compression system of the present invention that employs the binary style. Note the decoding portion of the system operates in reverse order, along with the data flow. Referring to FIG. 1, an input image 101 into a multi-component handling mechanism 111. The multi-component handling mechanism 111 provides optional color space conversion and optional handling of subsampled image components. Style select mechanism 110 determines whether the image is a continuous-tone image or a binary image, or which portions of an image have such characteristics. The image data is forwarded onto the style select mechanism 110 which sends the image data or portions of the image data to either the wavelet style processing (blocks 102, 103, 104) or the binary style processing (block 104). In the present invention, the decision as to which mode to use is data dependent. In one embodiment, the style select mechanism 110 comprises a multiplexer. Style select 110 is not used during decoding.

In the wavelet style, the reversible wavelets block 102 performs a reversible wavelet transform. The output of block 102 is a series of coefficients. The embedded order quantization block 103 places the coefficients in bit-significance representation and then labels the coefficients in order to create an alignment of all of the coefficients in input image 101 (as generated by reversible wavelet block 102).

The image data 101 is received and (after optimal multicomponent handling) transformed using reversible wavelets in wavelet transform block 102, as defined below, to produce a series of coefficients representing a multi-resolution decomposition of the image. The reversible wavelet transforms of the present invention are not computationally complicated. The transforms may be performed in software or hardware with no systematic error. Furthermore, the wavelets of the present invention are excellent for energy compaction and compression performance. These coefficients are received by the embedded order quantization block 103.

The embedded order quantization block 103 provides embedded order quantization, as described below. The result is an embedded data stream. The embedded data stream allows a resulting codestream to be quantized at encode time, transmission time, or decode time. In one embodiment, embedded order quantization block 103 orders and converts the coefficients into sign-magnitude format.

The embedded data stream is received by the Horizon context model 105, which models data in the embedded data stream based on their significance (as described below later). In the case of the transform mode, the "bit-planes" are importance level planes of the transform coefficients and context model 105 conditions wavelet coefficients in bit-significance representation.

The results of ordering and modeling comprise decisions (or symbols) to be coded by the entropy coder 106. In one embodiment, all decisions are sent to a single coder. In another embodiment, decisions are labeled by significance, and decisions for each significance level are processed by different (physical or virtual) multiple coders. The bit stream (s) are encoded in order of significance using entropy coder 106. In one embodiment, entropy coder 106 comprises one or more binary entropy coders. In another embodiment, Huffman coding is used.

In the binary style, Gray coding block 104 performs Gray coding on the pixels in input image 101. Gray coding is a pixel operation that takes advantage of some of the correlation between the bit-planes of the pixels. This is because for any value of x and x+1, the gray (x) and gray (x+1) differ by only one bit in their radix 2 representations. In one embodiment, gray coding block 104 performs a point wise transform on 8 bit pixels:

$$\text{gray}(x) = x \, xOR \, x/2$$

The present invention is not limited to this form of Gray coding, nor is limited to using pixels that are 8-bits in size. Note, however, that employing the above equation has an advantage of allowing a pixel to be reconstructed with only some of the most significant bits available, as is the case in progressive-by-bit-plane transmission. In other words, this form of Gray coding preserves the bit-signifigance ordering.

In the binary style, the data is encoded by bit-plane using a context model in coding block 104 and coder 106. In one embodiment, context model in coding block 104 conditions the current bit using spatial and importance level information.

Figure 2A:
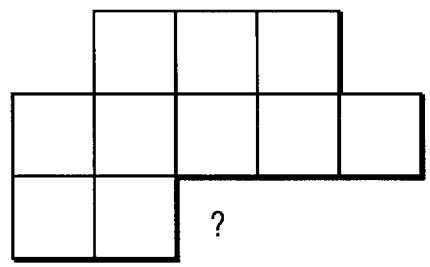
FIGS. 2A and 2B illustrate possible geometric relationships of the context model for each bit of each bit-plane in the binary style.
Figure 2B:
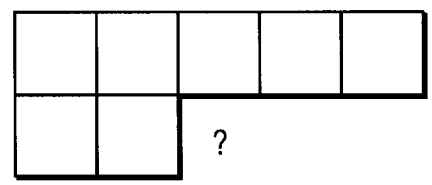

With the binary style, a JBIG-like context model is used on Gray coded pixels. In one embodiment, each bit-plane of the image tile is coded separately with each individual bit being conditioned and coded in raster order using the values of ten surrounding bits. FIG. 2A illustrates the geometric relationship of the context model for each bit of each bit-plane in the binary style. The conditioning bits lead to an adaptive probability estimate for each unique pattern. Note that some different templates may be used for the context model of the binary entropy coder when used in the bit-plane entropy coding of the Gray coded values. FIG. 2B illustrates seven pixels and two bits of bit plane information for $2^9$ context bins.

Using this context and the value of the current bit, binary coder 106 creates a bit stream. The same binary entropy coder 106 is used to code data from both the transform mode and the binary style. In one embodiment, binary coder 106 comprises a finite state machine coder that is implemented with a look-up table. Note that the present invention may be used with any binary entropy coder, such as the Q-coder, QM-coder or a high speed parallel coder.

Because the binary coder 106 is the same for either style and the Gray coding and the binary context model are simple, very little extra resources are required to have the binary style and transform style in the same system. Furthermore, while the context model configuration is different, the resource requirements are the same for both modes. That is, both use the same memory for storing contexts and both use the same binary entropy coder.

The present invention may be performed on the entire image, or, more commonly, on tiled segments of the image. Some tiles may be better compressed with the transform style and others with the binary style. There are any number of algorithms possible for choosing which mode to use. If tiles are used, then random access on a tile basis is possible. Also, regions of interest can be decoded separately to a higher fidelity. Finally, the choice of whether to use the transform or binary style can be decided on a tile-by-tile basis.

Also note that the image is still progressive by bit-plane using the dual mode system of the present invention and may be encoded in a hierarchical format as taught by JBIG.

With respect to decoding, one bit in the header of the tile may be used to denote the style used to encode the data. Style select 110 is not used. A lossless mapping, if possible, from the original dynamic range to a lower dynamic range, such as by histogram compaction (described below) can help further. A look ahead, such as in JBIG, may be used. The lookahead may employ typical prediction or deterministic prediction, such as in JBIG.

Selection of Binary or Transform Style

Style select 110 selects between the binary style and transform style. In one embodiment, the input image is encoded with both styles and style select 110 selects the style which produces the lower bit rate (assuming lossless compression). In other words, which ever mode compresses the best is selected. This method does not have as high a cost as might be expected since both the binary style and transform mode are relatively quick in software and small in hardware. A derivative of this method is to bypass the coder and use entropy values for determining the lower bit rate.

In an alternate embodiment, the present invention creates a complete (or partial) histogram of the pixel values of the image or a histogram of the differences between pairs of adjacent pixel values. In the case of the histogram of pixel values, statistical analysis of this data, such as if the histogram is peaked at a few values, far fewer than the dynamic range of the pixel depth, then the binary style is used.

In one embodiment, the present invention creates a complete (or partial) histogram of the first order differences between pairs of adjacent pixels. For a normal image, such a histogram is very Laplacian and wavelet style would be used. However, if this histogram is not peaked with a Laplacian distribution, then the binary style is used.

Both types of histograms may be generated and used together to select the style.

The $d_n$ filter output of the TS-transform or the TT-transform, both of which are discussed later, is similar to the first order statistics. This suggests a method where the transform is performed and the histogram generated. Based on the histogram, the style is chosen. If it is the transform mode, the system proceeds with the transform coefficients already generated. If the binary style is chosen the transform coefficients are discarded (or inverse transformed depending on whether the pixels were saved) and the system proceeds with the binary style.

In another embodiment, segmentation and/or previous knowledge of the document types may help determine which styles to select.

If more encoding time is available, the tiling size can be chosen to maximize the benefit of the two styles.

Note that in one embodiment, the system of the present invention does not include binary style coding and, thus, only uses the reversible embedded wavelet compression (CREW) and decompression only.

Wavelet Decomposition

The present invention initially performs decomposition of an image (in the form of image data) or another data signal using reversible wavelets. In the present invention, a reversible wavelet transform comprises an implementation of an exact-reconstruction system in integer arithmetic, such that a signal with integer coefficients can be losslessly recovered. An efficient reversible transform is one with transform matrix of determinant=1 (or almost 1).

By using reversible wavelets, the present invention is able to provide lossless compression with finite precision arithmetic. The results generated by applying the reversible wavelet transform to the image data are a series of coefficients.

The reversible wavelet transform of the present invention may be implemented using a set of filters. In one embodiment, the filters are a two-tap low-pass filter and a ten-tap high-pass filter. In one embodiment, these filters are implemented using only addition and subtraction operations (plus hardwired bit shifting).

One embodiment of the present invention using the Hadamard Transform is an exact reconstruction system. For more information on the Hadamard Transform, see Anil K. Jain, Fundamentals of Image Processing, pg. 155. A reversible version of the Hadamard Transform is referred to herein as the S-transform.

The S-transform may be defined by the outputs with a generic index, n, as follows:

$$\begin{cases} s(n) = \left\lfloor \frac{x(2n) + x(2n+1)}{2} \right\rfloor \\ d(n) = x(2n) - X(2n+1) \end{cases}$$

Note that the factor of two in the transform coefficients addressing is the result of an implied subsampling by two. This transform is reversible and the inverse is:

$$\begin{cases} x(2n) = s(n) + \left\lfloor \frac{d(n)+1}{2} \right\rfloor \\ x(2n+1) = s(n) - \left\lfloor \frac{d(n)}{2} \right\rfloor \end{cases}$$

The notation $\lfloor . \rfloor$ means to round down or truncate and is sometimes referred to as the floor function. Similarly, the ceiling function $\lceil . \rceil$ means round up to the nearest integer.

Another example of an exact-reconstruction system comprises the Two/Six (TS)-Transform. The reversible TS-transform is defined by the expression of the two outputs of a low-pass and a high-pass filter:

$$\begin{cases} s(n) = \left\lfloor \frac{x(2n) + x(2n+1)}{2} \right\rfloor \\ d(n) = - \left\lfloor \frac{\left\lfloor \frac{x(2n)+x(2n+1)}{2} \right\rfloor + 4(x(2n+2) - x(2n+3)) + \left\lfloor \frac{x(2n+4)+x(2n+5)}{2} \right\rfloor}{4} \right\rfloor \end{cases}$$

$$\begin{cases} s(n) = \left\lfloor \frac{x(2n)+x(2n+1)}{2} \right\rfloor \\ d(n) = x(2n+2) - (2n+3) + \left\lfloor \frac{-s(n)+s(n+2)+2}{4} \right\rfloor \end{cases}$$

The TS-transform is reversible and the inverse is:

$$\begin{cases} x(2n) = s(n) + \left\lfloor \frac{p(n)+1}{2} \right\rfloor \\ x(2n+1) = s(n) - \left\lfloor \frac{p(n)}{2} \right\rfloor \end{cases}$$

where p(n) must first be computed by, $$p(n) = d(n-1) - \left\lfloor \frac{-s(n-1)+s(n+1)+2}{4} \right\rfloor$$

The results from the low-pass filter may be used twice (in the first and third terms) in the high-pass filter. Therefore, only two other additions need to be performed to arrive at the results of the high-pass filter.

Another example of an exact-reconstruction system comprises the Two/Ten (TT)-Transform. The reversible TT-transform is defined by the expression of the two outputs of a low-pass and a high-pass filter:

$$d(n) = \left\lfloor \begin{array}{c} 3\left\lfloor \dfrac{x(2n)+x(2n+1)}{2} \right\rfloor - 22\left\lfloor \dfrac{x(2n+2)+x(2n+3)}{2} \right\rfloor + \\ 64(x(2n+4)-x(2x+5)) + 22\left\lfloor \dfrac{x(2n+6)+x(2n+7)}{2} \right\rfloor - \\ 3\left\lfloor \dfrac{x(2n+8)+x(2n+9)}{2} \right\rfloor \\ \hline 64 \end{array} \right\rfloor$$

The expression for d(n) can be simplified and written with the use of s(n) (moreover the integer division by 64 can be rounded by adding a 32 to the numerator). These result in:

$$\begin{cases} s(n) = \left\lfloor \dfrac{x(2n)+x(2n+1)}{2} \right\rfloor \\ d(n) = x(2n+2)-(2n+3) + \left\lfloor \dfrac{3S(n)-22S(n+2)+22(5n+4)- 3S(n+6)+32}{64} \right\rfloor \end{cases}$$

The TT-transform is reversible and the inverse is:

$$\begin{cases} x(2n) = s(n) + \left\lfloor \dfrac{p(n)+1}{2} \right\rfloor \\ x(2n+1) = s(n) - \left\lfloor \dfrac{p(n)}{2} \right\rfloor \end{cases}$$

where p(n) must first be computed by, $$p(n) = d(n-1) - \left\lfloor \dfrac{3S(n)-22S(n+2)+22(5n+4)-3S(n+6)+32}{64} \right\rfloor$$

Note that in both the reversible TS-transform and TT transform, like the S-transform, the low-pass filter is implemented so that the range of the input signal x(n) is the same as the output signal s(n). That is, there is no growth in the smooth output. If the input signal is b bits deep, then the smooth output is also b bits. For example, if the signal is an 8-bit image, the output of the low-pass filter is also 8 bits. This is an important property for a pyramidal system where the smooth output is decompressed further by, for example, successively applying the low-pass filter. In prior art systems, the range of the output signal is greater than that of the input signal, thereby making successive applications of the filter difficult. Also, there is no systemic error due to rounding in the integer implementation of the transform, so all error in a lossy system can be controlled by quantization. In addition, the low-pass filter has only two taps which makes it a non-overlapping filter. This property is important for the hardware implementation.

Figure 15:
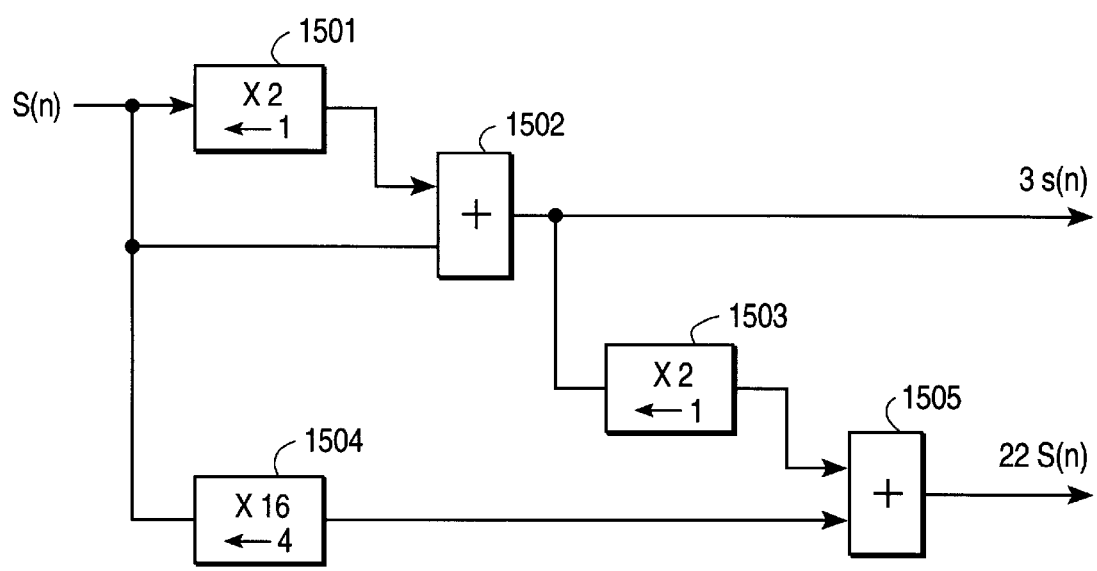
FIG. 15 illustrates one embodiment of a portion of a TT-transform filter.

In one embodiment, multiplication by 3 and 22 are implemented by shifts and adds, such as those shown in FIG. 15. Referring to FIG. 15, the s(n) input is coupled to multiplier 1501, which multiplies the s(n) signal by 2. In one embodiment, the multiply operation is implemented as a shift by 1 to the left of the bits in the s(n) signal. The output of multiplier 01 is added to the s(n) signal by adder 1502. The output of adder 1502 is the 3s(n) signal. The output of adder 1502 is also multiplied by 2 using multiplier 1503. Multiplier 1503 is implemented as a shift to the left by 1. The output of multiplier 1503 is added using adder 1505 to the output of multiplier 1504, which multiplies the s(n) signal by 16 using a shift to the left by four. The output of adder 1505 is the 22s(n) signal.

The strict reversibility requirements for filters can be relaxed by noting the following. High pass coefficients are encoded and decoded in the some order. Pixel values corresponding to previously decoded high pass coefficients are known exactly, so they can be used in current high pass filtering.

The TS-transform and TT-transform have non-overlapped low pass synthesis and high pass analysis filters. The high pass synthesis and low pass analysis filters are the only overlapped filters.

The TS-filter has nice properties with respect to tile boundaries. Consider the case where the tile size is a multiple of the tree size. Consider applying the transform to portions of a signal, such as would occur when an image is separated into tiles. Since the low pass analysis filter is not overlapped, the low pass coefficients are not effected by tiling. That is, if the portions of the signal have an even number of signals, the low pass coefficients are the same as they would be if the whole signal was transformed.

During decoding, if the high pass coefficients are not present due to quantization and an image is to be reconstructed at maximum compression using only the SS coefficients, then the low pass synthesis filter may be used across tile boundaries and the inverse transform is performed using the low pass coefficients for the whole signal. Since the SS coefficients are not changed by tiling, the answer is exactly the same as if tiling was not used. This eliminates any artifacts caused by performing the forward transform on portions of the signal.

During decoding, if high pass coefficients are present (but quantized so that their value has some uncertainty), the following can be done for samples where the overlapped ID low pass analysis filtering operation crosses a boundary into another portion. The minimum and maximum possible reconstruction values are determined for a sample based on the filters actually used that do not cross a tile boundary. The reconstruction value that would have been (i.e., an overlapped estimate) is determined using only low pass coefficients (and the low pass filter) and crossing the tile boundary for the sample. If the overlapped estimate is between the minimum and maximum possible reconstruction values (inclusive), then the overlapped estimate is used. Otherwise, the minimum or maximum possible reconstruction value is used, whichever is closer to the overlapped estimate. This reduces any artifacts caused by performing the forward transform on pieces of the signal.

A reconstruction value is chosen every time a 1D filtering operation is performed. If this is done correctly, each high pass coefficient will be given exactly one valid reconstruction value and choices will not be able to propagate errors through multiple levels of the transform.

Non Linear Image Models

One embodiment of this invention uses wavelet filters which are reversible approximations to linear filters such as the TS-transform or the TT-transform. In other embodiments, reversible non-linear filters could be used. One class of non-linear transforms that are similar to the TS-transform and TT-transform is as follows.

$$s(n) = \lfloor (x(2n)+x(2n+1))/2 \rfloor$$

$$d(n) = x(2n) - x(2n+1) + q(n)$$

The inverse is the same as for the TS-transform and the TT-transform except that p(n) is as follows:

$$p(n)=d(n-1)-q(n)$$

In this embodiment, q(n) is an estimate of x(2n)–x(2n+1) from smooth coefficients (and optionally previous detail coefficients). The estimate uses a non-linear image model. In one embodiment, the non-linear image model is a Huber-Markov random field. The non-linear image model is exactly the same in the forward and inverse transform. For iterative image models, the number and order of iterations is the same.

An example of a non-linear image model is as follows. Each value (pixel or low pass coefficient) x(k) is adjusted to a new value x'(k) for a fixed number of iterations (where k is 2n or 2n+1). While any number of iterations may be used, three iterations might be used in one embodiment. The value of q(n) is determined from the final iteration:

$$q(n)=x'(2n)-x'(2n+1)$$

For each iteration, a change y(k) is computed for each x(k).

$$y(k)=-A*\text{summation\_over\_}iH(Bi(i))$$

where A is a rate of change which may be any positive value. In one embodiment, A is 1. Bi is a difference detector. For example, in one dimension, Bi is $$Bi(k)=-x(k-1)/2+x(k)-x(k+1)/2$$

In two dimensions, there may be four values of i for detecting differences in the horizontal, vertical and two diagonal directions. Other difference operators may be used for Bi.

$$H(Bi(k)) = \{Bi(k) \text{ if } |Bi(k)| < T$$
$$\{T \text{ otherwise}$$

where T is a threshold which may be any value. T indicates a difference which constitutes an edge in image. In one embodiment, T is 8.

Pairs of values x'(2n) and x'(2n+1) are adjusted by pairs of changes y(2n) and y(2n+1) under the constraint that x'(2n)+x'(2n+1) equals x(2n)+x(2n+1). This is achieved by combining the changes y(2n) and y(2n+1) into a single change y'(2n), that is the largest change supported by both.

If y(2n) and y(2n+1) are both positive or both negative, then $$y'(sn) = 0$$
$$\text{else if } |y(2n)| < |y(2n + 1)|$$
$$y'(2n) = y(2n)$$
$$\text{else}$$
$$y'(sn) = -y(2n + 1)$$
$$x'(2n) = x(2n) + y'(2n)$$
$$x'(2n + 1) = x(2n + 1) - y'(2n);$$

For more information on Huber-Markov random fields, see R. R. Schultz and R. L. Stevenson, Improved definition image expansion, in proceedings of IEEE International Conference on Acoust., Speech, and Signal Processing, vol. III, pages 173–176, San Francisco, March 1992.

In some embodiments, the transform is extended from one to two dimensions by first doing the transform with q(n)=0 separately on each dimension. Then, the same application of the image model is used to calculate the three q(n) values for the LH, HL, and HH values.

Two-Dimensional Wavelet Decomposition

Using the low-pass and high-pass filters of the present invention, a multi-resolution decomposition is performed. The number of levels of composition is variable and may be any number; however, currently the number of decomposition levels equals from two to eight levels. The maximum number of levels is the $\log_2$ of the maximum of the length or width.

The most common way to perform the transform on two-dimensional data, such as an image, is to apply the one-dimensional filters separately, i.e., along the rows and then along the columns. The first level of decomposition leads to four different bands of coefficients, referred to herein as LL, HL, LH, and HH. The letters stand for low (L) and high (H) corresponding to the application smooth and detail filters defined above respectively. Hence, the LL band consist of coefficients from the smooth filter in both row and column directions. It is common practice to place the wavelet coefficients in the format as in FIGS. 3A–3D.

Each frequency subband in a wavelet decomposition can be further decomposed. The most common practice is to only decompose the LL frequency subband further, and may include further decomposing of the LL frequency subband in each decomposition level as each is generated. Such a multiple decomposition is called pyramidal decomposition (FIGS. 3A–3D). The designation LL, LH, HL, HH and the decomposition level number denote each decomposition. Note that with either filters, TS or TT, of the present invention, pyramidal decomposition does not increase the coefficient size.

Figure 3A:
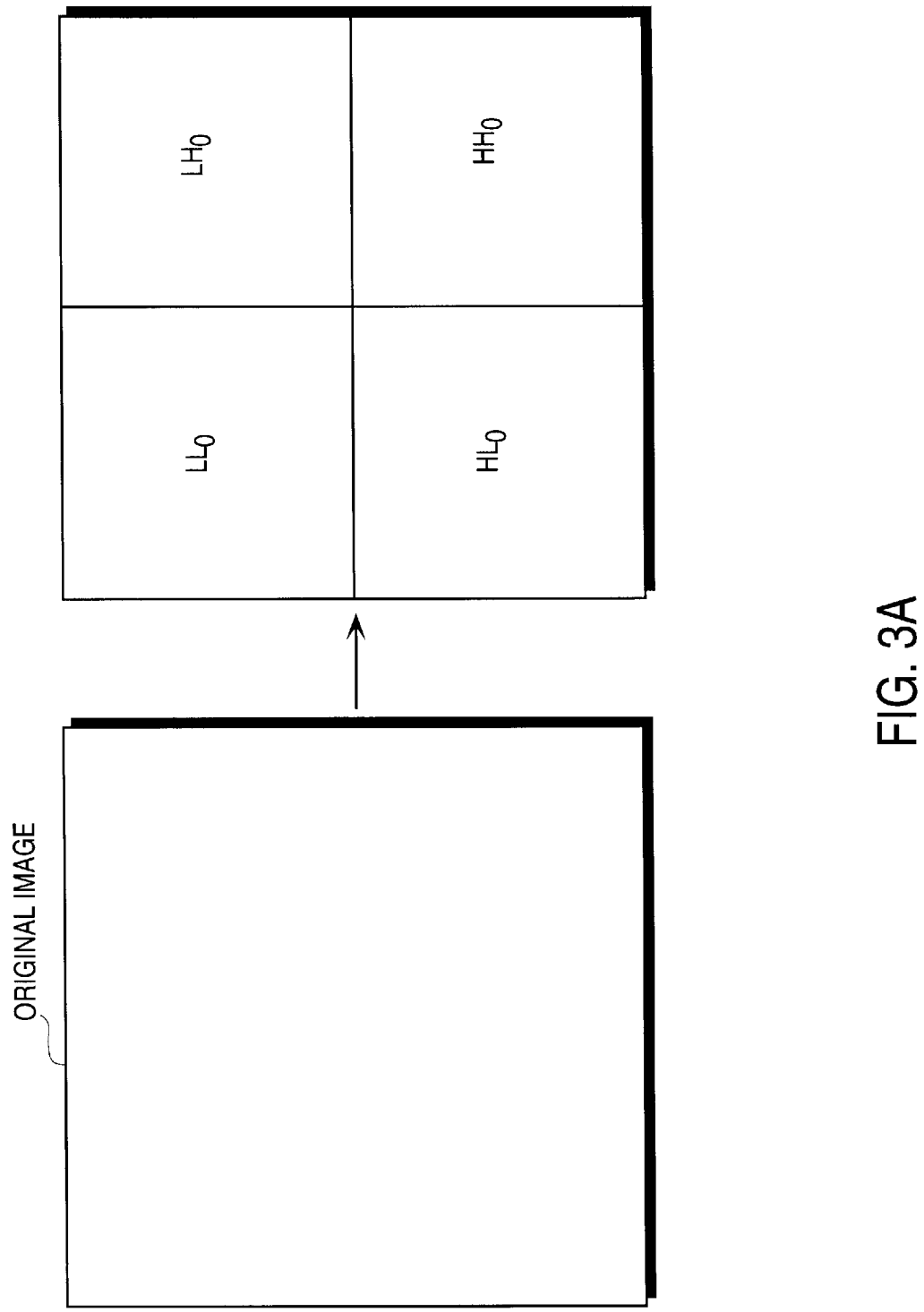
FIGS. 3A–3D illustrate results of performing a four level decomposition.

For example, if the reversible wavelet transform is recursively applied to an image, the first level of decomposition operates on the finest detail, or resolution. At a first decomposition level, the image is decomposed into four sub-images (e.g., subbands). Each subband represents a band of spatial frequencies. The first level subbands are designated $LL_0$, $LH_0$, $HL_0$ and $HH_0$. The process of decomposing the original image involves subsampling by two in both horizontal and vertical dimensions, such that the first level subbands $LL_0$, $LH_0$, $HL_0$ and $HH_0$ each have one-fourth as many coefficients as the input has pixels (or coefficients) of the image, such as shown in FIG. 3A.

Subband $LL_0$ contains simultaneously low frequency horizontal and low frequency vertical information. Typically a large portion of the image energy is concentrated in this subband. Subband $LH_0$ contains low frequency horizontal and high frequency vertical information (e.g., horizontal edge information). Subband $HL_0$ contains high frequency horizontal information and low frequency vertical information (e.g., vertical edge information). Subband $HH_0$ contains high frequency horizontal information and high frequency vertical information (e.g., texture or diagonal edge information).

Figure 3B:
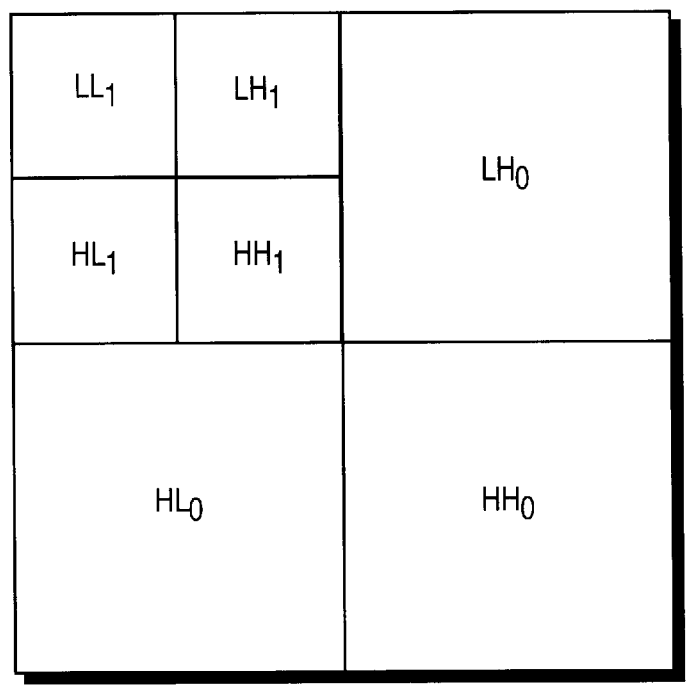
Figure 3C:
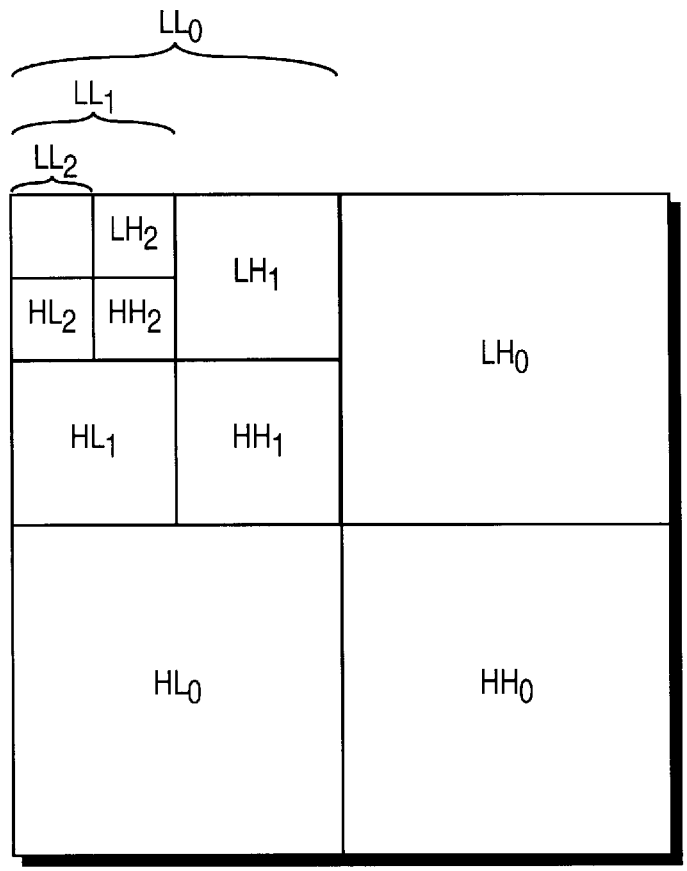
Figure 3D:
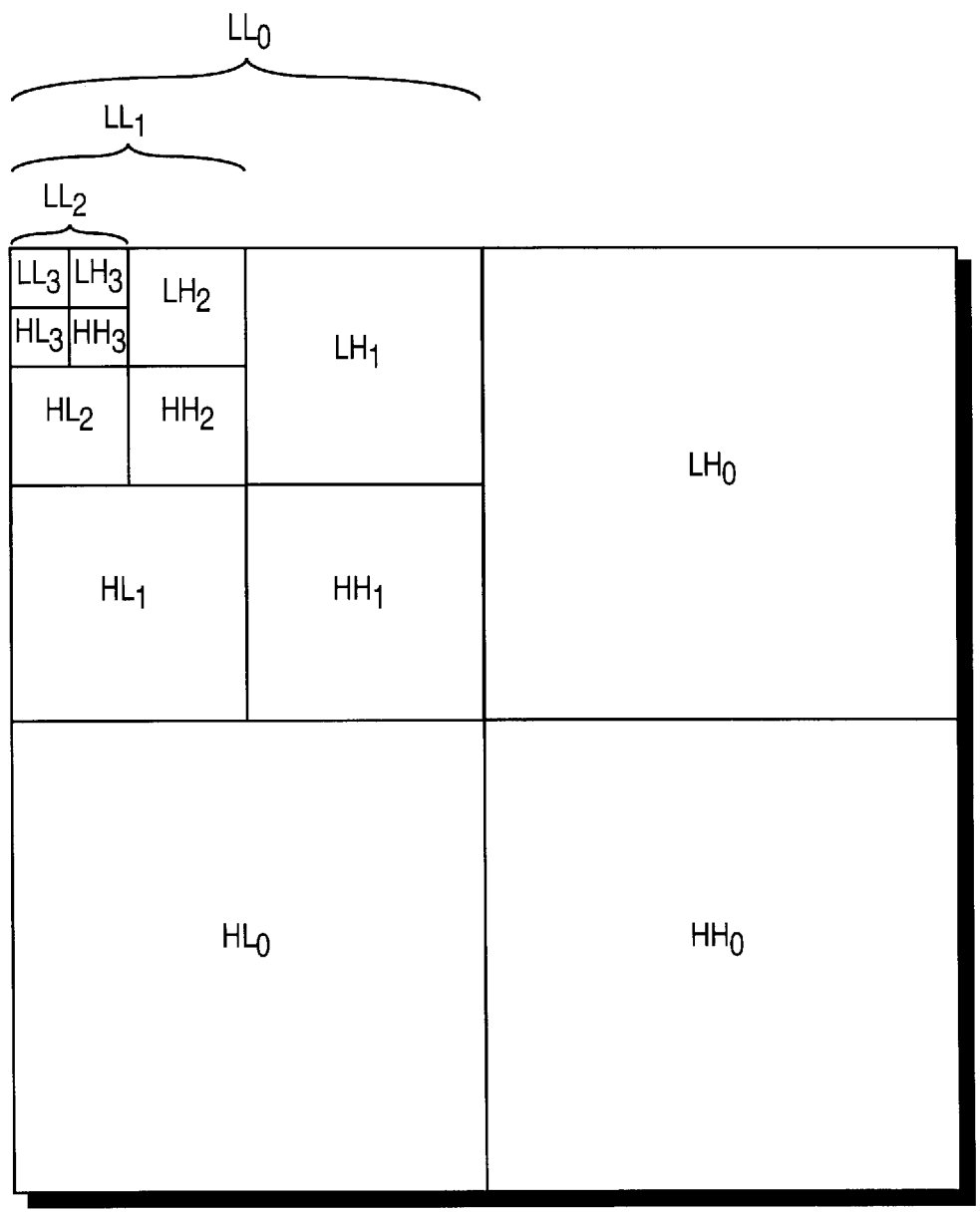

Each of the succeeding second, third and fourth lower decomposition levels is produced by decomposing the low frequency LL subband of the preceding level. This subband $LL_0$ of the first level is decomposed to produce subbands $LL_1$, $LH_1$, $HL_1$ and $HH_1$ of the moderate detail second level, as shown in FIG. 3B. Similarly, subband $LL_1$ is decomposed to produce coarse detail subbands $LL_2$, $LH_2$, $HL_2$ and $HH_2$ of the third level, as shown in FIG. 3C. Also, subband $LL_2$ is decomposed to produce coarser detail subbands $LL_3$, $LH_3$, $HL_3$ and $HH_3$ of the third level, as shown in FIG. 3D. Due to subsampling by two, each second level subband is one-sixteenth the size of the original image. Each sample (e.g., pixel) at this level represents moderate detail in the original image at the same location. Similarly, each third level subband is $\frac{1}{64}$ the size of the original image. Each pixel at this level corresponds to relatively coarse detail in the original image at the same location. Also, each fourth level subband is $\frac{1}{256}$ the size of the original image.

Since the decomposed images are physically smaller than the original image due to subsampling, the same memory used to store the original image can be used to store all of the decomposed subbands. In other words, the original image and decomposed subbands $LL_0$ and $LL_1$ are discarded and are not stored in a three level decomposition.

Although only four subband decomposition levels are shown, additional levels could be developed in accordance with the requirements of a particular system. Also, with other transformations such as DCT or linearly spaced subbands, different parent-child relationships may be defined.

Pyramidal Decomposition

Each frequency subband in a wavelet decomposition can be further decomposed. In one embodiment, only the LL frequency subband is decomposed. Such a decomposition is referred to herein as a pyramidal decomposition. The designation LL, LH, HL, HH and the decomposition level number denote each decomposition. Note that pyramidal decomposition does not increase the coefficient size with the wavelet filters of the present invention.

In other embodiments, other subbands in addition to the LL may be decomposed also. In the description that follows, the terminology "LL" may be used interchangeably with "SS" ("L"="S"). Similarly, the terminology of "H" may be used interchangeably with "D".

Tree Structure of Wavelets

There is a natural and useful tree structure to wavelet coefficients in a pyramidal decomposition. Note that there is a single LL frequency subband corresponding to the last level of decomposition. On the other hand, there are an many LH, HL, and HH bands as the number of levels. The tree structure defines the parent of a coefficient in a frequency band to be a coefficient in a same frequency band at a lower resolution and related to the same spatial locality.

The root of each tree is a purely smooth coefficient. For a two-dimensional signal such as an image, the root of the tree has three "children" and the rest of the nodes have four children each. The tree hierarchically is not limited to two dimensional signals. For example, for a one dimensional signal, a root has one child and non-root nodes have two children each. Higher dimensions follow from the one-dimensional and two-dimensional cases.

Figure 4:
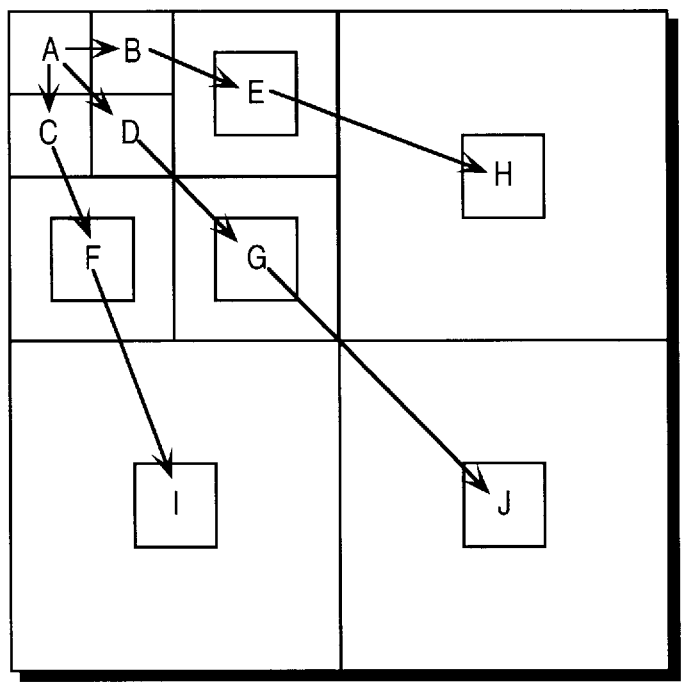
FIG. 4 illustrates the parental relationship between two consecutive levels.

FIG. 4 shows the parental relationship between two consecutive levels. Referring to FIG. 4, the coefficient at A is the direct parent to B, C, and D but is also parent to the coefficients that have B, C and D as parents (E and H, F and I, and G and J respectively). For example, B is parent to the four coefficients around E and the sixteen coefficients around H, etc.

The process of multi-resolution decomposition may be performed using a filtering system.

For examples of a two-dimensional, two-level transform, a two-dimensional, two-level transform implemented using one-dimensional exemplary filters, see U.S. patent application Ser. No. 08/498,695, filed Jun. 30, 1995 and entitled "Method and Apparatus For Compression Using Reversible Wavelet Transforms and an Embedded Codestream" and U.S. patent application Ser. No. 08/498,036, filed Jun. 30, 1995 and entitled "Reversible Wavelet Transform and Embedded Codestream Manipulation".

Performing the Forward Wavelet Transform

Figure 5A:
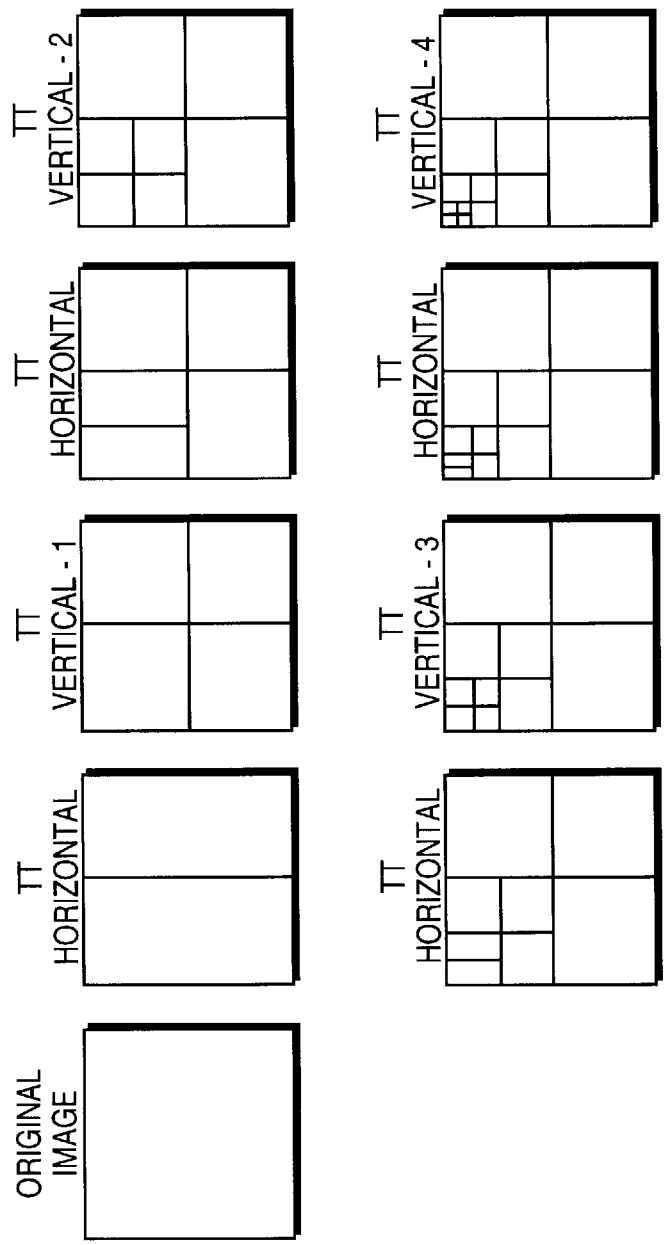
FIG. 5A illustrates one embodiment of a wavelet decomposition stages using only TT transforms.
Figure 5B:
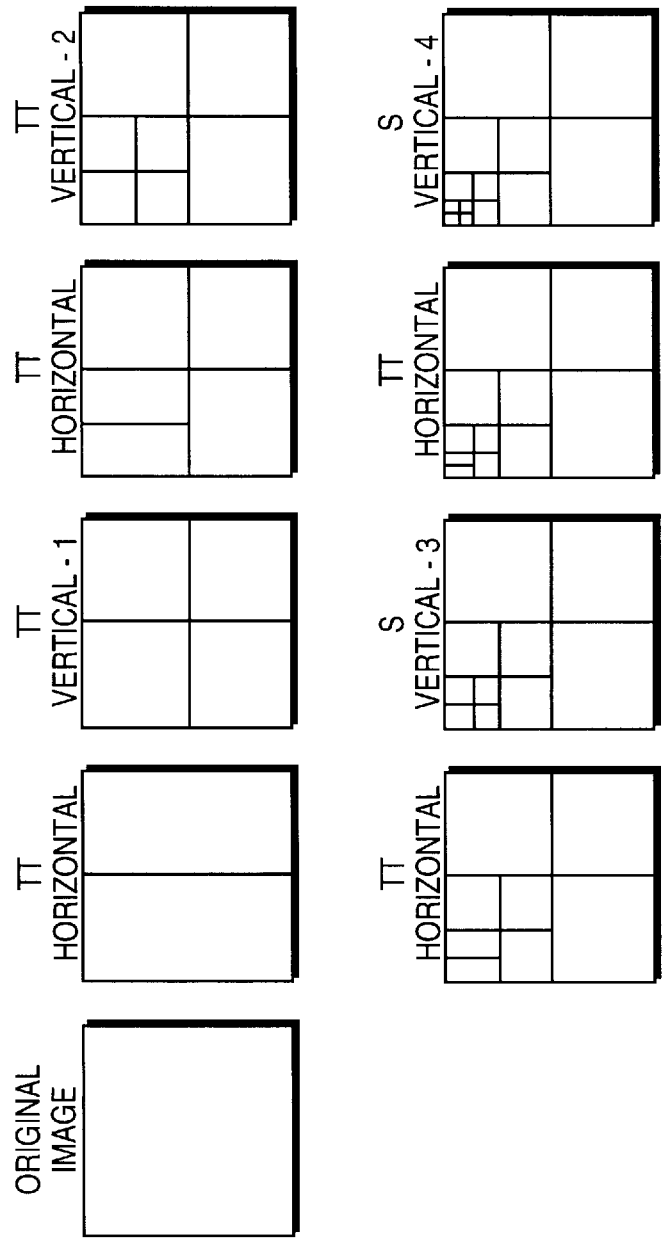
FIG. 5B illustrates one embodiment of a wavelet decomposition stages using TT transforms and S transforms.

In the present invention, the wavelet transform is performed with two 1-D passes, horizontal then vertical. The number of levels determine the number of iterations. FIG. 5A illustrates a four level decomposition, using forward TT-transform filters, such as defined above.

In alternate embodiments, other reversible wavelet transform filters, such as the S-transform, can be substituted for the TT-transform at any point in the wavelet transform, horizontal or vertical at any level. In one embodiment, a four level decomposition is performed using the TT transform in both the horizontal and vertical directions. In one embodiment, in a four level decomposition, two of the TT-transforms out of four are replaced by an S-transform at a small cost to the compression, but significant impact on the memory usage. The horizontal and vertical transforms may be applied alternatively.

Note that any combination of the S and TT transforms may be used to implement the horizontal and vertical transforms. Note that although the orders of the transforms may be mixed, the decoder must be aware of the order and must perform a reverse operation in the reverse order to be fully reversible. The decoder may be made aware by signaling the decoder in the header, as is described below.

Embedded Ordering

In the present invention, the coefficients generated as a result of the wavelet decomposition are entropy coded. In the present invention, the coefficients initially undergo embedded coding in which the coefficients are ordered in a visually significant order or, more generally, ordered with respect to some error metric (e.g., distortion metric). Error or distortion metrics include peak error, and mean squared error (MSE). Additionally, ordering can be performed to give preference to bit-significance spatial location, relevance for data base querying, and directionally (vertical, horizontal, diagonal, etc.).

The ordering of the data is performed to create the embedded quantization of the codestream. In the present invention, two ordering systems are used: a first for ordering the coefficients and a second for ordering the binary values within a coefficient. The ordering of the present invention produces a bitstream that is thereafter coded with a binary entropy coder.

Tiles

In the present invention, before transforming and encoding, the image is divided into tiles. Tiles are complete independently-coded sub-images of the whole image, defined by a regular rectangular grid placed on the image and numbered as in FIG. 6. The tiles on the right and bottom can be different sizes depending on the original image and the tile size.

Tiles can be any height and width, up to the size of the image, but choice of tile size impacts performance. Small tiles, especially in the vertical dimension on raster ordered images, can allow the use of less work-space memory. However, if the tile is too small, three factors reduce compression efficiency: the signaling overhead, the loss of transform efficiency on the boundaries of the tile, and the start-up adaptation of the entropy coder. It is beneficial to have tile dimensions that are a multiple of the extent of a lowest frequency component (CREW tree), which is a function of the number of levels ($2^{number-of-levels}$). Tiles of 128×128 or 256×256 seem reasonable in many applications, depending on the size of the original image.

Tiles may be used for compressing a sequence of images. Thus, tiled images could be different images in time (like a movie) or in space (like 3D cross sections like MRI). There is no specific way to signal this; however, the CMT could be used.

The transform, context modeling, and entropy coding operate only on the pixel and coefficient data in one image tile. This allows image tiles to be parsed or decoded out of order, i.e., randomly addressed, or decoded to different levels of distortion for region of interest decompression.

All pixel data in an image tile is available to the encoder at one time, e.g., buffered in memory. Once the pixel data is transformed, all coefficient data is available for the Horizon context model. Since all coefficients can be randomly accessed, the embedding within an image tile can be in any arbitrary order as long as that order is known to both the encoder and the decoder. Since the entropy coder is casual with respect to this ordering, the order has a significant impact on the compression and must be chosen with care.

An image tile is defined by a number of tree (an LL coefficient and all its descendants) arranged in a rectangle. The number of pixels in each tree is a function of the number of levels of wavelet decomposition.

An image reference grid is the smallest grid plane where the extent of each component is an integer multiple of grid points. For most images, this implies that the image reference grid is the same as the most frequent component.

For images with one component or with all components the same size, the image reference grid is the same size as the image (e.g., the grid points are image pixels). For images with multiple components that are not all the same size, the size is defined as an integer multiple of image reference grid points. For example, the CCIR 601 YCrCb color component system is defined to have 2 Y components for each Cr and Cb component. Thus, the Y component defines the image reference grid and the Cr and Cb components each cover 2 units horizontal and 1 unit vertical.

Bit-Significance Representation

In one embodiment, the embedded order used for binary values within a coefficient is by bit-plane. The coefficients are expressed in bit-significance representation. Bit-significance is a sign-magnitude representation where the sign bit, rather than being the most significant bit (MSB), is encoded with the first non-zero magnitude bit.

Figure 7:
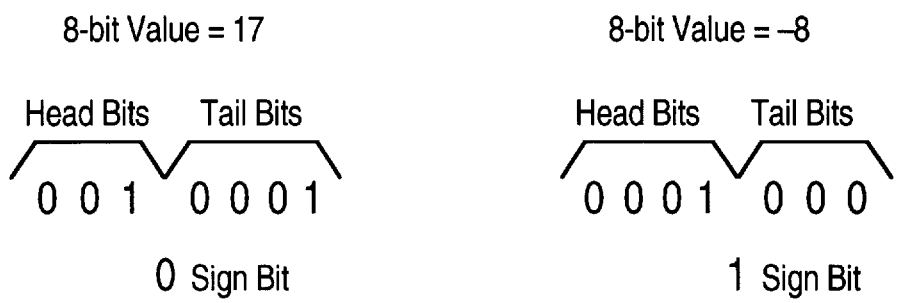
FIG. 7 illustrates examples of bit significance representation.

There are three types of bits in a number represented in bit-significance form: head, tail, and sign. The head bits are all the zero bits from the MSB to the first non-zero magnitude bit plus the first non-zero bit. The bit-plane where the first non-zero magnitude bit occurs defines the significance of the coefficient. The bits after the first non-zero magnitude bit to the LSB are the tail bits. The sign bit simply denotes the sign. A number, such as $\pm 2^n$, with a non-zero bit as the MSB has only one head bit. A zero coefficient has no tail or sign bits. FIG. 7 illustrates examples of bit-significance representation.

In the case where the values are non-negative integers, such as occurs with respect to the intensity of pixels, the order that may be used is the bitplane order (e.g., from the most significant to the least significant bitplane). In embodiments where two's complement negative integers are also allowed, the embedded order of the sign bit is the same as the first non-zero bit of the absolute value of the integer. Therefore, the sign bit is not considered until a non-zero bit is coded. For example, using sign magnitude notation, the 16-bit number −7 is:

1000000000000111

On a bit-plane basis, the first twelve decisions will be "insignificant" or zero. The first 1-bit occurs at the thirteenth decision. Next, the sign bit ("negative") will be coded. After the sign bit is coded, the tail bits are processed. The fifteenth and sixteenth decisions are both "1".

Since the coefficients are coded from most significant bitplane to least significant bitplane, the number of bitplanes in the data must be determined. In the present invention, this is accomplished by finding an upper bound on the magnitudes of the coefficient values calculated from the data or derived from the depth of the image and the filter coefficients. For example, if the upper bound is 149, then there are 8 bits of significance or 8 bitplanes. For speed in software, bitplane coding may not be used. In an alternate embodiment, a bitplane is coded only when a coefficient becomes significant as a binary number.

Coefficient Alignment

The present invention aligns coefficients with respect to each other before the bit-plane encoding. This is because the coefficients in the different frequency subbands represent different frequencies similar to the FFT or the DCT. By aligning coefficients, the present invention allows quantization. The less heavily quantized coefficients will be aligned toward the earlier bitplanes (e.g., shifted to the left). Thus, if the stream is truncated, these coefficients will have more bits defining them than the more heavily quantized coefficients.

In one embodiment, the coefficients are aligned for the best rate-distortion performance in terms of SNR or MSE. There are many possible alignments including one that is near-optimal in terms of statistical error metrics such as MSE. Alternately, the alignment could allow a physchovisual quantization of the coefficient data. The alignment has significant impact on the evolution of the image quality (or in other words on the rate-distortion curve), but has negligible impact on the final compression ratio of the lossless system. Other alignments could correspond to specific coefficient quantization, Region of Interest fidelity encoding, or resolution progressive alignment.

The alignment may be signaled in the header of the comrpessed data. The coefficients are coded by bit-significance where the most significant importance level is derived from the coefficients in a coding unit. The sign bit for each coefficient is not coded until the most significant importance level where that coefficient has a non-zero magnitude bit. This has the advantage of not coding a sign bit for any coefficient that has a zero magnitude. Also, the sign bit is not encoded until the point in the embedded codestream where it is relevant. The alignment of the different sized coefficients is known to both the coder and decoder and has no impact on the entropy coder efficiency.

Figure 8A:
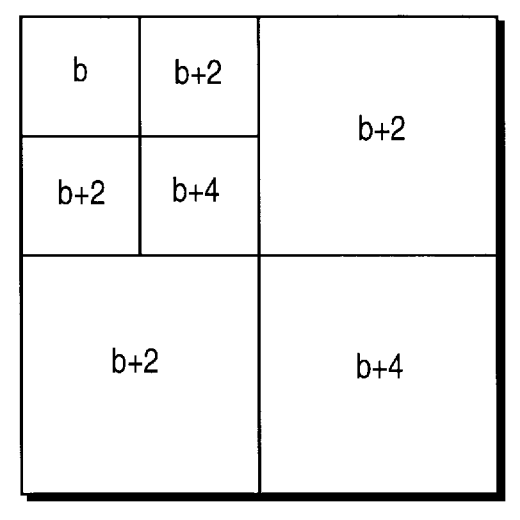
Figure 8B:
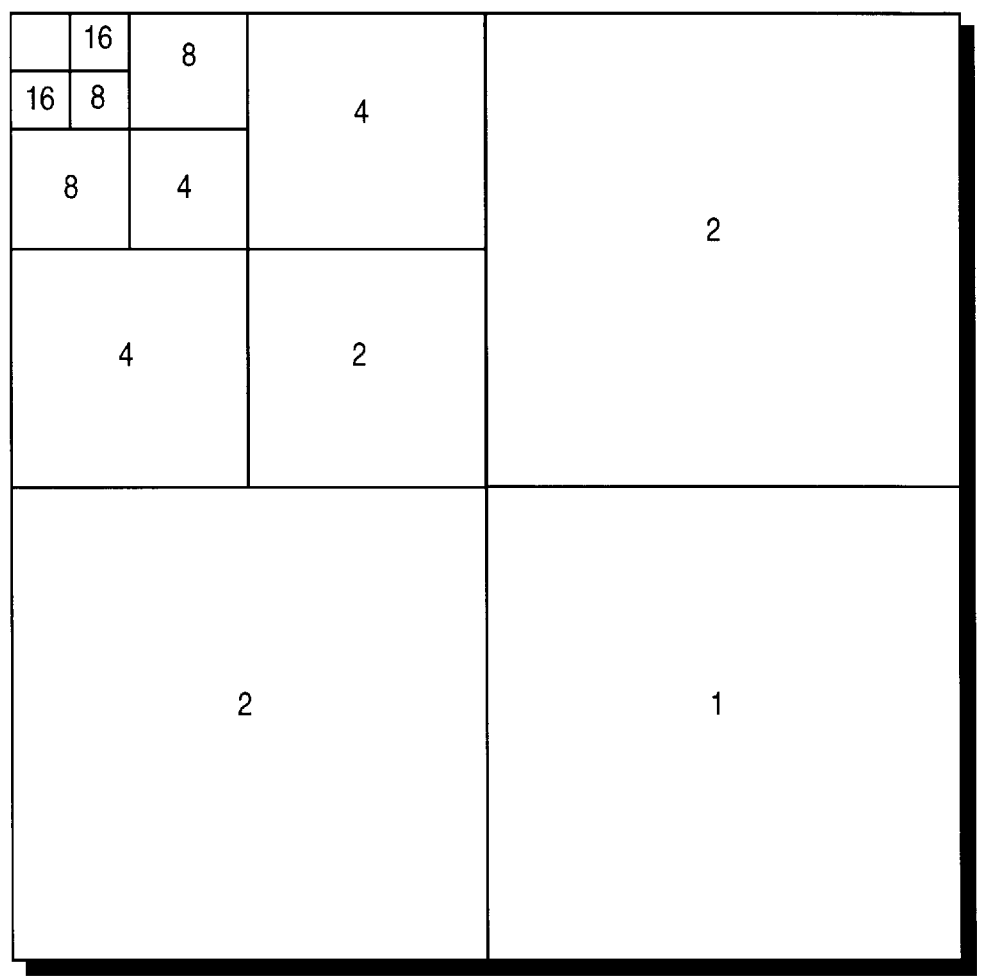
FIG. 8B is one embodiment of the multipliers for the frequency band used for coefficient alignment in the present invention.
Figure 9:
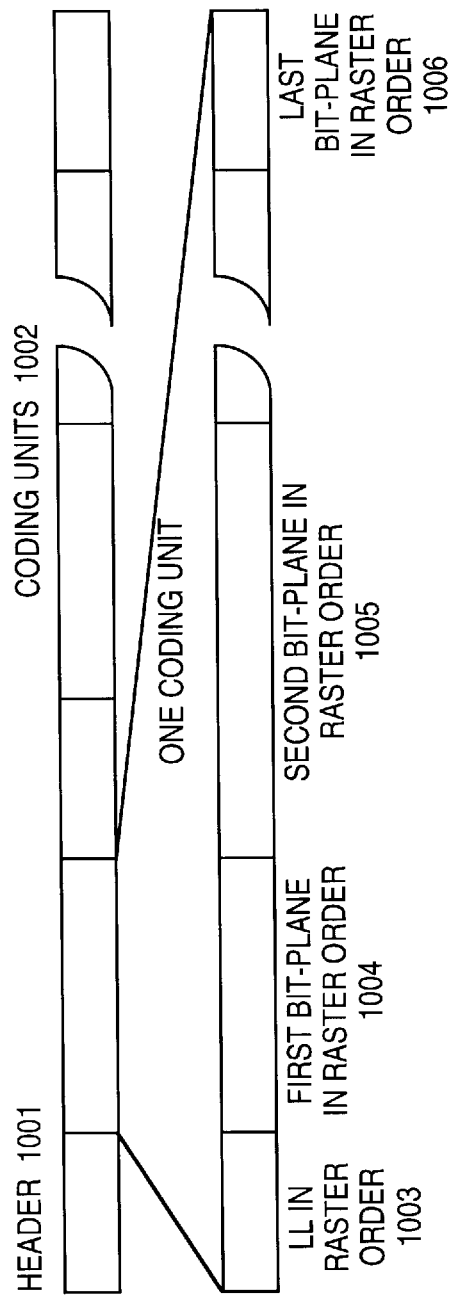
FIG. 9 illustrates one embodiment of a codestream configuration.

The bit depths of the various coefficients in a two-level TS-transform and TT-transform decomposition from an input image with b bits per pixel are shown in FIG. 8A. FIG. 8B is one embodiment of the multipliers for the frequency band used for coefficient alignment in the present invention. To align the coefficients, the 1-HH coefficient size is used as a reference, and shifts are given with respect to this size.

In one embodiment, the coefficients are shifted with respect to the magnitude of the largest coefficient to create an alignment of all the coefficients in the image. The aligned coefficients are then handled in bit-planes called importance levels, from the most significant importance level (MSIL) to the least significant importance level (LSIL). The sign bit is not part of the MSIL and is not encoded until the last head bit of each coefficient. It is important to note that the alignment simply controls the order the bits are sent to the entropy coder. Actual padding, shifting, storage, or coding of extra zero bits is not performed.

Table 1 illustrates one embodiment of alignment numbers.

TABLE 1

| Coefficient alignment | | | | | | | |
|---|---|---|---|---|---|---|---|
| 1-HH | 1-HL,1-LH | 2-HH | 2-HL,2-LH | 3-HH | 3-HL,3-LH | 4-HH | 4-HL,4-LH |
| reference | Left 1 | Left 1 | Left 2 | Left 2 | Left 3 | Left 3 | Left 4 |

The alignment of different sized coefficients is known to both the coder and the decoder and has no impact on the entropy coder efficiency.

Note that coding units of the same data set may have different alignments.

Ordering of the Codestream

Figure 10:
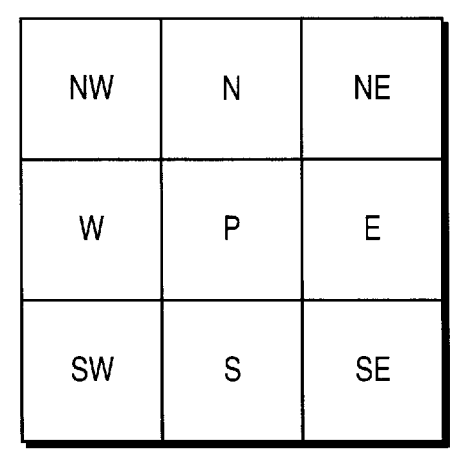

FIG. 10 illustrates the ordering of the codestream and the ordering within a coding unit. Referring to FIG. 10, the header 1001 is followed by the coding units 1002 in order from top band to bottom. Within a coding unit, the LL coefficients 1003 are stored uncoded in raster (line) order. After the LL coefficients, the importance levels are entropy coded, one bit-plane at a time, starting from the most significant bit-plane to the least significant bit-plane. Then the first bit-plane from every coefficient is coded followed by the second bit-plane, etc. In one embodiment, the alignment may be specified in header 1001.

In one embodiment, LL coefficients are only stored uncoded in raster order if they are 8-bit values. If their size is less than eight bits, the LL coefficients are padded to eight bits. If the LL coefficients are larger than eight bits, then they are stored as follows. First, the most significant eight bits of each coefficient is stored uncoded in raster order. Then, the remaining least significant bits of the coefficient are packed and stored in raster order. For example, with 10-bit LL coefficients, least significant bits from four LL coefficients would be packed into a single byte. In this manner, 8-bit LL data is available for each coefficient no matter what the actual image depth is, allowing for quick generation of thumbnail or preview images.

The order that the coefficients during each bit-plane are processed are from the low resolution to the high resolution and from low frequency to the high frequency. The coefficient subband coder within each bit-plane is from the high level (low resolution, low frequency) to the low level (high resolution, high frequency). Within each frequency subband, the coding is in a defined order. In one embodiment, the order may be raster order, 2×2 block order, serpentine order, Peano scan order, etc.

In the case of a four level decomposition using the codestream of FIG. 24a, the order is as follows:

4-LL, 4-HL, 4-LH, 4-HH, 3-HL, 3-LH, 3-HH, 2-HL, 2-LH, 2-HH, 1-HL, 1-LH, 1-HH

Separating the codestream data by importance has advantages for storing or transmitting the data on media or through channels where noise is present. Error correcting/detecting codes with different redundancies can be used on different parts of the data. The highest redundancy code can be used for the header and LL coefficients. Entropy coded data that is less important (based on importance levels) can use error correcting/detecting codes with less redundancy. If an uncorrectable error occurs, the importance level of the data can also be used to determine whether a packet of data should be discarded (quantized) or retransmitted from the channel or reread from storage. For example, a high redundancy, error correcting BCH code (such as a Reed-Solomon code) could be used for the header data, LL data, and the most important quarter of the entropy coded data. The remaining three-quarters of the entropy coded data could be protected by a low redundancy error detecting checksum or CRC (cyclic redundancy check). In one embodiment, packets using BCH codes are always retransmitted and not discarded, while those having checksums or CRC codes will not be retransmitted and alternately discarded after an attempt to transfer the data has failed.

In one embodiment, the header data may indicate the error correcting/detecting codes used in each part of the data. In other words, the information in the header indicates when to switch error correcting coder. In one embodiment, the error correct/detecting codes are only changed at the between packets used by a channel or between blocks used by storage media.

Figure 19:
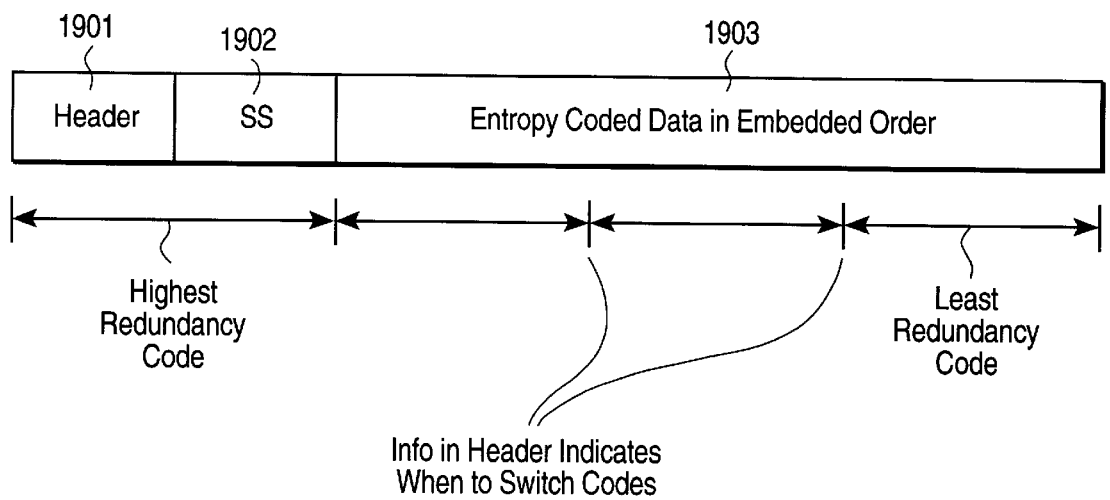
FIG. 19 illustrates an example of the codestream of the present invention.
Figure 20:
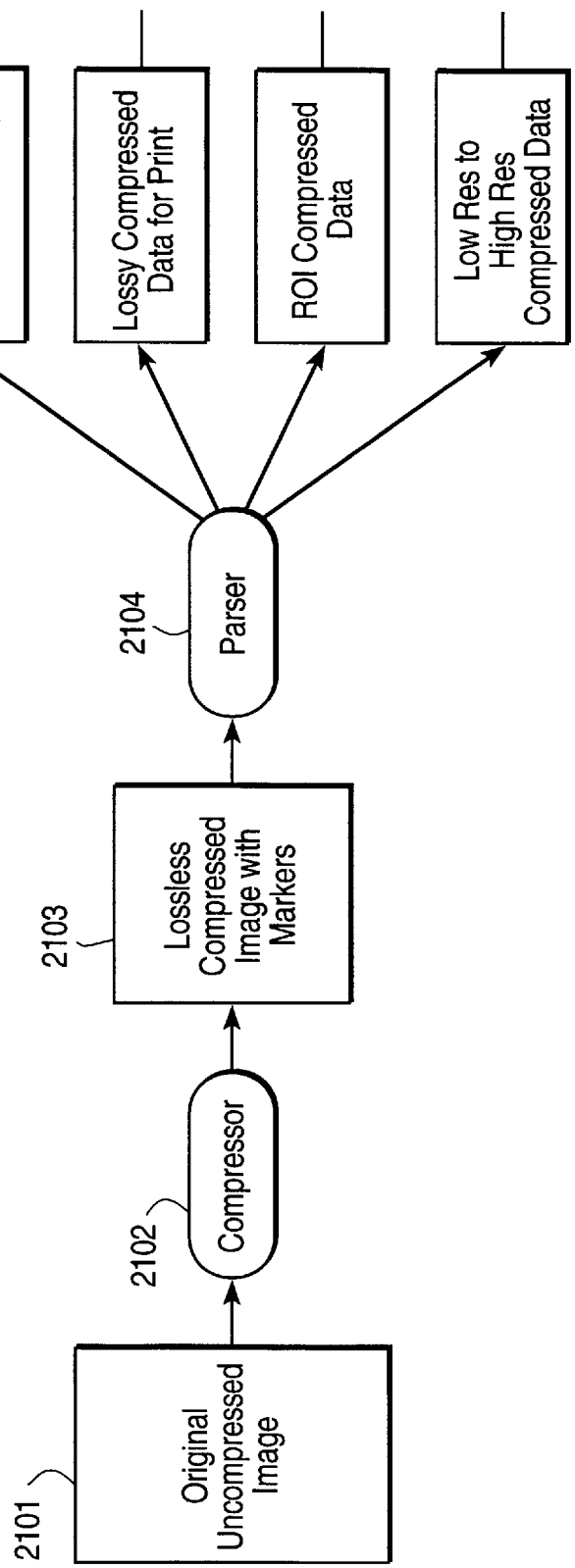
FIGS. 20 and 21 illustrate one embodiment of a parser system.

FIG. 19 illustrates a codestream in which a header 1901 is followed by the LL coefficients, uncoded (1902) and the entropy coded data 1903 in embedded orders. As shown, the header 1901 and LL coefficients 1902 use the highest redundancy code, while the entropy coded data 1903 uses the least redundancy codes. The present invention may employ a sliding scale in which many different codes are used from highest to lowest redundancy.

Horizon Context Model

One embodiment of the Horizon context model used in the present invention is described below. This model uses bits within a coding unit based on the spatial and spectral dependencies of the coefficients. The available binary values of the neighboring coefficients, and parent coefficients can be used to create contexts. The contexts, however, are causal for decodability and in small numbers for efficient adaptation.

Coefficient Modeling with the Horizon Context Model

The present invention provides a context model to model the bitstream created by the coefficients in the embedded bit-significance order for the binary entropy coder. In one embodiment, the context model comprises a run-length count, a spatial model, a sign bit model and a tail bit model. The run length count determines runs of bits in the same state. The spatial model includes information from adjacent and parent coefficients for the head bits.

FIG. 10 shows the neighborhood coefficients for every coefficient of a coding unit. Referring to FIG. 10, the neighborhood coefficients are denoted with the obvious geographical notations (e.g., N=north, NE=northeast, etc.). Given a coefficient, such as P in FIG. 10, and a current bit-plane, the context model can use any information from all of the coding unit prior to the given bit-plane. The parent coefficient of the present coefficient is also used for this context model.

Horizon Head Bits Context Model

The head bits are the most compressible data. Therefore, a large amount of context, or conditioning, is used to enhance compression. Rather than using the neighborhood or parent coefficient values to determine the context for the present bit of the present coefficient, the information is reduced to two bits referred to herein as tail-information. This information can be stored in memory or calculated dynamically from the neighbor or parent coefficient. The tail-information relates whether or not the first non-zero magnitude bit has been observed (e.g., whether the first "on-bit" has been observed) and, if so, about how many bit-planes ago. Table 2 describes the tail-information bits.

TABLE 2

| Tail | Definition of the tail information<br>Definition |
|---|---|
| 0 | no on-bits is observed yet |
| 1 | the first on-bit was on the last bit-plane |
| 2 | the first on-bit was two or three bit-planes ago |
| 3 | the first on-bit was more than three bit-planes ago |

From the 2-bit tail information, a 1-bit "tail-on" value is synthesized to indicate whether the tail information is zero or not. In one embodiment, the tail-information and the tail-on bits are updated immediately after the coefficient has been coded. In another embodiment, updating occurs later to allow parallel context generation.

In addition, the two bits are used to indicate the importance level being coded. The first two bit planes use value 0, the second two 1, the third two 2, and the remaining bit-planes 3. In addition, there is a run-length encoding of the bits that are all zero head bits.

The 10 bits of context for the head bits includes the 2 bits of information each from the parent and the W coefficients, 1 bit of information from each of the N, E, SW, and S coefficients, and 2 bits of importance level information.

In one embodiment, the tail-information is not used for some or all frequency bands. This allows a frequency band to be decoded without previously decoding its parent.

In another embodiment, the assignment of the bit planes of each frequency band to importance levels uses one alignment. The determination of tail-on information of the parent uses a second alignment, which uses fewer bitplanes of the parent than have actually been coded. This allows some bitplanes of a frequency band to be decoded without decoding the corresponding bitplanes of the parent in the same importance level (see FIG. 29B). For example, an image may be encoded with pyramidal alignment, but with parent tail-on information based on MSE alignment (see FIG. 29A). This allows the decoder to decode in pyramidal alignment, to simulate MSE alignment, or to simulate any alignment between pyramidal and MSE.

Figure 22:
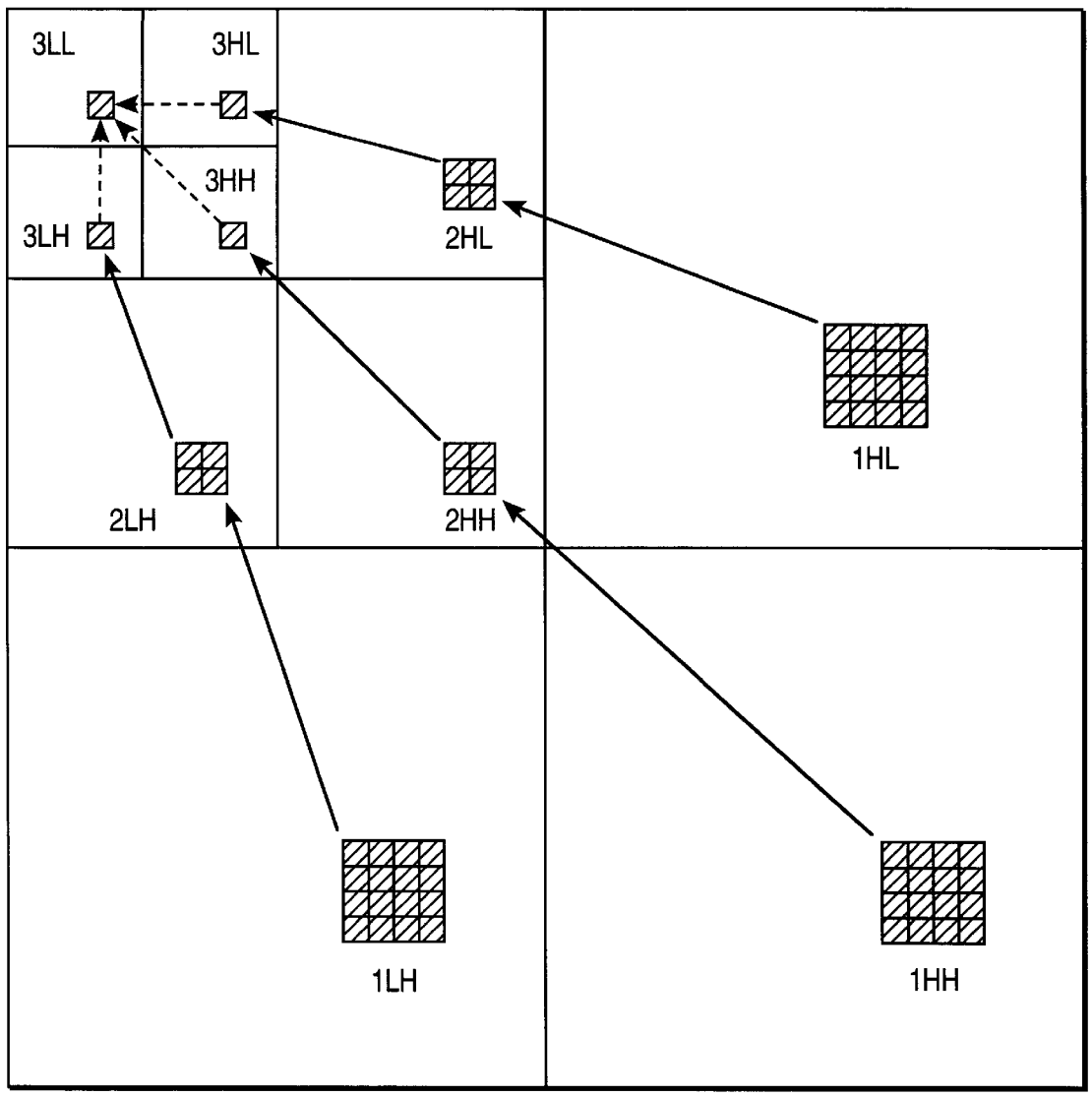
FIG. 22 shows context dependent relationships.

FIG. 22 shows the context dependent relationships. Children are conditioned on their parents. Therefore, these must be decoded prior to decoding their children, particularly when decoding using a different alignment than used during encoding.

Horizon Sign Bit Context Model

After the last head bit, the sign is encoded. There are three contexts for the sign depending on whether the N coefficient is positive, negative or the sign is not yet coded.

Horizon Tail Bits Context Model

There are three contexts for the tail bits depending on the value of the tail-information of the present coefficient. (Note that if the tail bits are being coded, the tail-information value can only be 1, 2, or 3.)

Steps for the Horizon Context Model

The context model of the system uses up to 11 bits to describe the context. This number may not be fully specified. The meaning of every bit position depends on the previous binary values. First, a single context is used to provide some "run-coding" of head bits. If there is no run of head bits, each bit is encoded with neighbors and parents contributing to a context. One embodiment of the steps are as follows:

1) A determination to do look-ahead is made.

If the tail information of the next N coefficients and their north neighbors are all zero, then the system proceeds to step 2. Otherwise the system proceeds to step 3 for the next N coefficients. In one embodiment, N is 16.

2) The look-ahead procedure is made.

If the bits of the current bit plane of next N coefficients to be coded are zero, then a 0 is coded and the system proceeds to the next N coefficients at step 1. Otherwise, a 1 is coded and the system proceeds to step 3 for the next N coefficients.

3) The state of the present coefficient is determined and coded.

If the tail information of present coefficient is 0, then the bit of the current bit plane of the present coefficient is coded with 1024 possible contexts constructed from the two tail information bits of the west and the (optional) parent coefficient, and the tail-on bit of the north west, east, southwest and south coefficients, and the two bits of importance level information and the system proceeds to step 4. Note that in one embodiment, the parent is not used, such that the context is formed from the neighbors and importance level information only. Otherwise, the bit of the current bit plane of the present coefficient is a tail bit and is coded with three contexts constructed from the two tail-information bits of the present coefficient.

4) The state of the current head bit is determined and a sign bit is coded if needed.

If the bit of the current bit plane of the present coefficient is 1, then the sign of the present coefficient is coded with three possible contexts constructed from the tail-on bit and the sign bit of the north coefficient.

Figure 11:
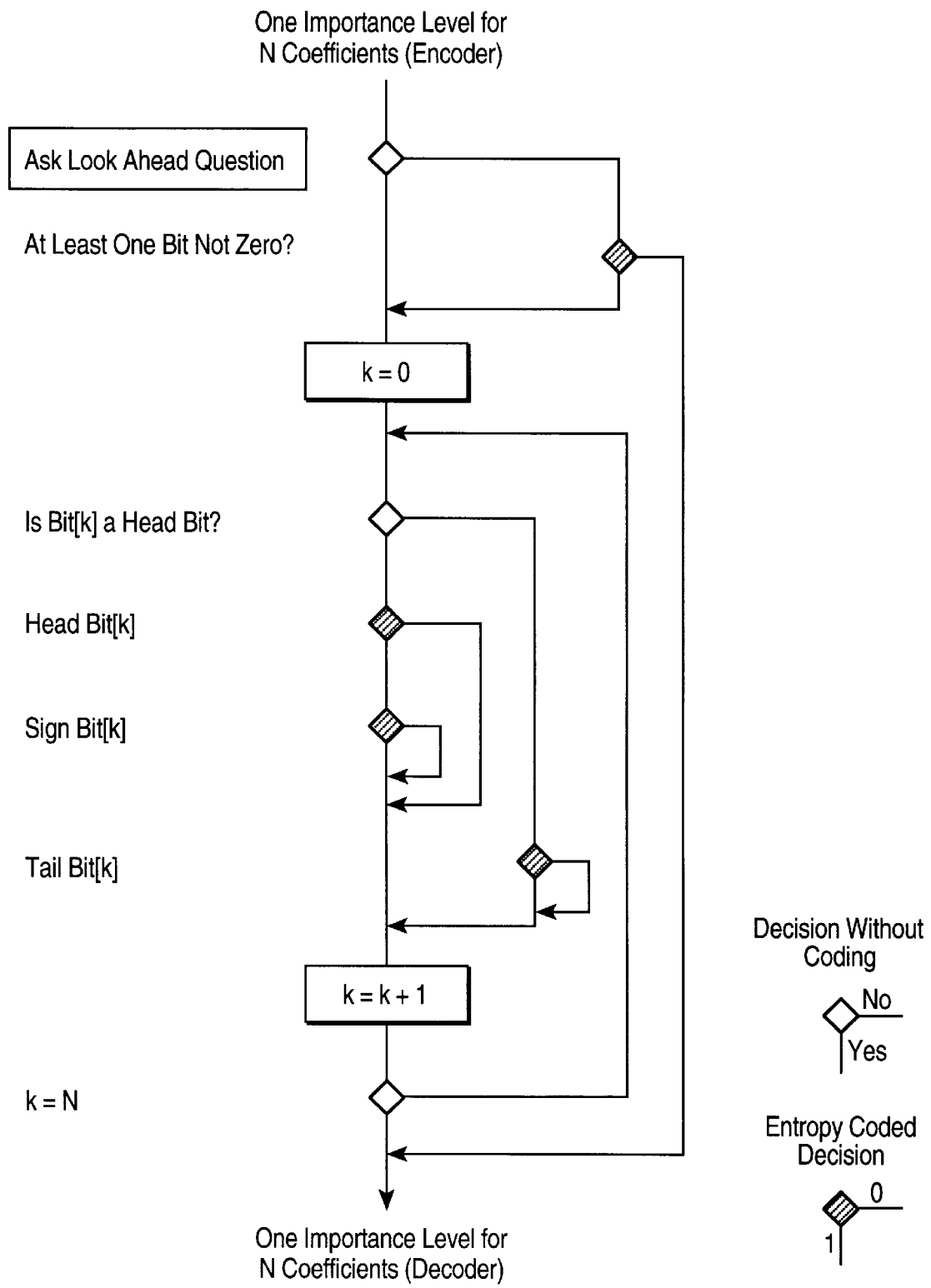
FIG. 11 is a flowchart of the process for processing tail information.

FIG. 11 is a flow chart of the process described above. Referring to FIG. 11, decision blocks are either associated without coding if they are blank and with coding if they are shaded. Although not shown, a context is defined for each entropy coded decision. The operation and flow described above would be understood by one skilled in the art.

One embodiment of a Horizon context model, including an embodiment of a sign/magnitude unit that converts input coefficients into a sign/magnitude format, is described in U.S. patent application Ser. No. 08/498,695, filed Jun. 30, 1995 and entitled "Method and Apparatus For Compression Using Reversible Wavelet Transforms and an Embedded Codestream" and U.S. patent application Ser. No. 08/498,036, filed Jun. 30, 1995 and entitled "Reversible Wavelet Transform and Embedded Codestream Manipulation".

Entropy Coding

In one embodiment, all the entropy coding performed by the present invention is performed by binary entropy coders. In one embodiment, entropy coder 104 comprises either a Q-coder, a QM-coder, a finite state machine coder, or a high speed parallel coder, etc. A single coder may be used to produce a single output code stream. Alternately, multiple (physical or virtual) coders may be employed to produce multiple (physical or virtual) data streams. In one embodiment, the binary entropy coder of the present invention comprises a Q-coder. For more information on the Q-coder, see Pennebaker, W. B., et al., "An Overview of the Basic Principles of the Q-coder Adaptive Binary Arithmetic," *IBM Journal of Research and Development*, Vol. 32, pg. 717–26, 1988. In an alternate embodiment, a binary entropy coder uses a QM-20 coder, which is a well known and efficient binary entropy coder. It is particularly efficient on bits with very high probability skew. The QM-coder is used in both the JPEG and JBIG standards.

The binary entropy coder may comprise a finite state machine (FSM) coder. Such a coder provides the simple conversion from a probability and an outcome to a compressed bit stream. In one embodiment, a finite state machine coder is implemented using table look-ups for both decoder and encoder. A variety of probability estimation methods may be used with such a finite state machine coder. Compression is excellent for probabilities close to 0.5. Compression for highly skewed probabilities depends on the size of the lookup table used. Like the QM-coder, it is useful with embedded bit streams because the decisions are coded in the order of occurrence. There is no possibility for "carry-over" problems because the outputs are defined by a lookup table. In fact, there is a maximum delay between encoding and the production of a compressed output bit, unlike the Q and QM coders. In one embodiment, the finite state machine coder of the present invention comprises a B-coder defined in U.S. Pat. No. 5,272,478, entitled "Method and Apparatus for Entropy Coding", issued Dec. 21, 1993.

In one embodiment, the binary entropy coder of the present invention comprises a high speed parallel coder. Both the QM-coder and the FSM coder require that one bit be encoded or decoded at a time. The high-speed parallel coder handles several bits in parallel. In one embodiment, the high speed parallel coder is implemented in VLSI hardware or multi-processor computers without sacrificing compression performance. One embodiment of a high speed parallel coder that may be used in the present invention is described in U.S. Pat. No. 5,381,145, entitled "Method and Apparatus for Parallel Decoding and Encoding of Data", issued Jan. 10, 1995.

Most efficient binary entropy coders are limited in speed by fundamental feedback loops. A possible solution is to divide the incoming data stream into multiple streams and feed these to parallel encoders. The output of the encoders are multiple streams of variable-length coded data. One problem with this type of approach is how to transmit the data on a single channel. The high speed parallel coder described in U.S. Pat. No. 5,381,145 solves this problem with a method of interleaving these coded data streams.

Many of the contexts used in the present invention are fixed probability, which makes a finite state machine coder, such as the B-coder especially useful. Note when a system using probabilities close to 0.5, both high speed parallel coder disclosed above and the finite state machine coder operate with more efficiency than the Q-coder. Thus, both have a potential compression advantage with the context model of the present invention.

In another embodiment, both a binary entropy coder and a fast m-ary coder are used. The fast m-ary coder may be a Huffman coder.

The Encoding and Decoding Process of the Present Invention

Figure 12:
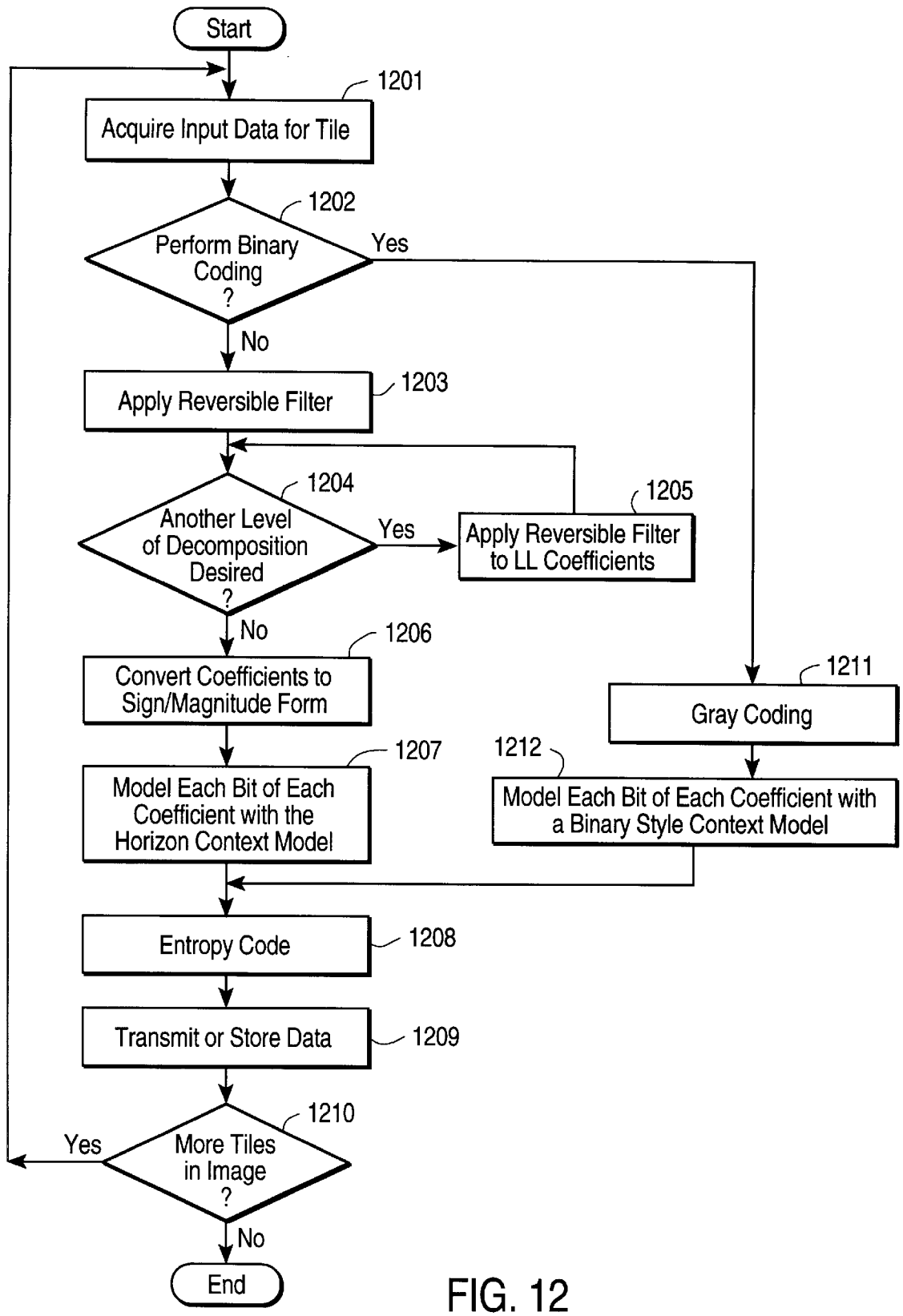
FIG. 12 is a flow chart of one embodiment of the encoding process of the present invention.
Figure 13:
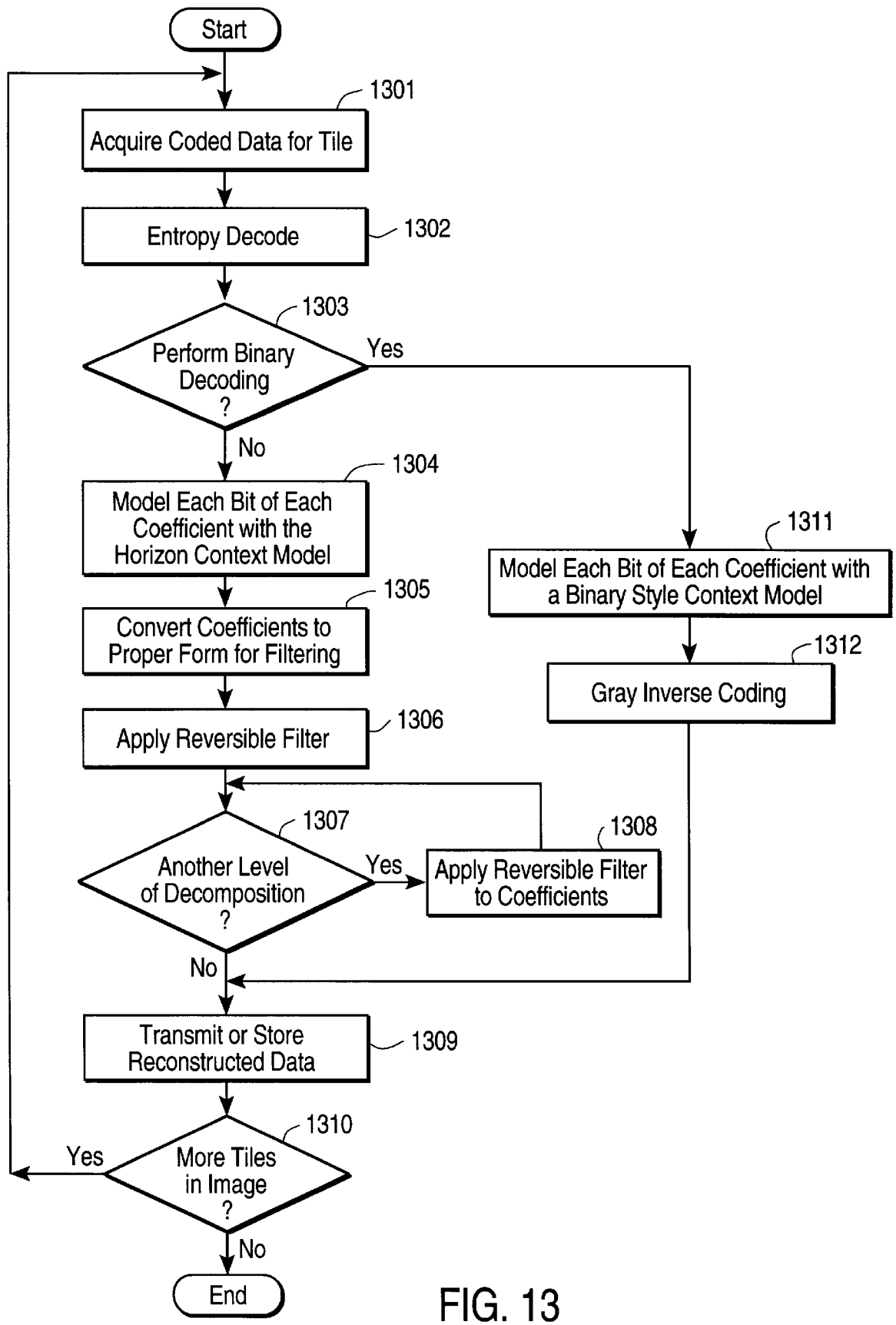
FIG. 13 is a flow chart of one embodiment of the decoding process of the present invention.

The following flow charts, FIGS. 12–14, depict one embodiment of the encoding and decoding processes of the present invention. The processing logic may be implemented in software and/or with hardware. In either case, references have been made to processing logic, which may represent either.

FIG. 12 illustrates one embodiment of the encoding process of the present invention. Referring to FIG. 12, the encoding process begins with processing logic acquiring input data for a tile (processing block 1201).

The processing logic then determines whether binary coding needs to be performed (processing block 1202). If binary coding is to be performed, the process continues to the processing block 1211 where the processing logic performs Gray coding on the input data, and models each bit of each coefficient with a binary style context model (processing block 1212). The processing continues to processing block 1208.

If binary coding is not to be performed, the process continues to processing block 1203 where the processing logic applies a reversible filter to the data. After applying the reversible filter, the processing logic tests whether there is another level of decomposition desired (processing block 1204). If another level decomposition is desired, the processing logic applies the reversible filter to the LL coefficients (processing block 1205) and the processing moves back to a processing block 1204 where the test is repeated. If another level of decomposition is not desired, the process continues to processing block 1206 where the processing logic converts the coefficients to sign-magnitude form. Thereafter, the processing logic models each bit of each coefficient with the horizon context model (processing block 1207), and the process continues to processing block 1208.

At processing block 1208, the processing logic codes each bit of each coefficient. The processing logic then transmits and stores each decoded data (processing block 1209).

The processing logic then tests whether more tiles are used in the image (processing block 1210). If more tiles are in the image, the processing logic looks back to processing block 1201 and the process is repeated; otherwise, the process ends.

FIG. 13 illustrates one embodiment of the decoding process of the present invention. Referring to FIG. 13, the process begins by acquiring coded data for a tile (processing block 1301). Next, the processing logic entropy decodes the decoded data (processing block 1302). The processing logic then tests whether the data is to undergo binary decoding (processing block 1203). If the data is to undergo binary decoding each bits, the process continues to processing block 1311 where the processing logic models each bit of each coefficient with a binary style context model and performs inverse Gray coding on the data (processing block 1312). After the inverse Gray coding, the process continues to processing block 1309.

If binary decoding is not to be performed, and the process continues to processing block 1304 where the processing logic models each bit of each coefficient with the horizon context model. Then, the processing logic converts each coefficient to the proper form for filtering (processing block 1305) and applies a reversible filter to the coefficient (processing block 1306).

After applying the reversible filter, the processing logic tests whether there is another level decomposition (processing block 1307). If there is another level of decomposition, the process continues to processing block 1308 where the processing logic applies a reversible filter to the coefficient and the process loops back at the processing block 1307. If another level of decomposition is not required, then the process continues to processing block 1309 where the reconstructed data is either transmitted or stored.

Next, the processing logic tests whether there are more tiles in the image (processing block 1310). If there are more tiles in the image, the processing loops back to processing block 1301 and then the process is repeated; otherwise the process ends.

Figure 14A:
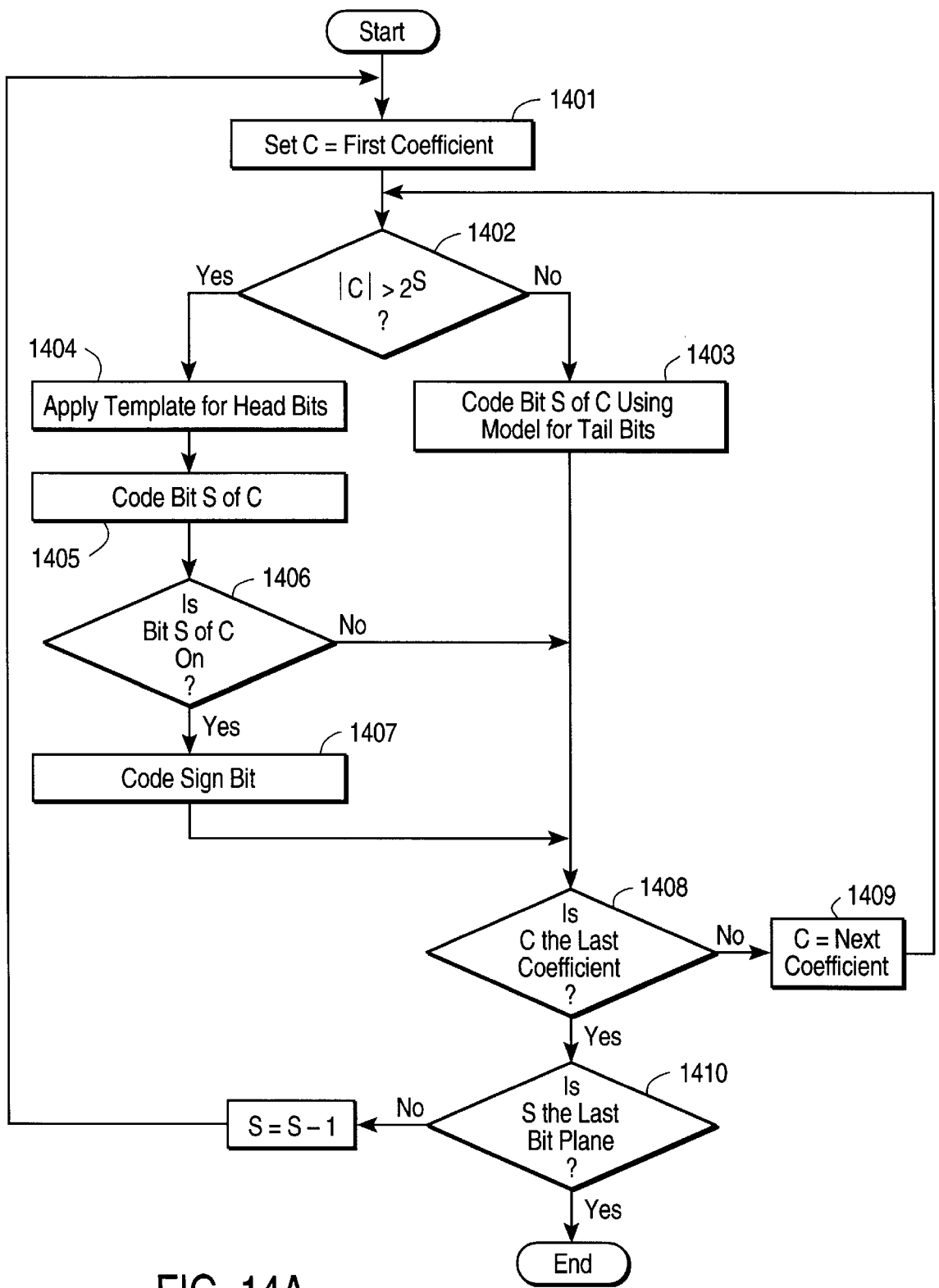
FIG. 14A is a flow chart of the modeling process of the present invention.
Figure 14B:
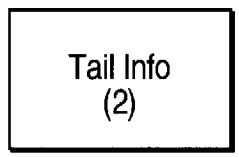
FIG. 14B illustrates one possible template that may be used in the modeling process.

FIG. 14A illustrates one embodiment of the process for modeling bits according to the present invention. Referring to FIG. 14, the process for modeling bits begins by setting a coefficient variable C to the first coefficient (processing block 1401). Then, a test determines if $|c|>2^s$. If yes, processing continues at processing block 1403 where processing logic codes bit S of coefficient C using the model for tail bits and processing continues at processing block 1408. The model for tail bits may be a stationary (nonadaptive) model. If $|c|$ is not greater that $2^s$, then processing continues at processing block 1404 where processing logic applies a template for head bits (i.e., the initial zeros and the first "1" bit). After applying the template, processing logic codes bit S of coefficient C (processing block 1405). Possible templates are shown in FIG. 14B.

Next, a test determines if bit S of coefficient C is on (processing block 1406). If bit S of coefficient C is not on, processing continues at processing block 1408. On the other hand, if bit S of coefficient C is on, processing continues at processing block 1407 where processing logic codes the sign bit. Thereafter, processing continues at processing block 1408.

At processing block 1408, a test determines if coefficient C is the last coefficient. If coefficient C is not the last coefficient, processing continues at processing block 1409 where the coefficient variable C is set to the next coefficient and processing continues at processing block 1402. On the other hand, if coefficient C is the last coefficient, processing continues at processing block 1410 where a test determines if S is the last bitplane. If S is not the last bitplane, bitplane variable S is decremented by 1 (processing block 1411) and processing continues at processing block 1401. If S is the last bitplane, processing ends.

TS Transform Design

In one embodiment, the present invention computes the TS-transform in place in a buffer memory. In doing so, extra lines of memory and the extra time spent rearranging the computed values are not required. Although the TS-transform has been described, the present invention applies to any critically sampled, overlapping transform. In another embodiment, the TT-transform is used.

FIGS. 17A–C illustrate the memory manipulation employed by the present invention in computing the transform of the present invention. FIG. 17A illustrates the initial state of the memory. Referring to FIG. 17A, the first row of memory contains the smooth ("S") and detail ("D") coefficients (already calculated) for the previous value s(n−1), the smooth ("S") coefficient and a partially completed detail coefficient ("B") for the current value (n), as well as four input sample ("X") values ($X_{2n+2}$, $X_{2n+3}$, $X_{2n+4}$, and $X_{2n+5}$). Intermediate results of the transform calculation are shown in the same row of memory in FIG. 17B. Note that the only changes to the row are in the fifth and sixth storage elements in which the values $X_{2n+2}$ and $X_{2n+3}$ are replaced with $S_{n+1}$ and $B_{n+1}$. Thus, by replacing stored values that are no longer necessary with results generated during the transform computation, the present invention saves memory space. FIG. 17C illustrates the same row of memory after the transform has been completed, generating the detail output $D_n$. Note that the only change from FIG. 17B is that the partially completed detail coefficient $b_n$ is replaced by the detail output $D_n$.

After the detail output has been calculated for n, the transform calculation process continues calculating down the row by calculating the detail output $D_{n+1}$.

The following exemplary code may be employed to perform the transforms. Note the horizontal code for the forward and reverse transforms and are included.

In the following, the variable soo refers to the $S^{n-1}$ value; the variable oso refers to the $S^n$ value, and the variable oos refers to the $S^{n+1}$ value.

Exemplary code for an embodiment of the forward TS-transform is as follows:

```
/*
TSForward_1()
*/
void TSForward_1(long *x, int width)
{
        long *start = x;
        long *ox = x + 2;
        long soo;
        long oso;
        long oos;

oso = (*x + *(x + 1)) >> 1;
        oos = (*ox + *(ox + 1)) >> 1;
        soo = oos;

*(x + 1) = *x - *(x + 1);
        *x = oso;

while ((ox + 2) - start < width){ x = ox;
                ox += 2;

soo = oso;
                oso = oos;

oos = (*ox + *(ox + 1)) >> 1;

*(x + 1) = *x - *(x + 1) + ((oos - soo + 2) >> 2);
                *x = oso;
}
```

-continued

```
x = ox;

soo = oso;
oso = oos;

oos - soo;

*(x + 1) = *x - *(x + 1);
*x = oso;

}
```

Exemplary code for an embodiment of the inverse TS-transform is as follows:

```
/*
TSReverse_1()
*/ void TSReverse_1(long *x, int width)
{
    long *start = x;
    long *d = x + 1;
    long ns = *(x + 2);
    long p;

while(x + 2 - start < width) { p = *d - ((*(x + 2) - ns + 2) >> 2);
        ns = *x;

*d = *x - (p >> 1);
        *x += ((p + 1) >> 1);

x += 2;
        d = x + 1;
    } p = *d;
    *d = *x - (p >> 1);
    *x += ((p + 1) >> 1);
```

Although only a one dimensional example has been shown, the present invention may be used on multiple dimensions and multiple levels. Note that this technique may be used for any overlapping transform where there is a one-to-one replacement of a partial or final result over a value that is no longer necessary for any other calculation.

Figure 18:
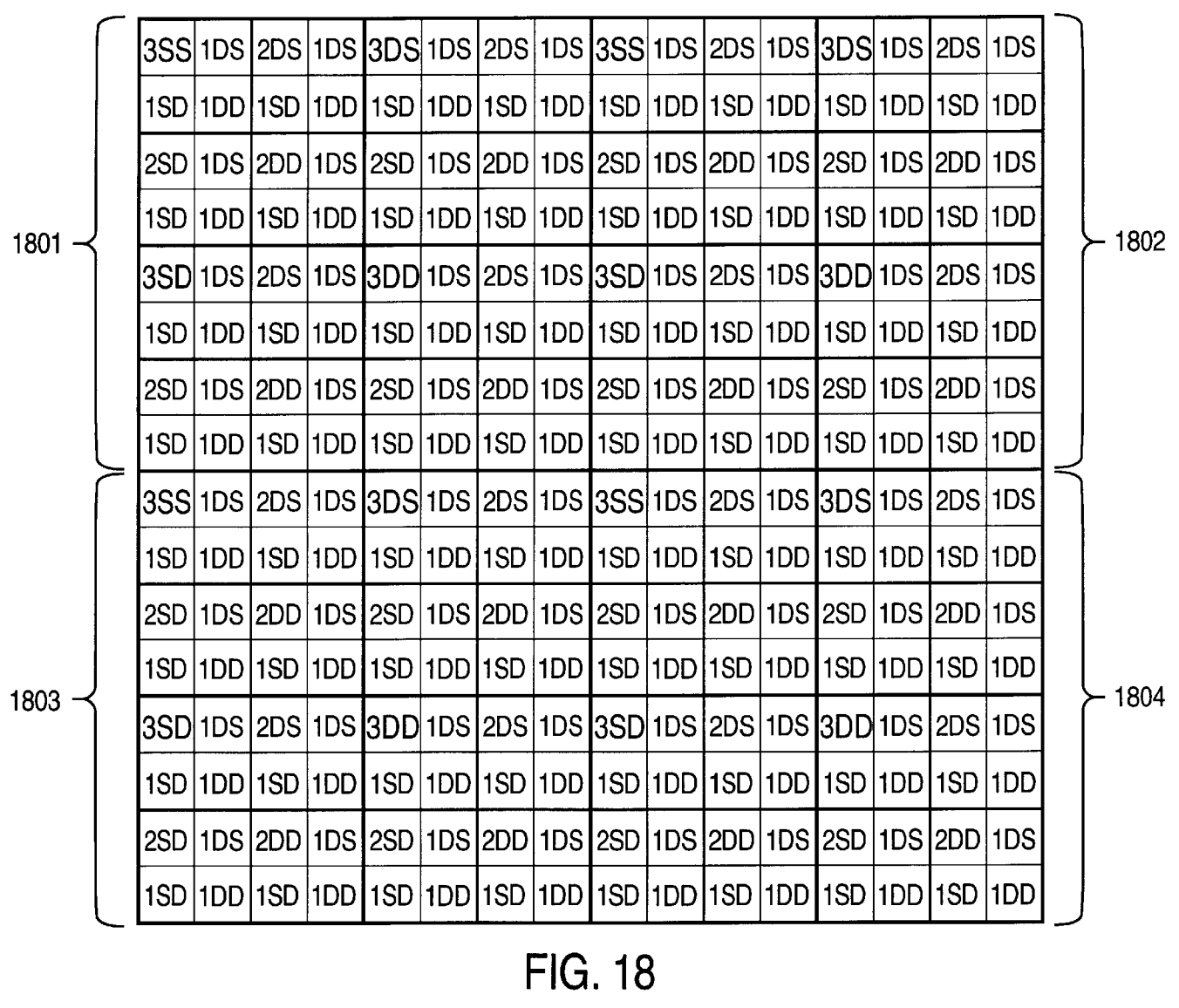

FIG. 18 illustrates a two dimensional representation of the memory buffer for three levels. Referring to FIG. 18, the memory locations in each of blocks 1801–1804 contained coefficient values. That is, each of blocks 1801–1804 is an 8×8 block of coefficient values.

The coefficients are located in a natural power of 2 spacing. Any coefficient is accessible, given the level and the S or D offset. Because of this, access can be made by selecting a particular level and horizontal and vertical frequency. The buffer may be accessed in raster order.

Unit Buffer Implementation

Figure 16A:
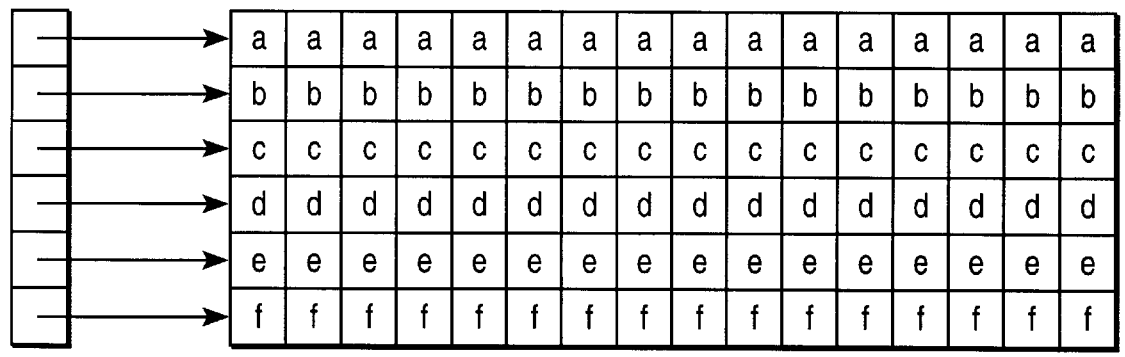
FIGS. 16A and B illustrates the scrolling buffer arrangement of the present invention.

In one embodiment of the present invention, a single buffer supports the transform, context model, and encoding blocks of the compression system. This buffer is a two-dimensional scrolling memory buffer that provides efficient access to coefficients and requires no extra memory. Each line of the buffer is accessed via pointers stored in a line access buffer. FIG. 16A and B illustrates the scrolling buffer arrangement in which the line buffer 1601 contains pointers to each line of buffer 1602.

Figure 16B:
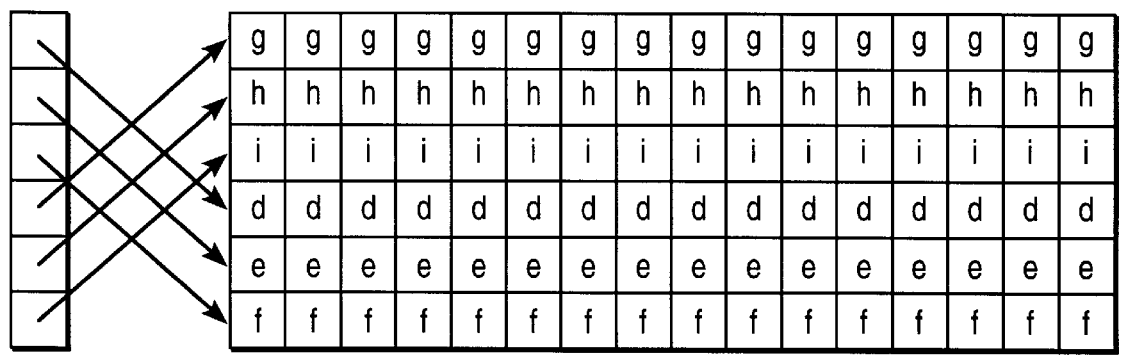

Scrolling is achieved by rearranging the pointer stored in the line access buffer. An example of that is shown in FIGS. 16A and 16B. FIG. 16A illustrates the initial state of the buffer. Referring to FIG. 16B, after lines A, B and C have been removed from the buffer and replaced by lines G, H and I respectively, in order to give the buffer the effect that it is a scrolling buffer, the pointers of the line access buffer are changed such that the first pointer points to line D in the buffer, the second pointer in the line access buffer points to line E, and the third pointer points to line F. Pointers to lines G, H, and I then takes the final three positions in line access buffer. It should be noted that the present invention is not limited to having buffers of six lines. This is only used as an example. A buffer of more lines is typically used and would be well-known to those skilled in the art. Thus, access via the line access buffer gives the appearance that the unit buffer is scrolling without having to physically move memory. This allows the use of minimal memory without sacrificing speed.

Using such a unit buffer in the present invention supports applying an overlapping transform to an entire image while storing in memory only a band of the image at any time. This is achieved by applying the wavelet transform to only as many lines of the image that are necessary to completely compute a set of wavelet coefficients which make up at least one band of wavelet units. In such a case, the completely computed set of wavelet coefficients can be modeled, entropy coded and removed from that portion of the wavelet unit buffer. The partially computed wavelet coefficients remain to be completely computed on the next iteration. The wavelet unit buffer can then be scrolled by rearranging the line pointers and more image data placed in the empty portion of the wavelet unit buffer. The partially completed wavelet coefficients can now be completely computed.

As an example, consider the application of a overlapped transform where the high pass filter is dependent on the current coefficient and the next low pass filter coefficient. For this example, only two levels of wavelet decomposition will be applied to the image data which implies a wavelet unit will be the length of four elements.

In order to completely compute a set of wavelet coefficients which comprise at least one band of wavelet units, the height of the wavelet unit buffer is at least eight lines or two wavelet units.

In performing the wavelet transform on the two dimensional wavelet unit buffer, the one dimensional wavelet transform is first applied to each row (line) of the buffer. Then the one dimensional wavelet transform is applied to each column of the buffer.

When applying the one dimensional wavelet transform to each column of the wavelet unit buffer, only a partial computation of the high pass filter can be completed for the last element of each column which is dependent on elements of the image that are not stored in the unit buffer. This is shown in FIG. 32A.

In performing a second level wavelet decomposition, again only a partial computation of the high pass filter can be completed for the last element of each column. This is shown in FIG. 32B.

Note that in one embodiment, when using multiple decomposition levels, the wavelet transform may be only applied to the SS coefficients (1SS in FIG. 32A for the second decomposition level and 2SS in FIG. 32B for the third decomposition level). In such a case, locations in both rows and columns in the unit buffer may be skipped to ensure the proper buffer entry is being read or written.

In this example, the top half of the buffer contains a set of completely computed wavelet coefficients comprise one band of wavelet units and can be passed on to be modeled, entropy coded, and removed from the buffer.

With the top half of the buffer empty, the buffer can now be scrolled by half the height of the buffer. Now, the next four lines of the image can be read into the buffer. The one dimensional wavelet transform can be applied to each of the new lines stored in the buffer. Along the columns of the buffer, the partially computed coefficients can be completely computed and again the last elements of each column are only partially computed.

The same is done for the second level of wavelet decomposition. Again, the top half of the buffer contains a set of completely computed wavelet coefficients at which point the process iterates until there are no more lines of the image to process.

Rearranging the line pointers in the line access buffer can be performed in a number of ways. One way is to create a new line access buffer and copy the pointers from the old line access buffer to the new line access buffer. A line pointer stored in element i of the old line access buffer would be copied to index i plus the number of lines to scroll modulo the height of the wavelet unit buffer.

It should be noted that in such an arrangement coefficients are typically ordered differently since all three stages of the compression system are performed on the data in the buffer before the data is cleared from the buffer. Thus, in a case where raster order data manipulation is performed, the scrolling buffer of the present invention allows for minimal memory.

Software (and/or hardware) manages the line access buffer to manipulate the pointers. This software also is aware of what data in the buffer has been completely processed and is ready to be cleared from the buffer.

Alignment Strategies

The present invention shifts coefficients values to the left by some arbitrary amount. In one embodiment, this alignment is performed using a virtual alignment method. The virtual alignment method does not actually shift the coefficients. Instead, while processing the coefficients bitplane by bit-plane, the actual bitplane that is needed for alignment for the particular coefficient is calculated. Given the importance level and the amount of shift to be applied to a particular coefficient, the present invention accesses the desired absolute bit plane of the coefficient if it is in the range of possible bitplanes. That is, the desired absolute bit plane of a particular coefficient is given by the current importance level minus the amount of shift to be applied to that coefficient. The desired bit plane is considered valid if it is greater than or equal to the minimum valid absolute bit plane and less than or equal to the maximum valid absolute bit plane.

Figure 29A:
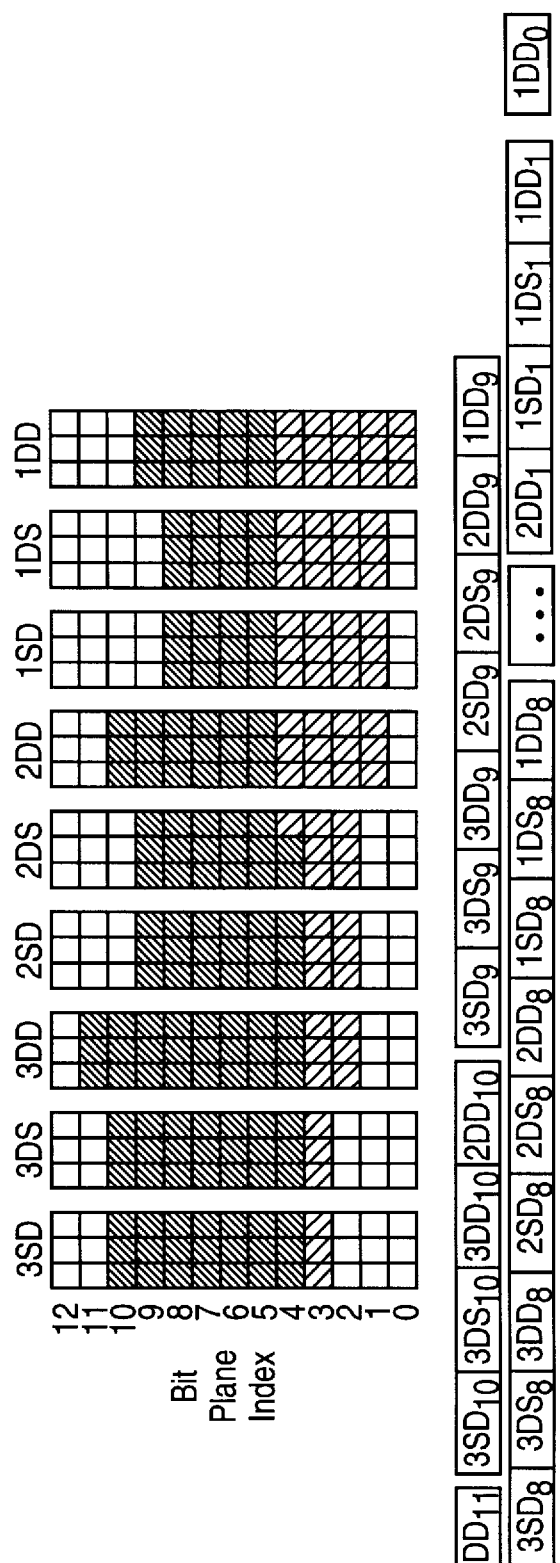
FIG. 29A illustrates an MSE alignment scheme.

Two alignment strategies are common. The first strategy, called Mean Square Error (MSE) alignment, is to align the coefficients such that the MSE is reduced or minimized when comparing the full-frame reconstructed image to the original. FIG. 29A is an example of this alignment. See also FIG. 8B.

Figure 29B:
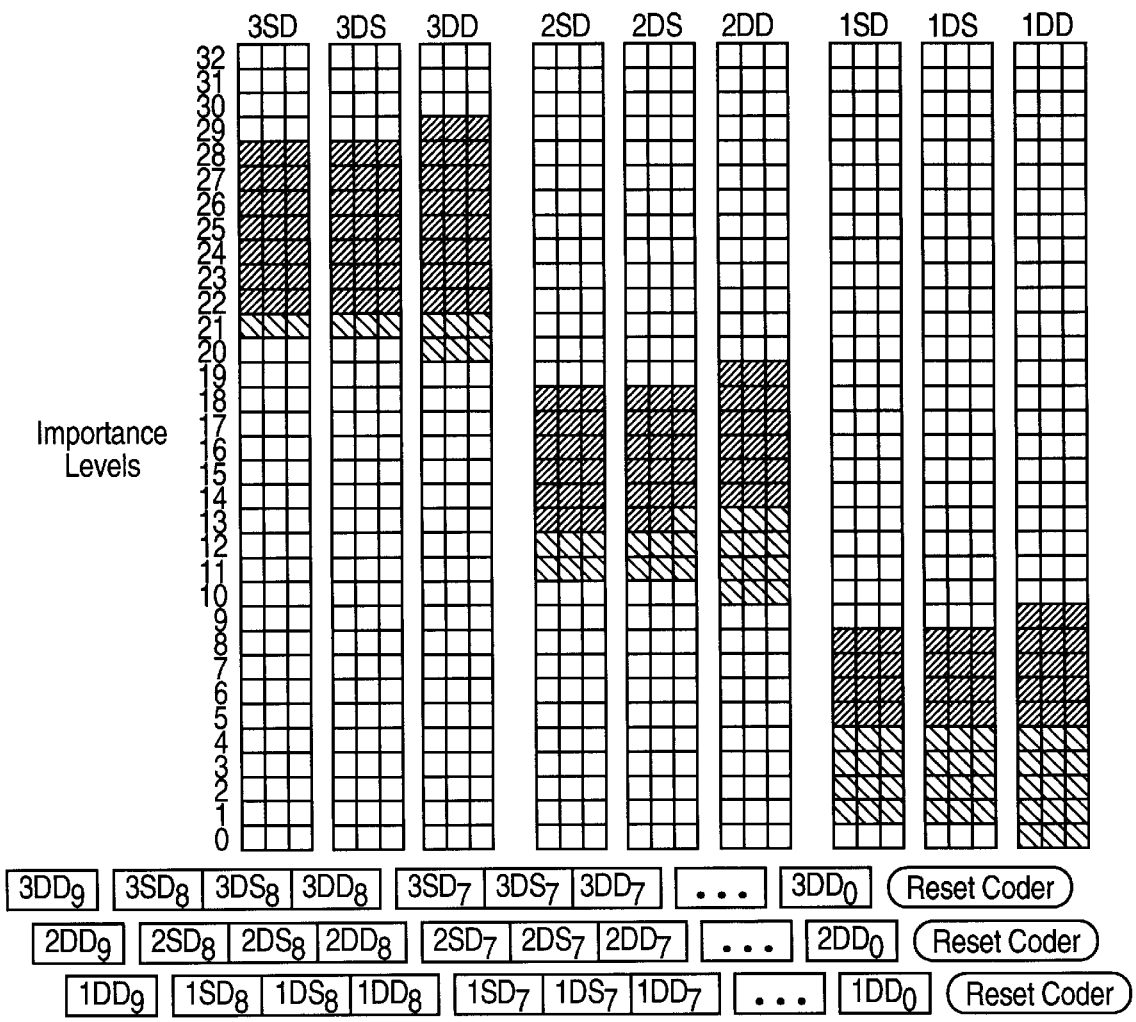
FIG. 29B illustrates a pyramidal alignment scheme.

The second strategy, the pyramidal form of alignment, offers good rate-distortion performance for an image reconstructed to the size of a pyramidal level. Here the coefficients at adjacent levels have no importance levels in common, e.g., there is no overlap. The alignment on the left of FIG. 29B shows strictly pyramidal alignment for a three level TS-transform. The right side of FIG. 29B shows pyramidal alignment at level 2. (The strictly pyramidal part of FIG. 29B could be called pyramidal alignment at level 3 and level 2.) In each case, the coefficients within a level are aligned with respect to MSE.

Figure 29C:
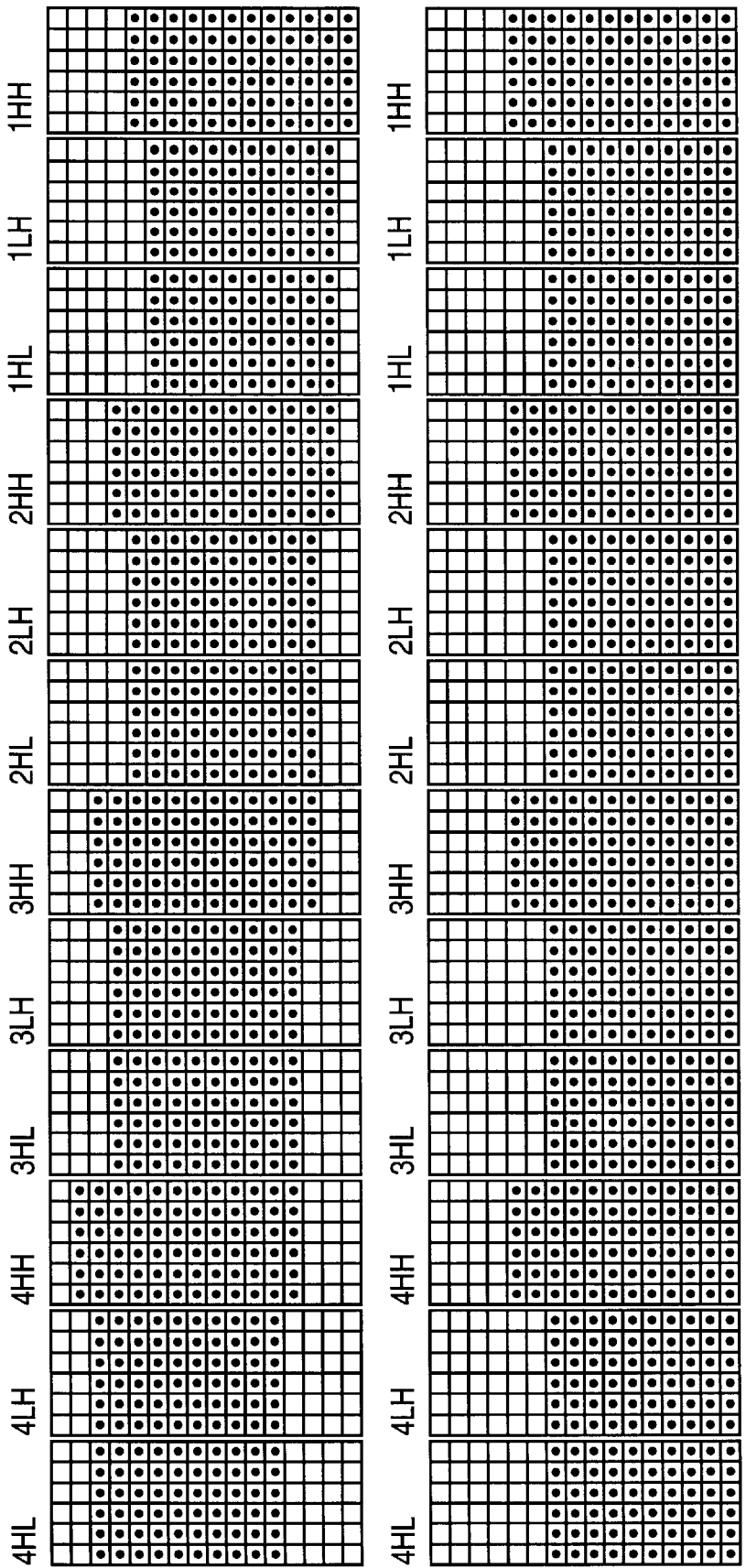
FIG. 29C illustrates an exemplary relationship between the memory storing coefficients and one alignment.

FIG. 29C illustrates an exemplary relationship between the memory storing coefficients and one alignment.

By using the present invention, memory size restrictions are removed because no actual shifting needs to be performed. Furthermore, the present invention does not require additional memory and allows simple implementation of arbitrary alignment strategies.

Histogram Compaction

The present invention may employ histogram compaction. In one embodiment, the histogram compaction is used prior to undergoing transform or binary style. Histogram compaction offers better compression for some images. Such images usually are those in which some values of the dynamic range are not used by any pixels. In other words, there are gaps in the image range. For instance, if an image can take only two values 0 and 255 out of a total of 256 values, then it is possible to create a new image with a one-to-one correspondence to the original image, but with a much smaller range. This is accomplished by defining an increasing function which maps the integers to the values that the image takes. For example, if the image uses only values 0 and 255, the mapping maps 0 to 0 and 1 to 255. In another embodiment, if the image only has even (or odd) pixels, the pixel values can be remapped to values of 0 to 128.

After the compaction is performed, the image data may then undergo compression by reversible embedded wavelets of the present invention. Thus, the compaction is used in a pre-processing mode. In one embodiment, the histogram is based on the Boolean histogram, such that the histogram maintains a list of values that occur or not. First, all the occurring numbers are listed in increasing order. Then each value is mapped to the order starting at zero.

In one embodiment, guard pixel values are used to reduce the effect of errors. Because adjacent remapped pixel values may correspond to actual pixel values which are separated by a large gap, a small error in a remapped value can cause a large error in actual values. By adding extra values around the remapped values, the effect of such errors may be reduced.

In order to reconstruct the original image, any mapping used is signaled to the decoder. The mapping may be signaled in the header. This allows a similar table to be constructed at the decoder for post-processing. In one embodiment, the decoder is signaled for each tile of the range. In one embodiment, the present invention first signals that this mapping is occurring and then signals the number of missing values (e.g., 254 in the example above). The cost of signaling whether or not compaction is used is only 1 bit. This bit could be followed by a table of all the remapped values.

In one embodiment, to reduce the amount of signaling when performing histogram compaction on a tile-by-tile basis, a bit signals whether the new Boolean histogram is the same or different than the last Boolean histogram used. In such a case, the new Boolean histogram is signaled to the decoder if (and only if) the new Boolean histogram is different from the last histogram. Even when the new Boolean histogram is different from the old one, there are usually similarities. If fact, the exclusive-OR of the two histograms is more compressible by the entropy coder, and, thus, may be generated and signaled to the decoder.

The histogram can be signaled by sending as many bits as the dynamic range of the size (e.g., 256 for an 8-bit deep range). The order of the bits in sequence corresponds to the pixel value. In this case, a bit is 1 if the corresponding value is used in the image. In order to reduce or minimize the header cost, this sequence may be binary entropy coded under a first order Markov context model.

In another embodiment, if the missing values are the majority, the occurring values can be listed in order; otherwise, the missing values are listed in order.

In one embodiment, the binary style of the present invention can be used to compress palletized images. The pallet can be stored in the header. However, palletized images cannot be embedded and quantization for lossy decompression does not give reasonable results. In another embodiment, palletized images may be converted to continuous-tone (color or grayscale) images and each component may be compressed with transform style or binary style. This allows reasonable lossy decompression.

Some images are continuous-tone with one specified color (of a small subset of specified colors) used for a special purpose. The special purpose color(s) might be for annotation. For example, a grayscale medical image might have color computer generated text identifying the image. Another special purpose color might indicate that a pixel is transparent in an overlay image, so a pixel from an image underneath should be displayed instead. Forbidden color(s) can be separated into a different component image. The continuous-tone component(s) and the component for the special color(s) can then be compressed/decompressed with transform style or binary style.

It should be noted that while transform style and binary style are often used for intensity data, other type of two dimensional data, such as an alpha channel for alpha blending can be used.

Parser

The present invention allows a codestream to be parsed without decompression before transmission or decoding. This is performed by a parser that is able to truncate the bit stream, transmitting only the amount of information necessary for a particular quantization. To assist the parser, markers and pointers determine the location of each bitplane of a coding unit within the bit stream.

The present invention provides device-dependent quantization implemented via parsing in an image compression system. The use of markers in the compression system allows device-selective quantization after encoding. An output device reports its characteristics to the parser which quantizes the already-encoded file for the specific device. This quantization operates by leaving out part of the file. Use of a reversible wavelet transform allows the image to be recovered without loss or with a variety of perceptually lossless distortions depending on the device.

Figure 21:
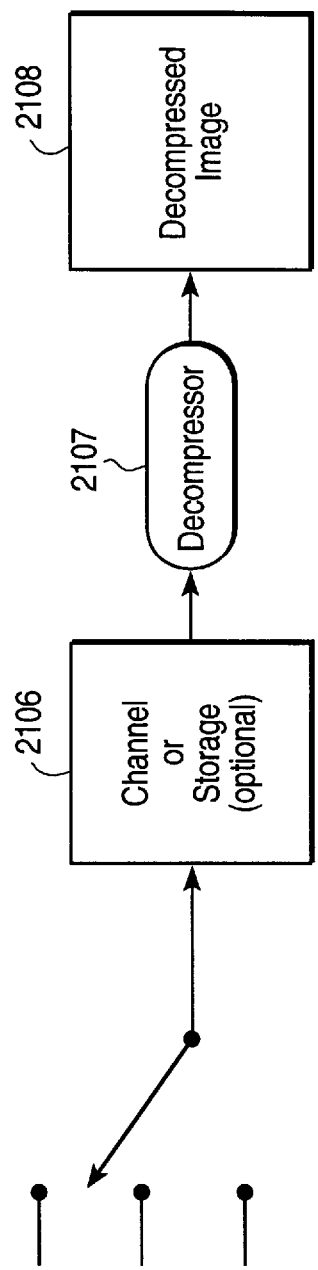

The present invention allows quantization to be performed after encoding. FIGS. 21A and B is a block diagram of a compression system with a parser. Referring to FIGS. 21A and B, an originally uncompressed image 2101 is input into a compressor 2102 of the present invention. Compressor 2101 compresses image 2101 losslessly into a compressed bit stream 2103 and provides markers in compressed bit stream 2103.

The compressed bit stream 2103 is input into parser 2104 which provides some portion of the compressed bit stream 2103 as an output. The portion may include all of compressed bit stream 2103 or only a part of it. The requesting agent or device provides its device characteristics to parser 2104 when a decompressed image is needed. In response, parser 2104 selects the appropriate portions of compressed bit stream 2104 for transmission. Parser 2104 does not perform pixel or coefficient level computation or entropy coding/decoding. In alternate embodiments, parser 2104 may perform such functions to some degree.

Parser 2104 is capable of providing coded data for display an image on a monitor by selecting compressed coefficients for low resolution. For a different request, parser 2104 selects compressed data to allow lossless decompression of a region of interest (ROI). In one embodiment, in response to a request, parser 2104 sends the bits necessary to transition from a preview image to a printer resolution image or a full size medical monitor image (perhaps with 16 bit deep pixels).

The data provided by parser 2104 is output to a channel and/or storage 2106. A decompressor 2107 accesses the data and decompresses the compressed data. The decompressed, or reconstructed data, is output as decompressed image 2108.

Figure 23:
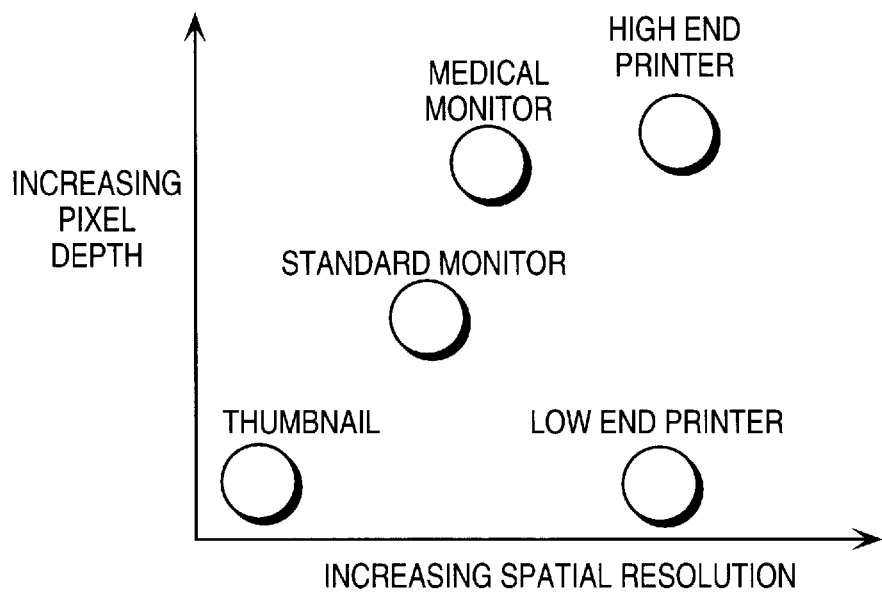
FIG. 23 illustrates applications defined in terms of pixel depth and spatial resolution.

In FIG. 22, a bit plane in the 2HH frequency band is encoded using information from the 3HH frequency band. FIG. 22 has been redrawn in FIG. 29 to illustrate the bitplanes more clearly. If the coefficients are stored as in FIG. 29A (MSE), then truncation of the compressed bitstream almost identical to MSE rate-distortion optimal quantization. This truncation is illustrated by the marker shading in FIG. 29A. Examining FIG. 23, this order may be good for a printer, but perhaps not ideal for a monitor. If the coefficients are stored "pyramidally" as shown in FIG. 29B, i.e., all the bits for a frequency band first, then truncation of the bit stream provides different resolution images.

A strategic use of markers would allow both types of truncation, producing lower resolution, lower fedility images. The change in shading in FIG. 29 demonstrates a truncation of the compressed bit stream which would produce a bit stream lower fedility image at full resolution. Further truncation of all of the LH, HL and HH coefficients would lower the resolution of the image.

In many image compression applications an image is compressed once, but may be decompressed several times. Unfortunately, with most compression systems, the amount of loss allowed and the correct quantization must be determined at the time of encoding. While progressive systems will allow one set of successively refined images, a lossless reconstruction is typically not possible, or is provided by sending a "difference image" encoded in a lossless manner unrelated to the progressive build-up.

In the present invention, the encoder saves enough information to separate the different coefficients into frequency and bitplane pieces. In one embodiment, markers are placed in the bitstream to signal what the next unit of entropy coded data contains. For example, a marker may indicate that the next unit of entropy coded data contains HH frequency information for the third most significant bitplane.

If someone wishes to examine the image on a monitor, they can request the information necessary to create a grayscale image of low resolution. If the user wishes to print the image, a request can be made for the information necessary to create a high resolution binary image. Finally, if the user wishes to run compression experiments or perform a statistical analysis of sensor noise, or a medical diagnosis, then a lossless version of the image can be requested.

Figure 24:
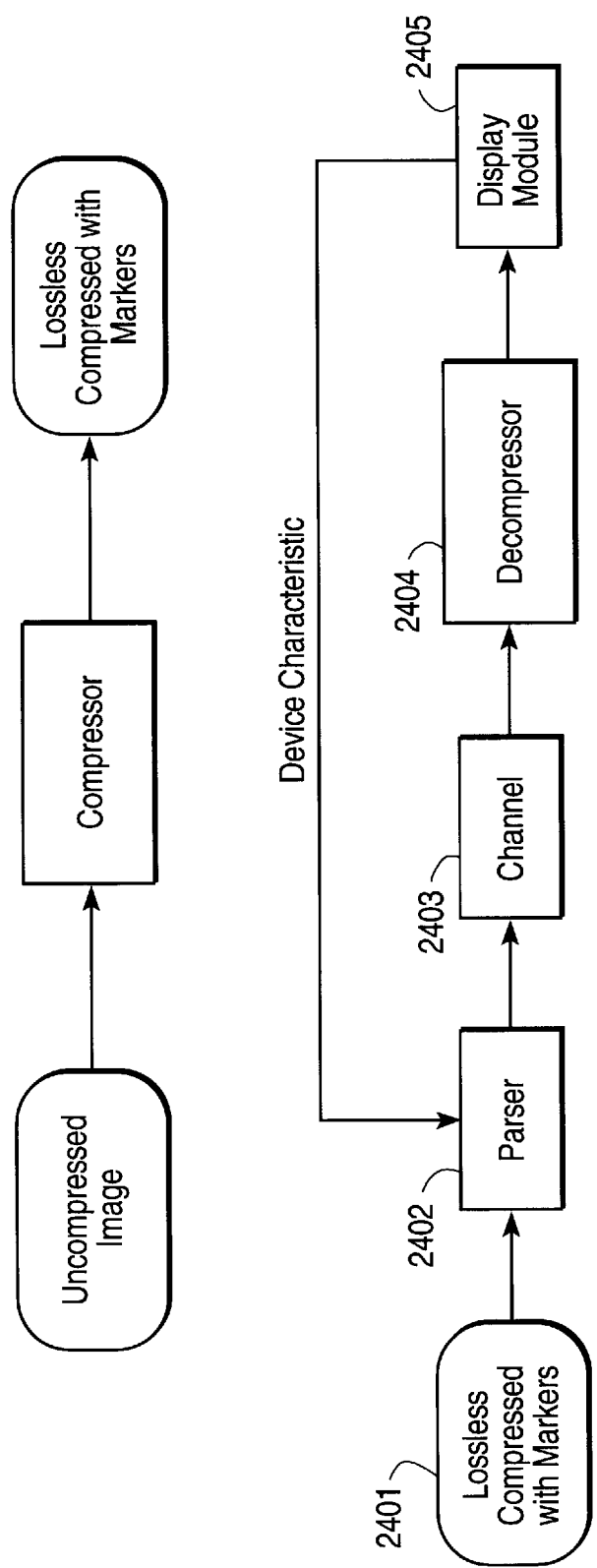
FIG. 24 is a block diagram of one embodiment of a parser, a decoder and their interaction with an output device.

FIG. 24 is a diagram of the parser, decoder and the interaction with an output device. Referring to FIG. 24, the parser 2402 is coupled to receive the lossless compressed data with markers, as well as the device characteristics of one or more output devices, such as, for example, the display module 2405 shown. Based on the device characteristics, parser 2402 selects the correct portion of the compressed data and sends it to channel 2403, which transfers the data to a decompressor 2404. Decompressor 2404 decodes the data and provides the decoded data to display module 2405.

The present invention provides a data stream with improved support for World-Wide-Web and other image servers. One portion of the data stream can support low spatial resolution, high pixel depth images for monitors. Another portion can support high spatial resolution, low pixel depth printers. The entire data stream provides lossless transmission. Since all these usages are supported by the same compressed data stream, if a browser requests a monitor image, a print image and a lossless image in sequence, no redundant data need to be transmitted. Information transmitted for the monitor image that is required for the print image can be reused for the print image. Information transmitted for the monitor image and the print image can be reused for the lossless image. The present invention reduces transmission time (transmission cost) for browsing and also minimizes the amount of data that must be stored in the server.

In the system of the present invention, the images are compressed only once, but several markers are stored to indicate what the data means. A World Wide Web (WEB) server could then receive a request for display and provide the needed coefficients. The WEB server does not need to do any compression or decompression whatsoever; it simply selects the correct pieces of the bitstream to deliver.

This quantization by parsing system provides an effective increase in bandwidth even without the high lossless compression provided by the reversible wavelets and context model. The parsing system can also be used to select regions of interest for higher quality.

Figure 25:
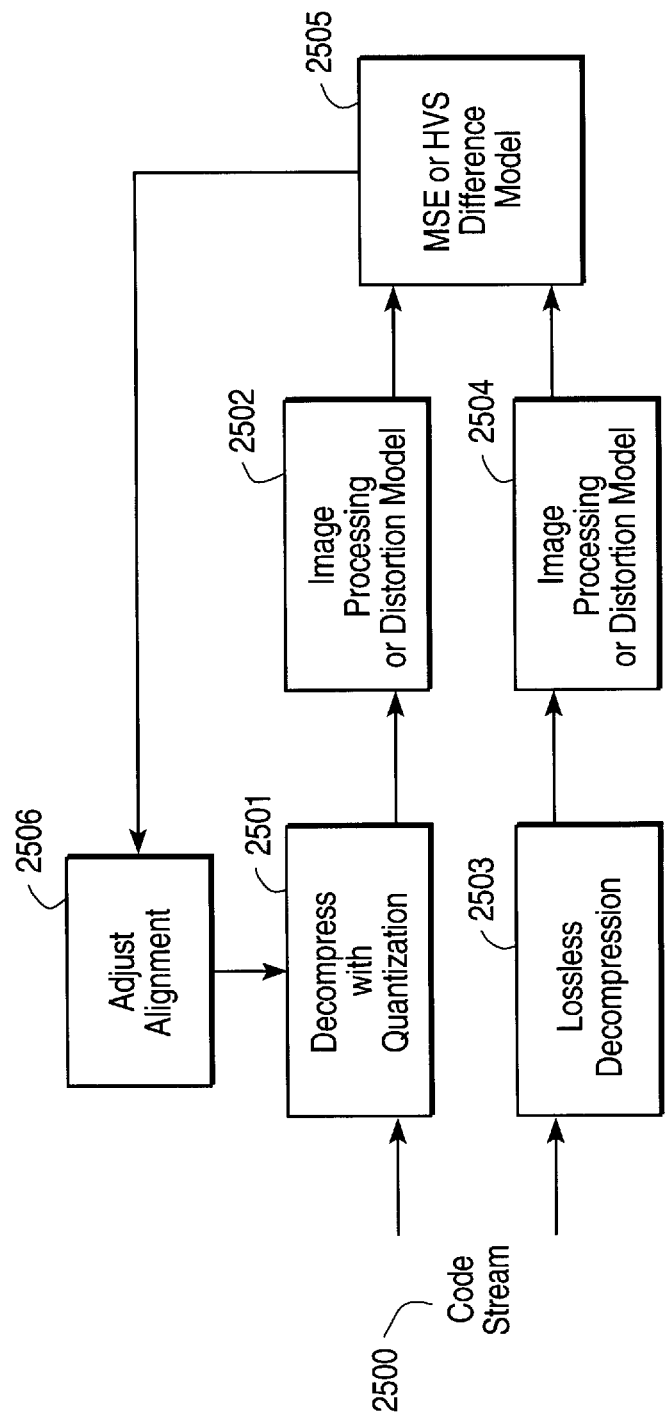
FIG. 25 illustrates one embodiment of a quantization selection apparatus.

FIG. 25 illustrates a quantization selection apparatus. In one embodiment, this selection apparatus is implemented in software to determine good quantization profiles for various devices. A set of images is transformed and quantized by throwing away bitplanes of various frequency bands. Then the inverse wavelet transform is performed. This reconstructed image is processed in some manner consistent with the display. For a high resolution image display on a monitor, the operation will be some sort of scaling. For a printer, the operation might be some sort of thresholding or dithering. The same process is applied to the original image and compared with the compressed image. Mean square error has been used as an example, although any perceptual difference measure could be used. The error for quantizing different bit planes is used to select the bitplane to quantize which leads to the lowest distortion for the savings in bit rate. The process can be continued until a desired bit rate or distortion is reached. Once typical quantizations have been determined for various image processing operations, it is unnecessary to simulate the quantization and typical values can be used.

Of course, for simple image processing operations like scaling, it is possible to analytically determine the effect of quantization of the various frequency band. For other operations like dithering, or contrast masking, it is much easier to find approximately optimal quantizations via simulation.

Referring to FIG. 25, codestream 2501 undergoes decompression with quantization 2501 and lossless decompression 2503. Image processing or distortion models 2502 and 2504 are applied to the decompression outputs. The outputs are images and are subjected to a difference model, such as an MSE or HV5 difference model. Based on the results of the difference determination, the alignment, and thus the quantization, is adjusted.

To facilitate the parsing, the present invention uses signaling in a series of headers. In one embodiment, the codestream structure of the present invention includes a main header having one or more tag values. The tags in the main header signal information, such as the number of components, subsampling, and alignment, used for every tile in the codestream. In one embodiment, each tile in the codestream is preceded by its header. The information in the tile header applies only to that particular tile, and may override the information in the main header.

Each of the headers comprises one or more tags. In one embodiment, there are no in-line markers. The header tag indicates how much compressed data from a known point to where you reset the coder. In one embodiment, every tag is a multiple of 16 bits. Therefore, every main header and tile header is a multiple of 16 bits. Note that every tag may be a multiple of a number of bits other than 16. Every tile data segment is padded with the appropriate number of zeros to make a multiple of 16 bits.

In one embodiment, each tile header may indicate its tile size. In an alternative embodiment, each tile may indicate when the following tile starts. Note that if backtracking through the codestream is possible, encoding may be made simpler by placing all such information in the main header. The parser is able to use the information about the codestream to perform its quantization.

In one embodiment, the tile header may indicate whether the tile has been coded with wavelet style or binary style. An importance level indicator associates the importance level(s) within the data in the tile. The importance level locator signals potential truncation locations. For instance, if the same distortion with respect to each tile is desired, knowing which importance level(s) is equal to the desired level of distortion can allow the parser to truncate the codestream at the right location. In one embodiment, each tile has substantially the same distortion, rather than the same number of bits.

By having importance level locator tags, the present invention allows for having multiple tiles and an indication as to where to terminate in each one.

Tag and Pointers

Markers for parsing and other information used in decoding or parsing may be contained in tags. In one embodiment, the headers supply control information using tags obeying the following rules:

Tags can be fixed-size or variable-size. A tag can vary in length due to the number of components, the number of tiles, the number of levels, or the number of resets or information desired.

If images are parsed and quantized, their tags are altered to represent the new image characteristics.

Reset points in the data stream are padded with zeros to make a multiple of 8 bits. The entropy coder can be reset at certain points in the codestream; the points are decided at encode-time (but can only occur at the end of encoding an importance level). This reset means that all the state information in the entropy coder (context and probabilities) are reset to a known initial state. The codestream is then padded with zeros to the next multiple of 8 bits.

The parser uses only the codestream tags as guidance in quantizing the image. In one embodiment, the following tags are used for this quantization process: the tile length, component length, resets, bits versus importance levels, and importance level locators.

After an image has been quantized by a parser, all the tags are revised to reflect the new codestream. Typically this affects image and tile size, number of components, the span of the component, all the lengths and pointers, and so on. In addition, an informational tag is included that describes how the image was quantized.

Table 3 lists all the tags in one embodiment of the present invention. The descriptions and terminology are often different from JPEG, but the same markers and identifiers are used when possible. Every codestream has at least two headers: the main header at the beginning of the image and a tile header at the beginning of each tile. (Every codestream contains at least one tile.)

Three kinds of tags are also used: delimiting, functional, and informational tags. Delimiting tags are used to frame the headers and the data. Functional tags are used to describe the coding functions used. Informational tags provide optional information about the data.

TABLE 3

List of tags in CREW

| | Name | Code | Main | Tile |
|---|---|---|---|---|
| Delimiting Tags | | | | |
| Start of image (JPEG SOI, magic number) | SOI | 0xffd8 | required | X |
| Start of CREW (CREW magic number) | SOC | 0xff4f | required | X |
| Start of tile (similar to JPEG SOF) | SOT | 0xff50 | X | required |
| Start of scan (JPEG SOS) | SOS | 0xffda | X | required |
| End of image (JPEG EOI) | EOI | 0xffd9 | required | X |
| Functional tags | | | | |
| Image and tile size | SIZ | 0xff51 | required | X |
| Coding style | COD | 0xff52 | required | optional |
| Component alignment | ALG | 0xff53 | required | optional |
| Tile lengths, main header | TLM | 0xff54 | required | X |
| Tile lengths, tile header | TLT | 0xff55 | X | required |
| Component pointers | CPT | 0xff56 | X | required |
| Importance level reset | IRS | 0xff57 | X | optional |
| Informational tags | | | | |
| Version | VER | 0xff60 | optional | X |
| Bits versus importance levels | BVI | 0xff61 | optional | X |
| Importance level locator | ILL | 0xff62 | X | optional |
| Resolution | RXY | 0xff63 | optional | X |
| Comment | CMT | 0xff64 | optional | optional |
| Quantized codestream | QCS | 0xff65 | X | optional |

Note that "x" means this tag is not used in this header. Either the TLM tag in the header or a TLT tag in each tile is required but not both. Component pointers are only necessary if there is more than one component.

FIG. 26A shows the location of the delimiting tags in the codestream of the present invention. Each codestream has only one SOI tag, one SOC tag, and one EOI tag (and at least one tile). Each tile has one SOT and one SOS tag. Each delimiting tag is 16 bits and contains no length information.

The SOI tag indicates the beginning of a JPEG file. It is the 16 bit JPEG magic number.

The SOC tag indicates the beginning of a file and immediately follows the SOI tag. Together the SOI and SOC tags comprise 32 bits that form a unique number.

The SOT tag indicates the beginning of a tile. There is at least one tile in a codestream. The SOT acts as a check to ensure that the stream is still synchronized.

The SOS tag indicates the beginning of "scan," followed by the actual image data for the tile. SOS indicates the end of a tile header, and there must be at least one SOS in a CREW codestream. Data between an SOS and the next SOT or EOI (end of image) is a multiple of 16 bits, and the codestream is padded with zeros as needed.

The EOI tag indicates the end of the image. The EOI acts as a check to ensure that the stream is still synchronized. There is at least one EOI in a codestream.

These functional tags describe the functions used to code the entire tile or image. Some of these tags are used in the main header but can be overridden in the coding for an individual tile by using the same tag with different values.

The SIZ tag defines the width and height of the image grid, the width and height of the tiles, the number of components, color space conversion (if any), size (pixel depth) of the each component, and how the components span the reference grid. This tag appears in the main header only and not in the tile header. Each tile has all of the components present with the same characteristics. Because many of the parameters defined here are used for other tags, the SIZ tag should immediately follow the SOC tag. The length of this tag, captured in Lsiz as the first field after SIZ, depends on the number of components. FIG. 26B illustrates the image and tile size syntax of the SIZ tag.

The following is an explanatory list of the size and values for each element.

SIZ: Marker.

Lsiz: Length of tag in bytes, not including the marker (must be even).

Xsiz: Width of the image reference grid. (Same as image width for images with one component or with color components using common subsampling.)

Ysiz: Height of the image reference grid. (Same as image height for images with one component or with color components using common subsampling.)

XTsiz: Width of one tile image reference grid. The tile must be wide enough to have one sample of every component. The number of tiles in the image width is equal to $\lceil xsiz/XTsiz \rceil$.

YTsiz: Height of one tile image reference grid. The tile must be high enough to have one sample of every component. The number of tiles in the image width is equal to $\lceil Ysiz/YTsiz \rceil$.

Csiz: Number of components in the image.

CSsiz: Type of color space conversion (if any). This tag is not comprehensive. (Many multi-component space conversions cannot be specified here; they need to be signaled elsewhere, not within the file format of the present invention.) Table 4 shows the values for color space conversions.

TABLE 4

Color space conversion style for the CSsiz parameter

| Value | Color space conversion |
|---|---|
| 0 | none or specified elsewhere |
| 1 | RICOH lossless |
| 2–255 | reserved |

The subsampling described in this tag applies to images for which the full resolution is not available for each component. The system of the present invention has other methods for reducing the size of less important components when the full resolution is available.

Ssizi: The precision (pixel depth) of the ith component. This parameter, XRsiz, and YRsiz are repeated for all components.

XRsizi: The extent in the X dimension of the ith component. For example, the number 2 means that this component contributes to 2 horizontal reference grid points. This parameter, Ssiz, and YRsiz are repeated for all components.

YRsizi: The extent in the Y dimension of the ith component. For example, the number 2 means that this component contributes to 2 vertical reference grid points. This parameter, Ssiz, and XRsiz are repeated for all components.

res: A filler byte of zeros that is placed at the end, if needed.

TABLE 5

Image and tile size values

| Parameter | Size (bits) | Values |
|---|---|---|
| SIZ | 16 | 0xff51 |
| Lsiz | 16 | 24–65534 |
| Xsiz | 32 | 1–(232–1) |
| Ysiz | 32 | 1–(232–1) |
| XTsiz | 32 | 1–(232–1) |
| YTsiz | 32 | 1–(232–1) |
| Csiz | 8 | 1–255 |
| CSsiz | 8 | use Table 4 |
| Ssizi | 8 | 1–255 |
| XRsizi | 8 | 1–255 |
| YRsizi | 8 | 1–255 |
| res | 8 | 0 (if necessary) |

The COD tag describes the coding style used on the image or tile, including binary versus wavelet style, transform filters, and entropy coders. This tag is included in the main header and may also be used in the tile header. The length of this tag depends on the number of components. FIG. 26C illustrates the coding style syntax. Table 6 shows the size and values for coding styles.

TABLE 6

Coding style values

| Parameter | Size (bits) | Values |
|---|---|---|
| COD | 16 | 0xff52 |
| Lcod | 16 | 4–258 |
| Ccod$^i$ | 8 | use Table 7 |
| res | 8 | 0 (if necessary) |

COD: Marker.
Lcod: Length of tag in bytes, not including the marker (must be even).
Ccodi: Coding style for each component.
res: A filler byte of zeros that is placed at the end, as needed.

TABLE 7

Coding style values for the Ccod parameter

| Value | Coding style |
|---|---|
| 0 | TS-transform, FSM-coder |
| 1 | Binary, FSM-coder |
| 2–255 | reserved |

For each component, the ALG tag describes the number of pyramid levels and alignment of the coefficients. The ALG is used in the main header and may also be used in tile headers. The length of this tag depends on the number of components and, possibly, the number of levels. FIG. 26D illustrates one embodiment of the component alignment syntax of the present invention. Referring to FIG. 26D, the following components are included:

ALG: This marker indicates the size and values for component alignment parameters.

TABLE 8

Component alignment values

| Parameter | Size (bits) | Values |
|---|---|---|
| ALG | 16 | 0xff53 |
| Lalg | 16 | 4–65535 |
| Palgi | 8 | 1–255 |
| Aalgi | 8 | use Table 9 |
| Talgi | 8 | use Table 10 |
| Salgij | 8 or 16 | (0–255) or (0–65535) |
| res | 8 | 0 (if necessary) |

Lalg: Length of tag in bytes, not including the marker (the length is even).

Palg$^i$: Number of pyramidal levels of decomposition for the ith component. This parameter, Aalg, and possibly Salg are repeated as a record for each component.

Aalg$^i$: Alignment of the ith component. This table entry defines the alignment of the coefficients and is repeated for every component. Aalg$^i$, Table 9 shows the values for the Aalg parameters.

TABLE 9

Alignment values for the Aalg$^i$ parameter

| Value | Alignment type |
|---|---|
| 0 | MSE alignment |
| 1 | Strictly pyramidal alignment |
| 2 | Pyramidal at level 2 |
| 3 | Pyramidal at level 3 |
| 4 | Pyramidal at level 4 |
| 5–253 | reserved |
| 254 | custom, 16 bit |
| 255 | custom, 8 bit |

Palg, and possibly Salg are repeated as a record for each component.

Talgi:
Table 10 shows methods for choosing tail-information.

TABLE 10

Parent tail-information

| Value | Methods for choosing tail-information: |
|---|---|
| 0 | based on the current importance level and all more important importance levels. |
| 1 | always zero |
| 2 | based on the "current plus pixel depth plus 3" importance level and all more important importance levels. |
| 3–255 | reserved |

Salg$^{ij}$: Alignment value of jth sub-block of the ith component, used only if the value of Aalgi for that component is "custom alignment." This number is 8 bits or 16 bits depending on which custom alignment is chosen, and is repeated for every frequency band in the image, in order, for that component. (For binary style, Salg$^{ij}$ is the alignment value of the ith pyramid level.)

When used, Salgij, Aalg, and Palg are repeated as a record for each component.

res: A filler byte of zeros that is placed at the end, as needed.

The TLM tag describes the length of every tile in the image. Each tile's length is measured from the first byte of the SOT tag to the first byte of the next SOT tag (of the next tile), or to the EOI (End of Image). In other words, this is a list or daisy chain of pointers to the tiles.

The codestream contains either the single TLM tag or a TLT tag for each tile, but not both. When the TLM tag is used in the main header, no TLT tags are used. Conversely, if each tile ends with a TLT tag, the TLM tag is not used. The value of each individual tile length in the TLM header is the same as the value that would be used for the corresponding TLT tag if TLM were not used. The length of the TLM tag depends on the number of tiles in the image. FIG. 26E indicates one embodiment of the tile length, main header syntax.

TLM: Table 11 shows the size and values for the tile length main header parameters.

TABLE 11

Tile length, main header values

| Parameter | Size (bits) | Values |
|---|---|---|
| TLM | 16 | 0xff54 |
| Ltlm | 16 | 6–65534 |
| Ptlmi | 32 | 2–(232–2) |

Ltlm: Length of tag in bytes, not including the marker (the length is even).

Ptlmi: Length, in bytes, between the SOT marker of the ith tile to the next SOT (or EOI) marker. This is repeated for every tile in the image.

The TLT tag describes the length of the current tile, measured from the first byte of the SOT tag to the first byte of the SOT tag of the next tile (or to the EOI). In other words, TLT is a pointer to the next tile. One embodiment of the TLT syntax is shown in FIG. 26F.

Either the TLM or TLT tags are required but not both. When used, this tag is required in all tile headers, and the TLM tag is not used. The values of these tile lengths are the same in both markers.

TLT: Table 12 shows the size and values for the tile length tile header parameters.

TABLE 12

Tile length, tile header values

| Parameter | Size (bits) | Values |
|---|---|---|
| TLT | 16 | 0xff55 |
| Ltlm | 16 | 6 |
| Ptlt | 32 | 2–(232–2) |

Ltlt: Length of tag in bytes, not including the marker (the length is even).

Ptlt: Length, in bytes, between the SOT marker of the tile to the next SOT (or EOI) marker.

The CPT tag points from the first byte of the SOT tag to the first byte of every component in a tile except the first. The component coded data is arranged in non-interleaved fashion in each tile and begins at an 8 bit boundary. The entropy coder is reset at this point.

This tag is used in the tile header of every tile if the image contains more than one component. The size of this variable length tag depends on the number of components in the image. One embodiment of the component pointers syntax is illustrated in FIG. 26G.

CPT: Table 13 shows the size and values for the component pointer parameters.

TABLE 13

Component pointer tag values

| Parameter | Size (bits) | Values |
|---|---|---|
| CPT | 16 | 0xff56 |
| Lcpt | 16 | 6–65534 |
| Pcpti | 32 | 1–(232–1) |

Lcpt: Length of tag in bytes, not including the marker (the length is even).

Pcpti: Number of bytes from the current tile's SOT tag to the start of the next component. The number of Pcpt values is one less than the number of components because the data for the first component begins immediately after the SOS tag. New component data starts on 8 bit boundaries.

Figure 26H:
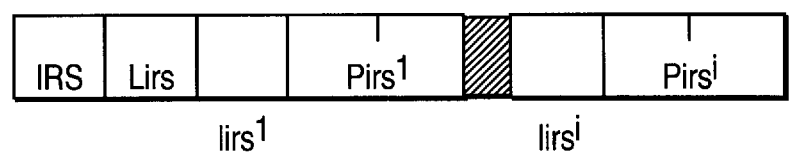
FIGS. 26A–N illustrate one embodiment of tags for the codestream of the present invention.

The IRS tag points from the first byte of the SOT tag of the current tile to the resets in the data. These resets are found on 8 bit boundaries after the end of a completely coded importance level. The component at the point where the reset occurs can be determined by the relationship between CPT tag values and the reset pointer. The length of this tag depends on the number of resets used by the encoder. One embodiment of the importance level resets syntax is shown in FIG. 26H.

IRS: Table 14 shows the size and values for the important level reset parameters.

TABLE 14

Importance level reset values

| Parameter | Size (bits) | Values |
|---|---|---|
| IRS | 16 | 0xff57 |
| Lirs | 16 | 8–65535 |
| Iirsi | 16 | 1–65535 |
| Pirsi | 32 | 1–(232–1) |

Lirs: Length of tag in bytes, not including the marker (the length is even).

Iirs$^i$: Number of the current importance level at the ith reset. This Iirs tag and the corresponding Pirs tag form a type of record repeated for each reset. These records are in order from the highest importance level that has a reset to the lowest importance level that has a reset for the first component, followed by the importance levels from the next component, and so on to the last component.

Pirs$^i$: Number of bytes from the current tile's SOT tag to the ith reset byte. This Pirs tag and the Iirs tag form a type of record repeated for each reset. These records must be in order from the smallest pointer to the largest; that is, they point to each reset byte in its order of occurrence in the codestream. (A smaller number following a larger number would point to a byte appearing physically earlier.)

Certain informational tags are included strictly for informational purposes. They are not necessary for a decoder. However, they might assist a parser.

Figure 26I:
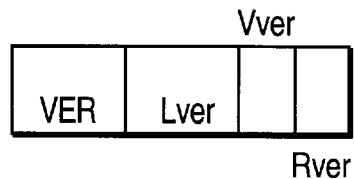

For instance, the VER tag describes the major and minor version numbers. This tag is used in the main header. Although this tag is provided, it does not imply a level of capability required to decode the image. Indeed, the goal is to have every decoder and parser capable of decoding and parsing codestreams of every version in the present invention. One embodiment of the version number syntax of the present invention is shown in FIG. 26I.

VER: Table 15 shows the size and values for the version number parameters.

TABLE 15

Version number values

| Parameter | Size (bits) | Values |
|---|---|---|
| VER | 16 | 0xff60 |
| Lver | 16 | 4 |
| Vver | 8 | 0–255 |
| Rver | 8 | 0–255 |

Lver: Length of tag in bytes, not including the marker (the length is even).
Vver: Major version number.
Rver: Minor version number.

Figure 26J:
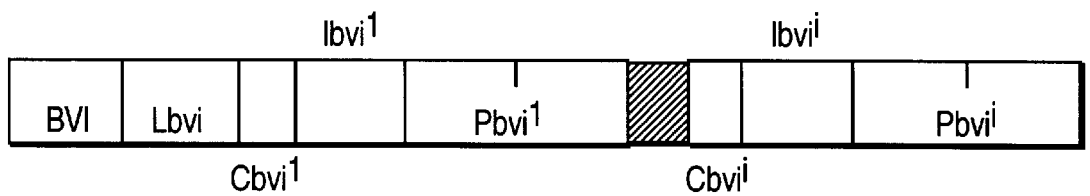

The BVI tag relates the number of bits to importance levels on an image-wide basis. This optional tag is used in the main header. The size of this variable-length tag depends on the number of importance levels enumerated by the encoder. One embodiment of the bits versus importance levels syntax is shown in FIG. 26J.

BVI: Table 16 shows the size and values for the tile length main header parameters.

TABLE 16

Bits versus importance levels values

| Parameter | Size (bits) | Values |
|---|---|---|
| BVI | 16 | 0xff61 |
| Lbvi | 16 | 10–65535 |
| Cbvii | 8 | 1–255 |
| Ibvii | 16 | 0–65535 |
| Pbvii | 32 | 0–(232–1) |
| res | 8 | 0 (if necessary) |

Lbvi: Length of tag in bytes, not including the marker (the length is even).
Cbvi$^i$: This signals which component data is being described. This Cbvi parameter, along with Ibvi and Pbvi, form a record that is repeated for every component and importance level described. The tags must be in order, with all importance-level descriptions in the first component followed by those for the next component and so on.
Ibvi$^i$: The number of the importance level, in the current component, encoded by the number of bytes in Pbvii. This number (or numbers) is selected at encode time to communicate interesting points in the rate-distortion curve. This Ibvi parameter, along with Cbvi and Pbvi, form a record that is repeated for every component and importance level described.
Pbvi$^i$: Number of bytes in the coded file that include the main and tile headers and all data that relate to the number of importance levels in Ibvii. This Pbvi parameter, along with Cbvi and Ibvi, form a record that is repeated for every component and importance level described.
res: A filler byte of zeros that is placed at the end, as needed.

Figure 26K:
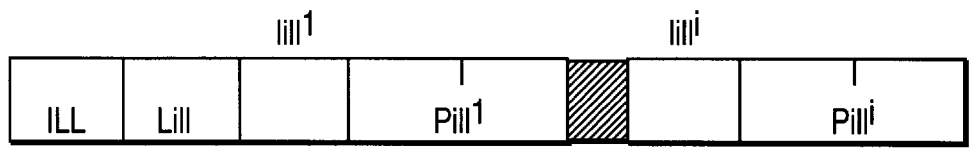

The ILL tag describes pointers into the codestream that correspond to the end of an importance level of coded data. While similar to the IRS tag, the ILL tag points to data where there is no reset and no padding to 8 bit boundaries. This tag allows a parser to locate and truncate tiles at roughly the same distortion on an image-wide basis. It is optional and is used only in the tile header. The length of this tag depends on the number of importance levels enumerated. One embodiment of the importance level locator syntax is shown in FIG. 26K.

ILL: Marker. Table 17 shows the size and values for the importance level locator parameters.

TABLE 17

Importance level locator values

| Parameter | Size (bits) | Values |
|---|---|---|
| ILL | 16 | 0xff62 |
| Lill | 16 | 10–65535 |
| Iilli | 16 | 1–65535 |
| Pilli | 32 | 0–(232–1) |

Lill: Length of tag in bytes, not including the marker (the length is even).
Iill$^i$: Number of importance levels encoded by the number of bytes in Pilli. Each such number is selected at encode time to communicate interesting points in the rate-distortion curve. This Ill number, with the Pill parameter, forms a record that is repeated in order from the highest to the lowest importance level in the earliest component, followed by similar records identifying the highest to the lowest importance level of interest in later components.
Pill$^i$: Points from the first byte of the SOT of the current tile to the byte in the coded data of this tile where the importance level in Iilli is completed. This Pill number, with the Ill parameter, forms a record that is repeated in order from the highest to the lowest importance level in the earliest component, followed by similar records identifying the highest to the lowest importance level of interest in later components.

Figure 26L:
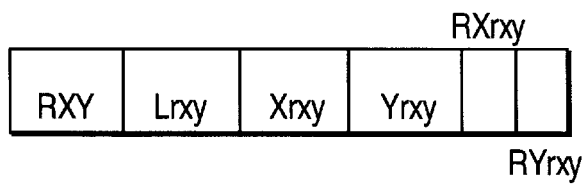

The RXY tag defines the X and Y resolutions of the image reference grid with respect to real dimensions. This tag is used only in the main header. One embodiment of the resolution in pixels per unit syntax is shown in FIG. 26L.

RXY: Table 18 shows the size and values for the parameters specifying resolution in pixels per unit.

TABLE 18

Resolution in pixels per unit values

| Parameter | Size (bits) | Values |
|---|---|---|
| RXY | 16 | 0xff63 |
| Lrxy | 16 | 8 |
| Xrxy | 16 | 1–65535 |
| Yrxy | 16 | 1–65535 |
| RXrxy | 8 | 0–255 |
| RYrxy | 8 | 0–255 |

Lrxy: Length of tag in bytes, not including the marker (the length is even).
Xrxy: Number of reference grid pixels per unit.
Yrxy: Number of reference grid lines per unit.
RXrxy: Unit of X dimension. Thus, the horizontal resolution is Xrxy grid pixels per 10(RXrxy-128) meters.
RYrxy: Unit of Y dimension. Thus, the vertical resolution is Yrxy grid lines per 10(RYrxy-128) meters.

Figure 26M:
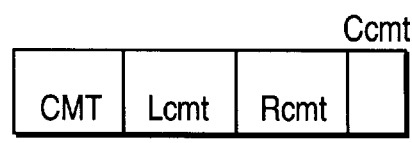

The CMT tag allows unstructured data in the header. It can be used in either the main or tile header. The length of this tag depends on the length of the comment. One embodiment of the comment syntax is shown in FIG. 26M.

CMT: Table 19 shows the size and values for the comment parameters.

TABLE 19

Comment values

| Parameter | Size (bits) | Values |
|---|---|---|
| CMT | 16 | 0xff64 |
| Lcmt | 16 | 6–65535 |
| Rcmt | 16 | use Table 20 |
| Ccmti | 8 | 0–255 |
| res | 8 | 0 (if necessary) |

Lcmt: Length of tag in bytes, not including the marker (the length is even).

Rcmt: Registration value of tag. Table 20 shows the size and values for the registration parameters.

TABLE 20

Registration values for the Rcmt parameter

| Value | Registration value |
|---|---|
| 0 | General use |
| 1–65535 | Reserved for registration |

Ccmti: Byte of unstructured data. Repeated at will.

res: A filler byte of zeros that is placed at the end, if necessary.

Figure 26N:
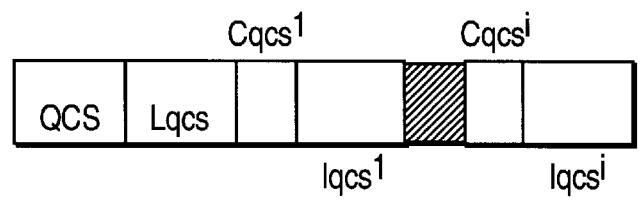

The QCS tag describes where a quantized codestream has been quantized. When quantization is performed by the parser or encoder, this tag can help the decoder determine approximately how far to decode with respect the importance levels. It is optional and is used only in the tile header. One embodiment of the quantized codestream syntax is shown in FIG. 26N.

QCS: Table 21 shows the size and values for the quantized codestream parameters.

TABLE 21

Quantized codestream values

| Parameter | Size (bits) | Values |
|---|---|---|
| QCS | 16 | 0xff65 |
| Lqcs | 16 | 6–65535 |
| Cqcsi | 8 | 1–255 |
| Iqcsi | 16 | 0–65535 |
| res | 8 | 0 (if necessary) |

Lqcs: Length of tag in bytes, not including the marker (the length is even).

Cill$^i$: Number of the current component. This Cill number, with the Iqcs parameter, forms a record that is repeated in order from the highest to the lowest importance level in the earliest component, followed by similar records identifying the highest to the lowest importance level in later components.

Iqcs$^i$: This is the importance level where at least part of the coded data remains. All the remaining data from that point to the next reset have been truncated (quantized).

res: A filler byte of zeros that is placed at the end, as needed.

Lossy Coefficient Reconstruction

Figure 27:
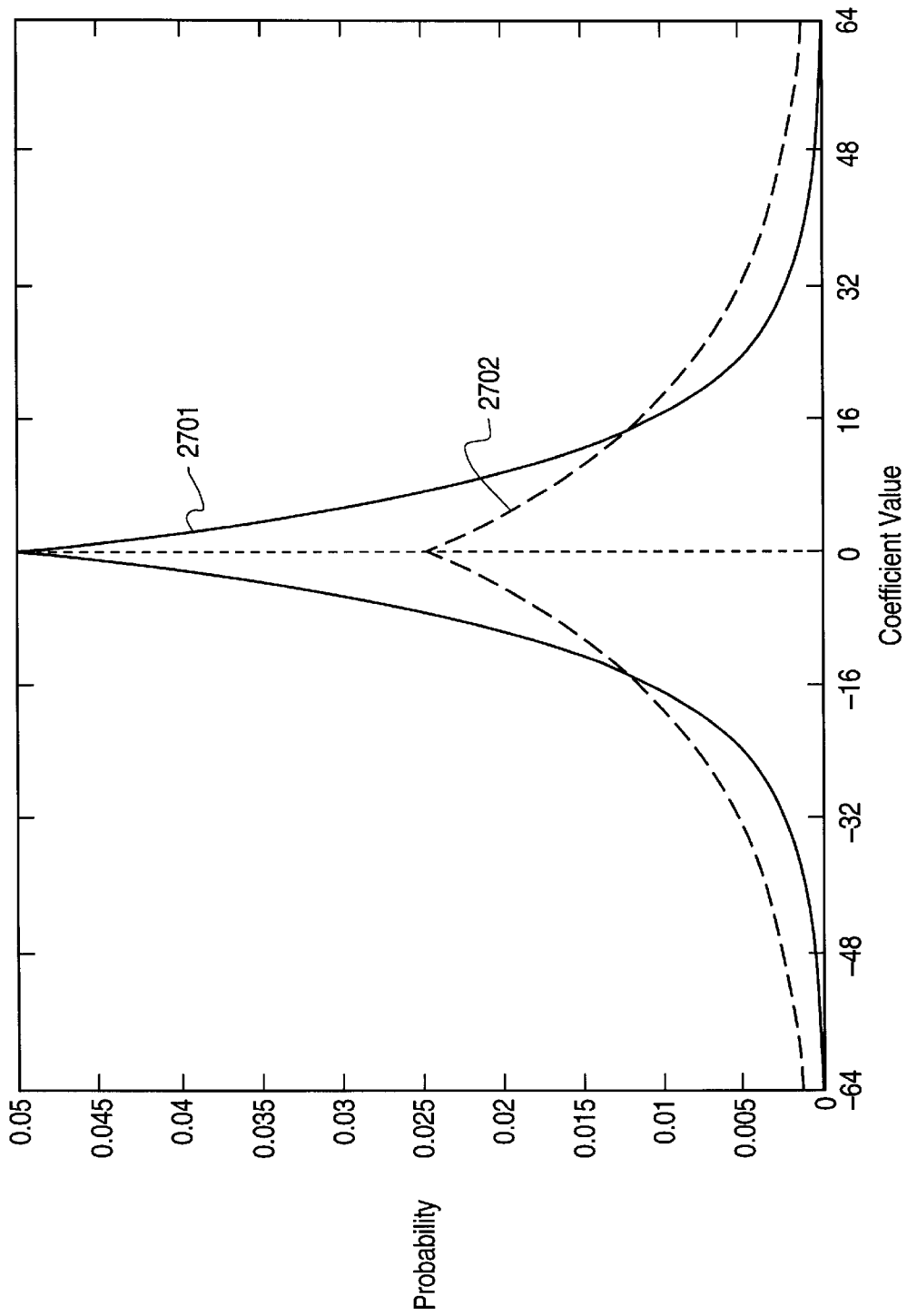
FIG. 27 illustrates a typical distribution for lossy reconstruction.

In one embodiment, the present invention performs lossy reconstruction by truncating values to a predetermined set of integer values. For instance, in one example, all coefficients between 0 and 31 are quantized to 0, all coefficients between 32 and 63 are quantized to 32, and so on. FIG. 27 illustrates a typical distributions of coefficients without quantization. Such quantization may be performed where the bottom bits in each coefficient are not known. In another embodiment, a value in the middle of each region may provide a more accurate value to represent the group of coefficients. For instance, all coefficients between 64 and 127 are quantized to 95. The point to which the values are quantized is referred to as the reconstruction point.

Due to the difference between images, the resulting distributions might have skewed shapes. For instance, compare curves 2701 and 2702 in FIG. 27.

In the present invention, the reconstruction point is selected based on the distribution. In one embodiment, the distribution is estimated and, based on that estimate, a reconstruction point is chosen. The estimate is generated based on the data that is already known. Prior to gathering data, a default reconstruction point may be used. Thus, the present invention provides an adaptive method of performing lossy construction. Further, the present invention is a non-iterated method of improving the coefficient reconstruction. To compensate for the non-uniform usage of the numeric range due to different distributions, the present invention provides for $$s^2 = \text{sample variance}$$

$$Q = \text{Quantization}$$

$$\sigma^2 = \frac{2}{\alpha^2} = \text{True variance}$$

$$\alpha = -\frac{1}{Q} \ln \left[ \frac{Q^2 + 2s^2 - \sqrt{Q^4 + 8Q^2 s^2}}{2(s^2 - Q^2)} \right]$$

where $S^2$ is the sample variance measured by the decoder based on the data available and Q is the quantization which is known to the decoder. Then correct non zero coefficients by moving them away from 0

$$iQ \rightarrow iQ + \left[ \frac{1}{\alpha} - \frac{Q}{e^{\alpha Q} - 1} \right] \quad i > 0$$

$$iQ \rightarrow +iQ - \left[ \frac{1}{\alpha} - \frac{Q}{e^{\alpha Q} - 1} \right] \quad i < 0$$

where i equals any integer.

In one embodiment, after all decoding is completed, every non-zero coefficient is adjusted to a reconstruction level. This requires reading, and perhaps modifying and writing each coefficient.

In another embodiment, as each bitplane of each coefficient is processed, if the coefficient is non-zero, the proper reconstruction value of the coefficient is stored. When decoding stops, all coefficients are set to their proper reconstruction value. This eliminates the need for a separate pass though the memory for setting reconstruction levels.

Color

The present invention may be applied to color images (and data). Multicomponent handling block 111 in FIG. 1 performs processing needed for color data. For instance, in the YUV color space, there are three components, one for Y, one for U and one for V and each component is coded separately.

In one embodiment, the entropy coded data for each component is separated from entropy coded data for other components. In this embodiment, there is no interleaving of components. Separating data by components is useful in conjunction with pyramidal alignment to allow a decoder or parser to easily quantize different components independently.

In another embodiment, entropy coded data for different components is interleaved by frequency band or by importance level. This is useful in conjunction with MSE alignment since single truncation can be used to quantize data for all components. This type of interleaving requires the encoder to provide a relationship between frequency bands or importance levels in different components. Because frequency bands or importance levels may be relatively large amounts of coded data, a parser or decoder may be able to quantize components independently using markers.

In still another embodiment, entropy coded data for different components is interleaved for each pixel or coefficient. This is useful in conjunction with MSE alignment since a single truncation effects all components. With interleaving by pixel, decoders and parsers must use the same relationship between components as defined by the encoder.

The present invention allows the same system to perform subsampling.

In one embodiment, each component is stored separately. Using a decompressor and parser, only selective decomposition levels and components may be obtained from each of the separate component memories when generating a lossy output image. For instance, in a YUV color space, all of the decomposition levels may be obtained for the Y color component while all but the first decomposition level for both the U and V components is obtained. The resulting combination of the image is a 4:1:1 image. It should be noted that other types of images may be obtained by taking different portions of the data stored in memories.

Many types of multi-component data can be handled. In addition to YUV, image data might be RGB (red, green, blue), CMY (cyan, magenta, yellow), CMYK (cyan, magenta, yellow, black) or CCIR 601 YCrCb. Multi-spectral image data (for example, remote sensing data) could also be used. For visual data such as RGB or CMY, a lossless color space transform, such as described in U.S. patent application Ser. No. 08/436,662, entitled Method and Apparatus for Reversible Color Compression, filed May 8, 1995, can be used.

Bit Extraction

The present invention provides for computing the context model and encoding bits in such a way as to enhance bit extraction. Specifically, the context model for the head bits is based on information from neighbors. Often, the context is zero, particularly when doing lossy compression. Due to the near statistics of the head bit context, the present invention provides a mechanism that maintains the contexts for the head bits.

In one embodiment, prior to coding, the memory is cleared. The context remains the same until the parent, one of the neighbors or the present pixel changes. When a change occurs, the context memory is updated for all the contexts affected. If using tail information, only the neighbors and children are updated. The memory is updated once per coefficient when the head is on.

Figure 28A:
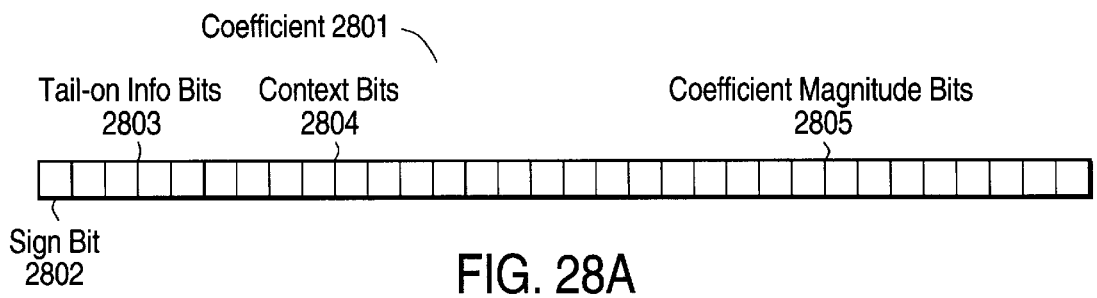
FIGS. 28A and B illustrate an exemplary coefficient and the process for analyzing tail information.

In one embodiment, each coefficient is stored as a 32 bit integer having a sign bit, four tail-on information bits, 8-bits of contexts followed by 19 bits of coefficient. One embodiment of a coefficient is shown in FIG. 28A.

In one embodiment, the four tail-on information bits are used to generate five separate cases.

In the case where the value of the four tail-on information bits is zero, the bit of the current bit plane of the current coefficient's magnitude bit is encoded using the context bits. If the bit is zero, the process ends. If the bit is one, then the sign of the coefficient is encoded. Then, the first tail-on information bit is flipped and the contexts of the north, northeast, west, south, east and the four children are updated. The process ends.

In the case where the value of the four tail-on information bits is one, the bit of the current bit plane of the current coefficient's magnitude bits is encoded using a constant context for that case. The second tail-on information bit is flipped. The context of the east and the children of the current coefficient are updated. The process ends.

In the case where the value of the four tail-on information bits is seven, the bit of the current bit plane of the current coefficient's magnitude bits is encoded using a constant context for that case. The third tail-on information bit is flipped. No contexts need to be updated. The process ends.

In the case where the value of the four tail-on information bits is three, the bit of the current bit plane of the current coefficient's magnitude bits is encoded using a constant context for that case. The fourth tail-on information bit is flipped. The context of the east and the children of the current coefficient are updated. The process ends.

In the case where the value of the four tail-on information bits is fifteen, the bit of the current bit plane of the current coefficient's magnitude bits is encoded using a constant context for that case. No tail-on information bits need to be flipped, and no contexts need to be updated. The process ends.

Figure 28B:
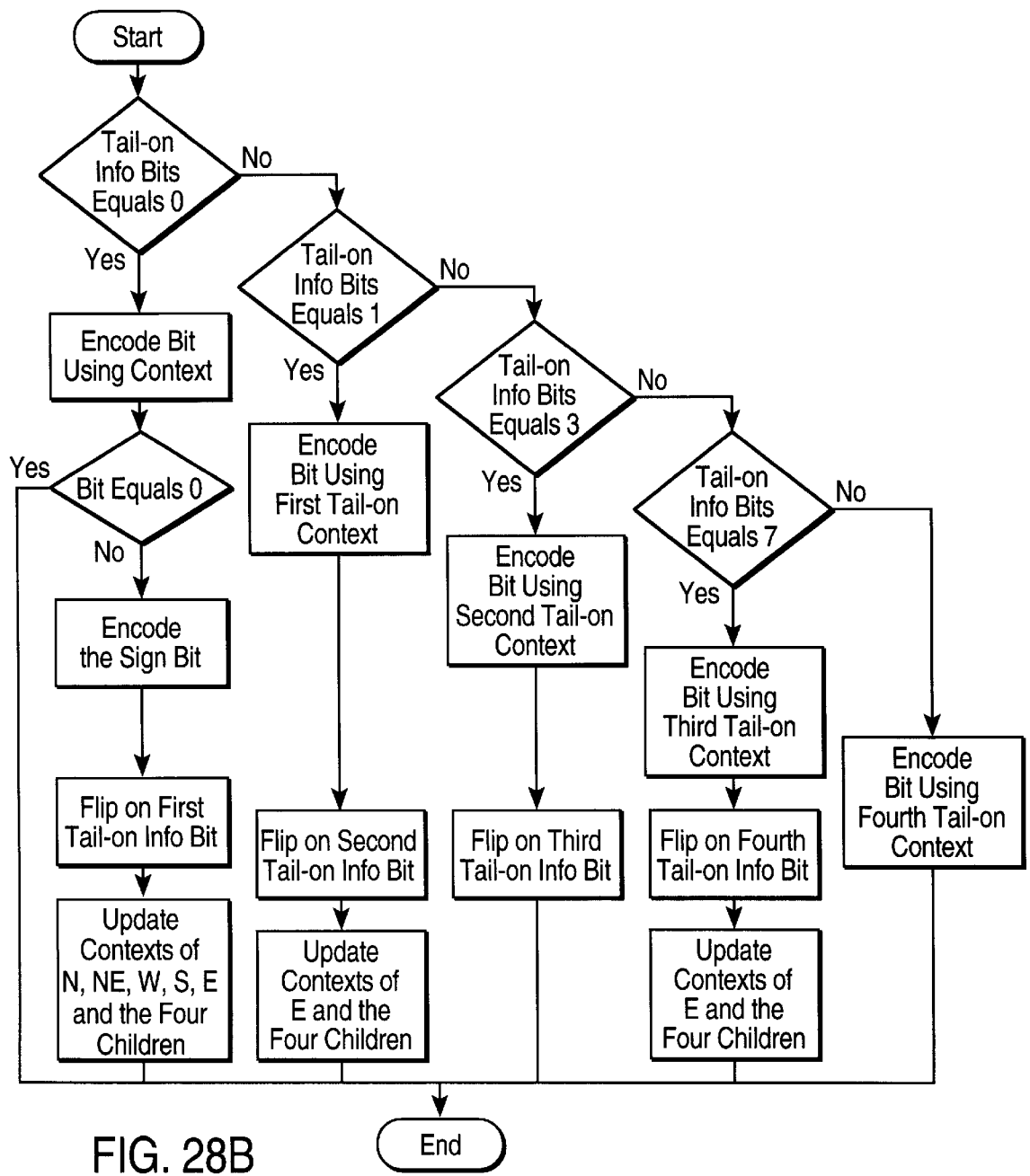

FIG. 28A illustrates an example coefficient of the present invention. Referring to FIG. 28A, coefficient 2801, comprises a sign bit 2802, followed by tail-on information bits 2803, followed by context bits 2804 and coefficient magnitude bits 2805. The process described above is illustrated in the flow chart in FIG. 28B.

By using this technique of updating all contexts when a change occurs, the contexts modeling operates faster, particularly for lossy coding, as long as the head bits remain predominately zero.

Huffman Coding of the Reversible Wavelet Coefficients

Figure 30:
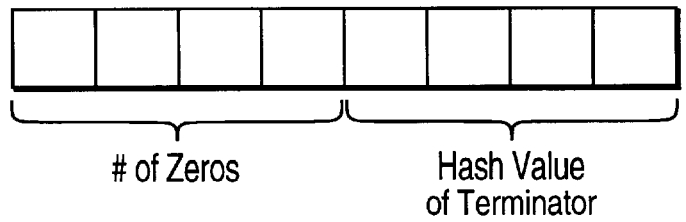
FIG. 30 illustrates one embodiment of a codeword.

In one embodiment, the present invention encodes wavelet coefficients using Huffman coding. The alphabet for a Huffman coding consists of two parts. The first part equals the length of runs of zero coefficients, while the second part is a hashed value of the non-zero terminator coefficient. One alphabet format is shown in FIG. 30 having four bits indicating the number of zero coefficients, or in other words, the length of the run, followed by four bits representing the hashed value from one to fifteen.

The hashed value is the value N where N is the integer part of logarithm to the base 2 of the absolute value of the non-zero terminator coefficient. In one embodiment, this hashed value is the number of bits needed to represent the value N. For example, for N equals −1, 1, the hashed value is one. On the other hand, for N equals −3, −2, 2, 3, the number of bits needed to represent the value N is 2. Similar correspondence is used in JPEG.

In such a situation, the maximum length of a run of zero coefficients allowed is 15. If a run is longer than 15, a special token may be used to indicate a run of 16 zeros followed by a new run. One such exception token has all zeros in both the first 4 and the last 4 bits. In one embodiment, all 16 tokens with the second 4 bits equal to zero are used for exception cases. Therefore, there are 256, 8-bit Huffman tokens.

In one embodiment, a table is created with Huffman tokens. In one embodiment, the table is used for all images. In an alternate embodiment, a number of tables are created and depending on quantization, a specific table is selected. Each table is selected based on the number of bits which are to be quantized. That is, each selection of tables is based on quantizing only 1 bit, 2 bits, 3 bits, etc. In an alternative embodiment, Huffman codes are image specific and are stored/transmitted with the image.

In order to use the table, a Huffman token is created. The token is then sent to the table where it is encoded.

Although the Huffman token identifies the length of run of 0 and the hashed value of the non-zero terminator symbol, in order to identify the terminator symbol unambiguously, extra bits are needed. In one embodiment, the present invention provides these extra bits. After a Huffman token is replaced by a Huffman codeword (e.g., from a table, etc.), extra bits are written which are equal to the hash value of the terminator symbols. For example, one extra bit is written in the case of −1, 1, while two extra bits are written in the case of −3, −2, 2, 3. Thus, the present invention creates a variable sized Huffman coding which is variable due to the extra bits which unambiguously identify the terminator symbols.

Note that other m-ary coders may be used. For instance, one alphabet and one m-ary code may be used for zero coefficients, while another alphabet and m-ary code may be used for hashed values.

In one embodiment, a set of Huffman tables for each quantization levels are precomputed and used for most images. In order to choose between the different tables, compression can be monitored when using one table. Based on the results using the table, a switch to a more skewed or less skewed table may be made.

All the coefficients of the present invention are located in a buffer. For each buffer, a decision can be made as to what table to use. Three bits and a header may be used to indicate which of eight Huffman tables are to be used. Thus, by signaling the header, table selection may be made.

The order to which the coefficients are coded is important. Note that in the prior art coefficient coding, such as JPEG, the coefficients are compressed in zig-zag order. In the present invention, because all of the coefficients are in a buffer, there is no zig-zag order. If zig-zag is interpreted as from low frequency to high frequency, then it can be extended to compression by embedded wavelets (tree ordering).

Figure 31A:
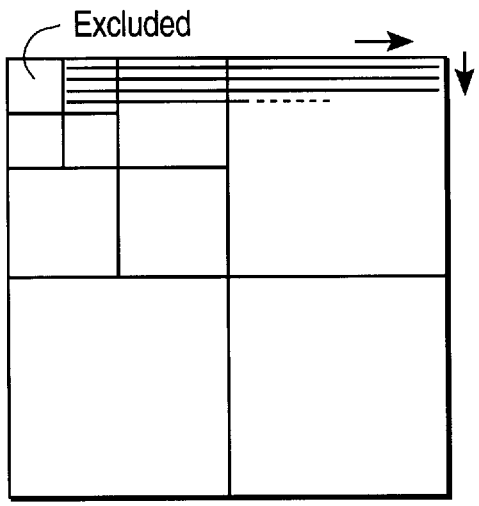
FIGS. 31A–C illustrate scheme to parse coefficients using Huffman coding.
Figure 31B:
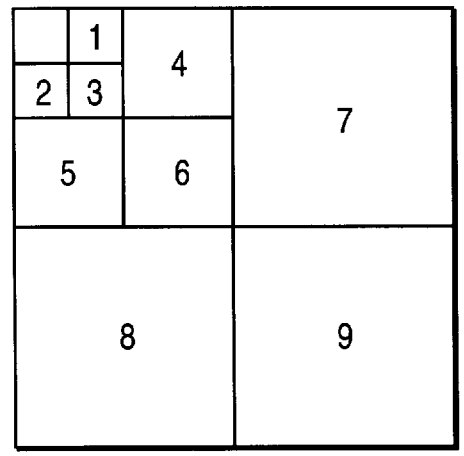
Figure 31C:
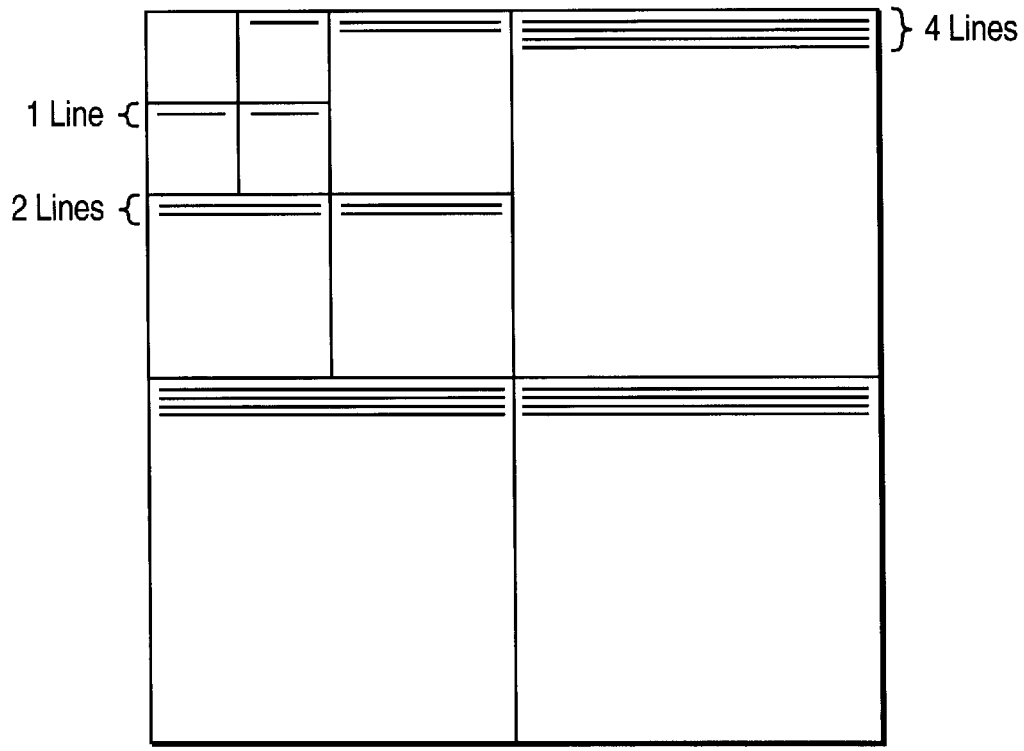

In one embodiment, coefficients are coded in a straight order through the buffer. Such an example is shown in FIG. 31. If should be noted that in this embodiment, the first block of smooth coefficients is excluded.

In another embodiment, every frequency block is coded in raster-scan order with the order of the blocks from low to high frequency. Such an example is shown in FIG. 31B. Due to memory restrictions, an entire frequency path may not be completed before another one is started. If memory is a limitation, another method is to code one tree at a time.

Every tree is coded breadth first starting from the root. Note that the root which is a smooth coefficient is not included. This is shown in FIG. 31 where an initial tree is shown with one line taken from the first set of sub-blocks, two lines from the next set of sub-blocks and four lines from the following set of sub-blocks. Such an embodiment is possible because these lines are available prior to others being available.

An exceptional token may also be saved to indicate that the rest of the tree consists of zero coefficients. This avoids having used one token indicating that the 16 zeros over and over again.

In one embodiment, all importance levels are coded with Huffman coding. In another embodiment, one or more groups of multiple importance levels are coded with Huffman coding. All importance levels may be coded in separate groups with Huffman coding or some may be Huffman coded and the remaining importance levels may be coded with the Horizon context model and a binary entropy coder.

Coding a group of importance levels with Huffman coding is performed as follows. If the coefficient's bits in the importance levels in the group are all head bits, then the coefficient is Huffman coded as a zero coefficient (perhaps as part of a run count). If the coefficient's bits are all tail bits, then these tail bits are coded as extra bits (perhaps terminating a run). No Huffman codeword is used. If the coefficient's bits include a sign bit (in addition to head or tail bits), then both a Huffman codeword (perhapd terminating a run) and extra bit(s) are coded.

Huffman coding multiple importance levels reduces the cost of implementation. However, truncating in the middle of Huffman coded data results in poor rate-distortion. Huffman coding groups of importance levels allows truncation at the beginning/end of a group for good rate distortion. In some applications, a limited number of desired quantization points is known at encode time. Importance levels with no quantization points can be grouped with the following level(s) for Huffman coding.

Applications

The present invention may be used for a number of applications, some of which are mentioned as examples below. Specifically, high-end applications with high-resolution and deep pixels and applications that are artifact intolerant can use the present invention. The present invention enables high-end applications maintain the highest quality in high-quality environments while applications with more limited bandwidth, data storage, or display capabilities can also use the same compressed data. This is precisely the device-independent representation that is commonly being required of modern imaging applications such as web browsers.

The superior lossless compression performance of the present invention on deep pixel images (10 bits to 16 bits per pixel) is ideal for medical imagery. In addition to the lossless compression, the present invention is a true lossy compressor without many of the artifacts known to block-based compressors. Lossy artifacts derived by using the present invention tend to be along sharp edges where they are often hidden by the visual masking phenomena of the Human Visual System.

The present invention may be used in applications involving the pre-press industry in which the images tend to be very high resolution and have high pixel depth. With the pyramidal decomposition of the present invention, it is easy for the pre-press operator to perform image processing operations on a lower resolution lossy version of the image (on a monitor). When satisfied, the same operations can be performed on the lossless version.

The present invention is also applicable for use in facsimile document applications where the time of transmission required without compression is often too long. The present invention allows very high image output from fax machines with different spatial and pixel resolutions.

The present invention may be used in image archival systems that require compression, particularly for increasing storage capacity. The device independent output of the present invention is useful because the system can be accessed by systems with different resources in bandwidth, storage, and display. Also, progressive transmission capabilities of the present invention are useful for browsing. Lastly, the lossless compression is desirable for output devices in image archiving systems may be provided by the present invention.

The hierarchical progressive nature in the lossless or high quality lossy data stream of the present invention make it ideal for use in the World Wide Web, particularly where device independence, progressive transmission, and high quality are imperative.

The present invention is applicable to satellite images, particularly those that tend to be deep pixel and high resolution. Furthermore, satellite imagery applications have limited bandwidth channel. The present invention allows flexibility and with its progressive transmission qualities, it may be used to allow humans to browse or preview images.

"Fixed-rate", limited-bandwidth applications such as ATM networks need ways of reducing data if it overflows the available bandwidth. However, there should be no quality penalty if there is enough bandwidth (or the data is highly compressable). Likewise, "fixed-size" applications like limited-memory frame stores in computers and other imaging devices need a way to reduce data if the memory fills. Once again, there should be no penalty for an image that can be compressed losslessly into the right amount of memory.

The embedded codestream of the present invention serves both of these applications. The embedding is implicit to allow the codestream to be trimmed or truncated for transmission or storage of a lossy image. If no trimming or truncation is required, the image arrives losslessly.

In sum, the present invention provides a single continuous-tone image compression system. The system of the present invention is lossless and lossy with the same codestream and uses quantization that is embedded (implied by the codestream). The system is also pyramidal, progressive, provides a means for interpolation, and is simple to implement. Therefore, the present invention provides a flexible "device-independent" compression system.

The unified lossy and lossless compression system is very useful. Not only is the same system capable of state-of-the-art lossy and lossless compression performance, the same codestream is as well. The application can decide to retain the lossless code of an image or truncate it to a lossy version while encoding, during storage or transmission of the codestream, or while decoding.

Lossy compression provided by the present invention is achieved by embedded quantization. That is, the codestream includes the quantization. The actual quantization (or visual importance) levels can be a function of the decoder or the transmission channel, not necessarily the encoder. If the bandwidth, storage, and display resources allowed it, the image is recovered losslessly. Otherwise, the image is quantized only as much as required by the most limited resource.

The wavelet used in the present invention is pyramidal, wherein a decomposition by a factor of two of the image without difference images is performed. This is more specific than hierarchical decomposition. For applications that need thumbnails for browsing or to display images on low resolution devices, the pyramidal nature of the present invention is ideal.

The embedding use in the present invention is progressive, specifically by bitplane, i.e., MSB followed by lessor bits. Both the spatial and wavelet domains can be decomposed progressively, although the present invention is progressive in the wavelet domain specifically. For applications that have spatial resolution but lower pixel resolution, such as printers, the progressive ordering of the bits in the present invention is ideal. These features are available with the same codestream.

The present invention is relatively simple to implement in both software and hardware. The wavelet transform can be calculated with just a small number of add/subtract operations and a few shifts for each high-pass, low-pass coefficient pair. The embedding and encoding is performed with a simple "context model" and a binary or m-ary "entropy coder". The entropy coder can be performed with a finite state machine, parallel coders or a Huffman coder.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

We claim:

1. A system comprising:

a wavelet style coder to compress image data using reversible embedded wavelets;

a binary style coder to compress image data using a binary coding scheme, wherein the wavelet style coder and the binary style coder share a binary entropy coder; and selection control coupled to select the wavelet style or the binary style based on whether portions of the image data have characteristics of continuous-tone image data or of binary image data, respectively.

2. The system defined in claim 1 wherein the wavelet style coder comprises a reversible wavelet transform;

an embedded order quantizer coupled to the embedded quantizer; and a context model coupled to the embedded quantizer.

3. The system defined in claim 1 wherein the binary style performs Gray coding.

4. The system defined in claim 1 wherein the entropy coder comprises a finite state machine coder.

5. The system defined in claim 4 wherein the finite state machine coder comprises a look-up table.

6. The system defined in claim 1 wherein the entropy coder comprises a Q-coder.

7. The system defined in claim 1 wherein the entropy coder comprises a QM-coder.

8. The system defined in claim 1 wherein the entropy coder comprises a parallel coder.

9. A system comprising:

a reversible wavelet transform;

an embedded order quantizer coupled to the reversible wavelet transform;

a context model coupled to the embedded order quantizer;

an embedded binary style coding mechanism; and a binary entropy coder coupled to the context model and the embedded binary style coding mechanism, wherein the reversible wavelet transform, the embedded order quantizer, and the context model are operable to compress image data using reversible embedded wavelets and the binary style coding mechanism is operable to compress image data using a binary coding scheme; and selection control coupled to select the wavelet style or the binary style based on whether portions of the image data have characteristics of continuous-tone image data or of binary image data, respectively.

10. The system defined in claim 9 wherein the binary style performs Gray coding.

11. The system defined in claim 9 wherein the entropy coder comprises a finite state machine coder.

12. The system defined in claim 11 wherein the finite state machine coder comprises a look-up table.

13. The system defined in claim 9 wherein the entropy coder comprises a Q-coder.

14. The system defined in claim 9 wherein the entropy coder comprises a QM-coder.

15. The encoder defined in claim 14 wherein the forward transform comprises a reversible wavelet.

16. The system defined in claim 9 wherein the entropy coder comprises a parallel coder.

* * * * *